(12) United States Patent
Ishida et al.

(10) Patent No.: US 7,225,378 B2
(45) Date of Patent: May 29, 2007

(54) GENERATING TEST PATTERNS USED IN TESTING SEMICONDUCTOR INTEGRATED CIRCUIT

(75) Inventors: Masahiro Ishida, Tokyo (JP); Takahiro Yamaguchi, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/238,822

(22) Filed: Sep. 28, 2005

(65) Prior Publication Data

US 2006/0031732 A1 Feb. 9, 2006

Related U.S. Application Data

(62) Division of application No. 09/876,389, filed on Jun. 6, 2001.

(30) Foreign Application Priority Data

Jun. 8, 2000 (JP) ............... 2000-171765

(51) Int. Cl.
*G06F 11/00* (2006.01)
*G06F 17/50* (2006.01)
(52) U.S. Cl. ............... 714/741; 716/4; 703/14
(58) Field of Classification Search ......... 714/25, 714/728, 738, 741, 742; 324/765, 158.1; 438/17–19; 716/4
See application file for complete search history.

(56) References Cited

U.S. PATENT DOCUMENTS

| 3,961,250 | A |   | 6/1976 | Snethen |
| 5,321,354 | A | * | 6/1994 | Ooshima et al. ............ 324/765 |
| 5,802,075 | A | * | 9/1998 | Carpenter et al. .......... 714/738 |
| 5,913,022 | A |   | 6/1999 | Tinaztepe et al. |

FOREIGN PATENT DOCUMENTS

| DE | 100 53 758 | 8/2001 |
| JP | 59-065441 | 4/1984 |
| JP | 02-087397 | 3/1990 |
| JP | 05-182492 | 7/1993 |
| JP | 11-352200 | 12/1999 |
| WO | WO 98/55880 | 12/1998 |

OTHER PUBLICATIONS

Park, E. S.; Mercer, M. R., "An Efficient Delay Test Generation System for Combinational Logic Circuits," IEEE, Transactions on Computer-Aided Design, vol. II, No. 7, Jul. 1992.
Mahlstedt, U., "DELTEST: Deterministic Test Generation for Gate Delay Faults," Proceedings of International Test Conference, IEEE, 1993, Paper 43.3, p. 972.
Cheng, K. T.; et al. "Generation of High Quality Tests for Robustly Untestable Path Delay Faults," IEEE Transactions on Computers, vol. 45, No. 12, Dec. 1996.
Henderson, C. L.; et al., "The Behavior and Testing Implications of CMOS IC Logic Gate Open Circuits," Proceedings of International Test Conference. IEEE, 1991, Paper 11.2, p. 302.

* cited by examiner

*Primary Examiner*—Cynthia Britt
(74) *Attorney, Agent, or Firm*—David N. Lathrop, Esq.; Gallagher & Lathrop

(57) ABSTRACT

A test pattern sequence to test a delay fault or an open fault which accompanies a delay occurring in an IC is easily and rapidly generated. A list of locations such as logic gates and signal lines within the circuit where a fault is likely to occur is prepared. One of the faults is selected and an initialization test pattern v1 which establishes an initial value for activating the fault at the location of a fault is determined by an implication operation. A propagation test pattern v2 which causes a stuck-at fault to be propagated to a following gate is determined by another implication operation. A sequence formed by v1 and v2 is registered with a test pattern list and the described operations are repeated until there remains no unprocessed fault in the fault list.

7 Claims, 52 Drawing Sheets v1= "xx0xx"

v2= "0x111"

FIG.2 PRIOR ART
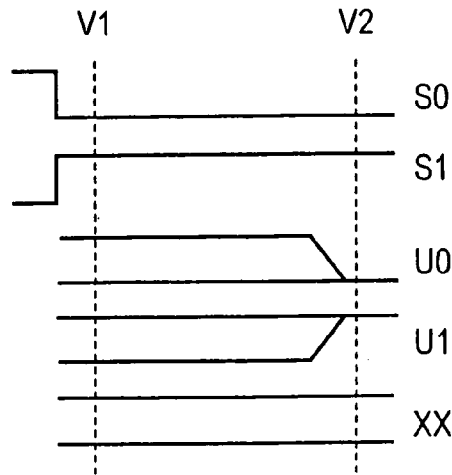
FIG.3a1 PRIOR ART
FIG.3b1 PRIOR ART
FIG.3c1 PRIOR ART
FIG.3a2 PRIOR ART
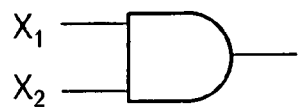
FIG.b2 PRIOR ART
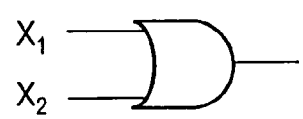
FIG.3c2 PRIOR ART

FIG. 4a
PRIOR ART
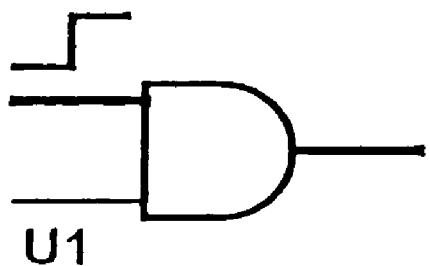
U1
FIG. 4b
PRIOR ART
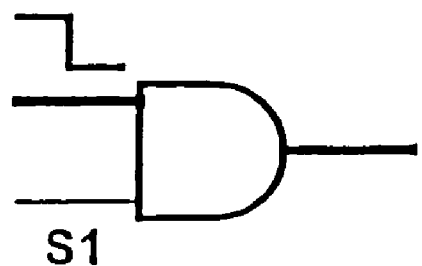
S1
FIG. 4c
PRIOR ART
| INPUT | gate type | |
| --- | --- | --- |
| | AND or NAND | OR or NOR |
| ⌐_ | U1 | S0 |
| ¯⌐ | S1 | U0 | v1= "0x00x"
v2= "0x100"

FIG.10a  OPEN FAULT CAUSING LOGIC FAULT
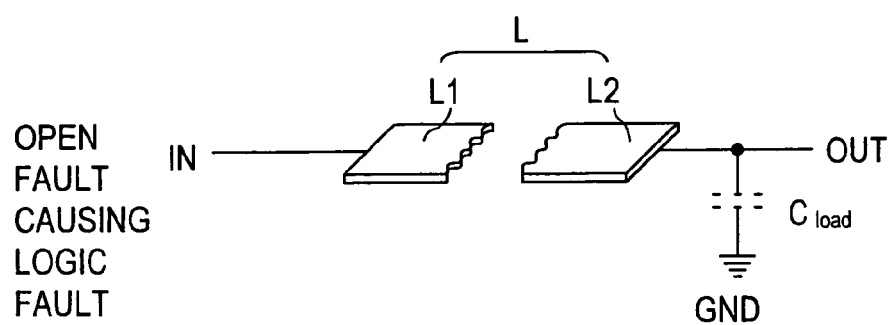
FIG.10b
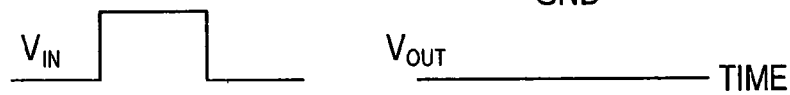
FIG.10c  OPEN FAULT CAUSING DELAY FAULT
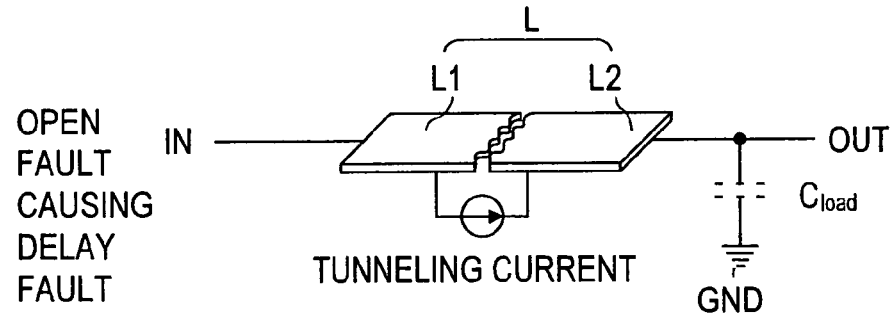
FIG.10d
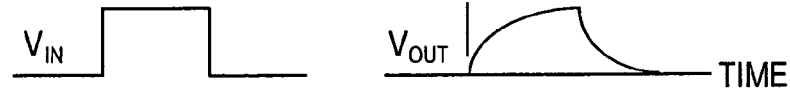

NO FAULT: $i_{DDT}(T' + \tau_0) \leq I'$
FAULT PRESENT: $i_{DDT}(T' + \tau_0) > I'$

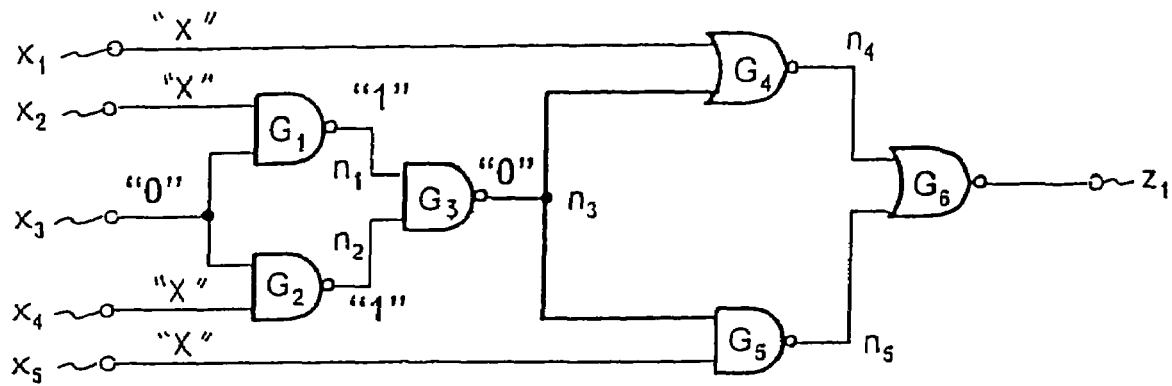
v1 = "x x 0 x x"   FIG. 20a
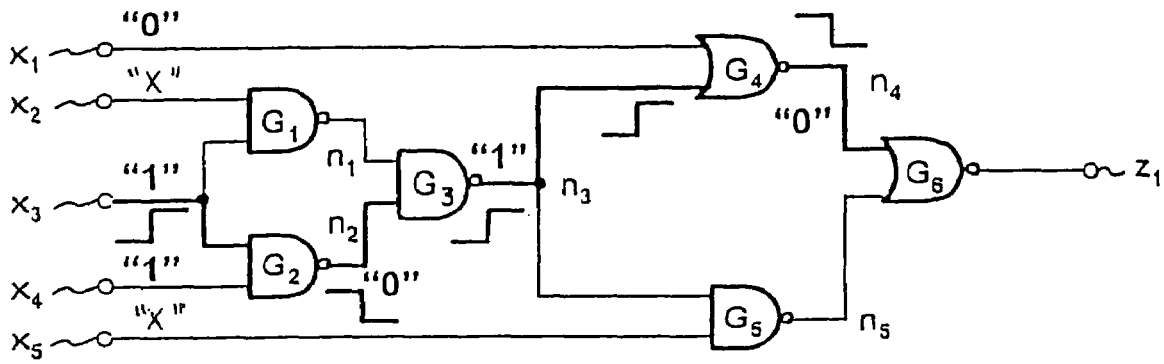
v2 = "0 x 1 1 x"   FIG. 20b
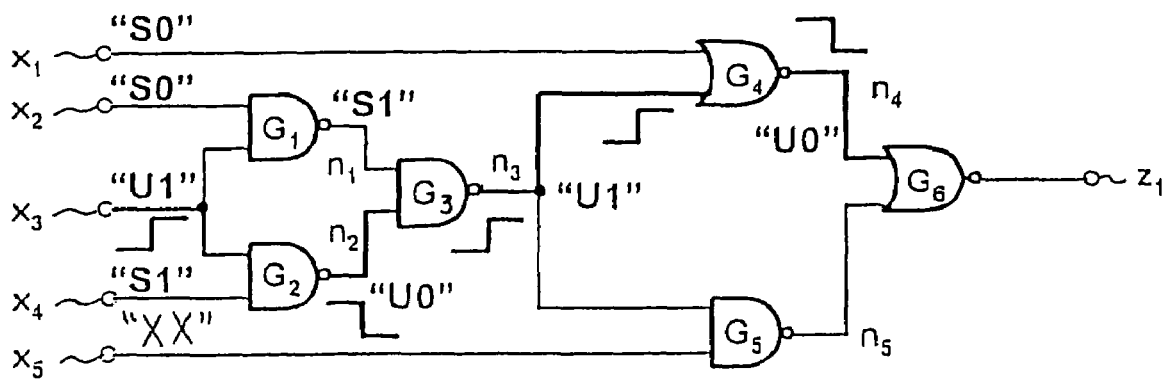
T' = "S0 S0 U1 S1 XX" = < "0 0 0 1 x", "0 0 1 1 x" >
FIG. 20c

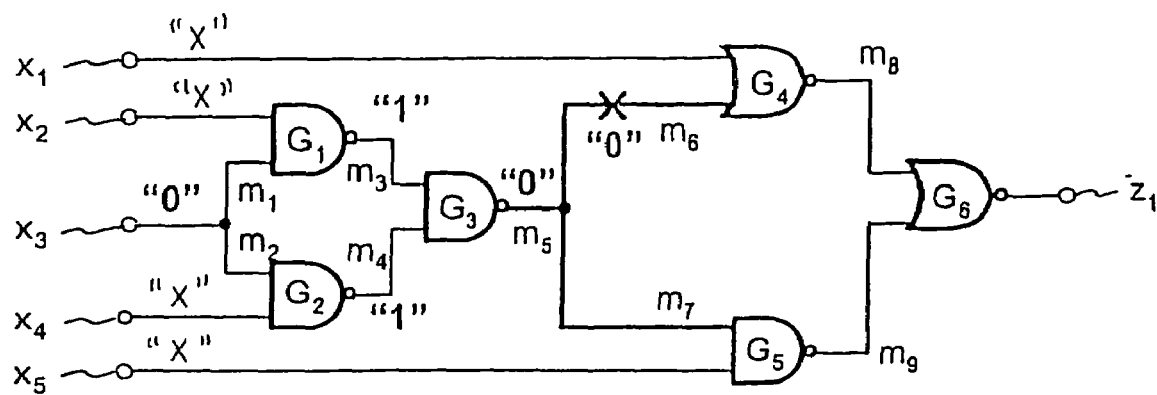
v1 = "x x 0 x x"   FIG. 21a
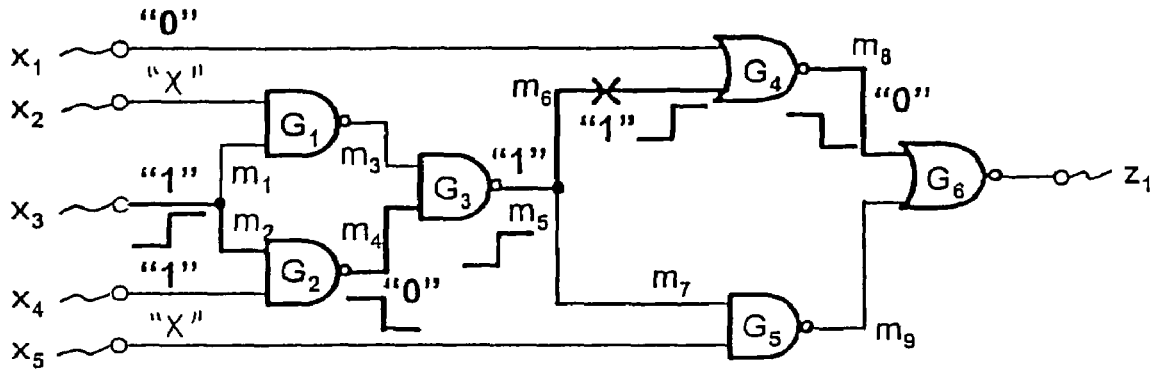
v2 = "0 x 1 1 x"   FIG. 21b
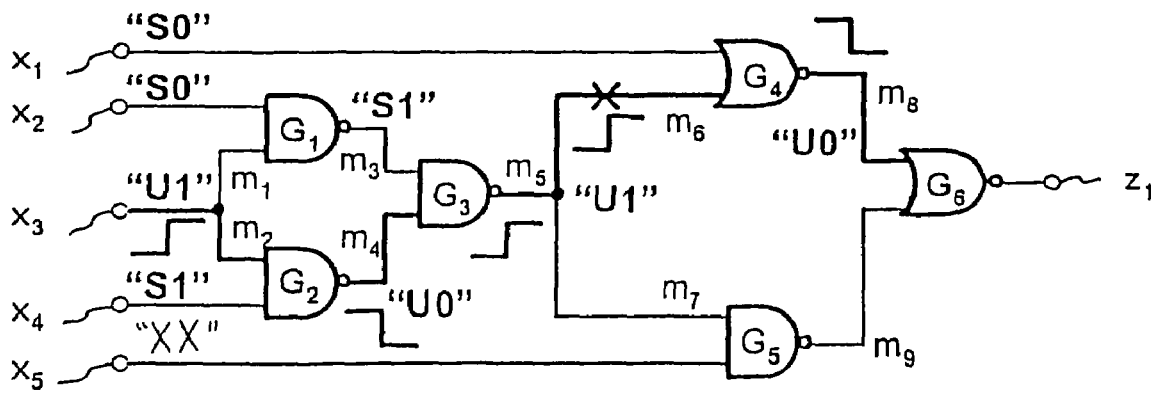
T' = "S0 S0 U1 S1 XX" = < "0 0 0 1 x", "0 0 1 1 x" >
FIG. 21c

FIG.23

| TEST PATTERN SEQUENCE IDENTIFIER | INPUT TERMINALS | | | SIGNALS ON INTERNAL SIGNAL NODES | | | | | OUTPUT TERMINALS | | DETECTABLE DELAY FAULT GATES |
|---|---|---|---|---|---|---|---|---|---|---|---|
| | $x_1$ | $x_2$ | $x_3$ | $n_1$ | $n_2$ | $n_3$ | $n_4$ | $n_5$ | $z_1$ | $z_2$ | |
| T1 | L | L | R | H | H | L | H | F | H | F | $G_5F$ |
| T2 | L | H | R | H | F | R | F | F | F | F | $G_2F, G_3R, G_4F, G_5F$ |
| T3 | H | L | R | L | H | H | L | L | L | L | – |
| T4 | H | H | R | L | F | H | L | L | L | L | – |
| T5 | L | R | L | H | H | L | H | H | H | H | – |
| T6 | L | R | H | H | F | R | F | L | F | L | $G_2F, G_3R, G_4R$ |
| T7 | H | R | L | L | H | H | L | L | L | L | – |
| T8 | H | R | H | L | F | H | L | L | L | L | – |
| T9 | R | L | L | F | H | R | F | F | F | F | $G_1F, G_3R, G_4F, G_5F$ |
| T10 | R | L | H | F | H | R | F | L | F | L | $G_1F, G_3R, G_4F$ |
| T11 | R | H | L | F | H | R | F | F | F | F | $G_1F, G_3R, G_4F, G_5F$ |
| T12 | R | H | H | F | L | H | L | L | L | L | – |
| .. | .. | .. | .. | .. | .. | .. | .. | .. | .. | .. | .. |

FIG.25

| TEST PATTERN SEQUENCE IDENTIFIER | INPUT TERMINALS | | | INTERNAL SIGNAL LINES ( m ) | | | | | | | | | | | | OUTPUT TERMINALS | | DETECTABLE OPEN FAULTS |
|---|---|---|---|---|---|---|---|---|---|---|---|---|---|---|---|---|---|---|
| | $x_1$ | $x_2$ | $x_3$ | 1 | 2 | 3 | 4 | 5 | 6 | 7 | 8 | 9 | 10 | 11 | 12 | 1 | 2 | |
| T1 | L | L | R | L | L | L | R | R | R | H | H | H | H | H | F | H | F | $m_3, m_5, m_{12}$ |
| T2 | L | H | R | L | H | R | R | R | H | F | F | F | F | F | F | F | F | $m_3, m_4, m_5, m_7, m_8, m_9, m_{10}, m_{11}, m_{12}$ |
| T3 | H | L | R | H | L | L | L | R | R | L | L | L | L | L | L | L | L | — |
| T4 | H | H | R | H | H | H | H | R | R | F | L | L | L | L | L | L | L | $m_3, m_4$ |
| T5 | L | R | L | L | R | L | L | L | L | H | H | H | H | H | H | H | H | — |
| T6 | L | R | H | L | R | H | H | H | H | F | H | H | H | F | H | F | L | $m_2, m_7, m_8, m_9, m_{11}$ |
| T7 | H | R | L | H | L | R | L | L | L | H | L | L | L | L | L | L | L | — |
| T8 | H | R | H | H | R | H | H | H | L | F | H | H | H | L | L | L | L | $m_2$ |
| T9 | R | L | L | R | L | L | L | L | L | L | F | L | L | F | L | F | F | $m_1, m_6, m_8, m_9, m_{10}, m_{11}, m_{12}$ |
| T10 | R | L | H | R | L | H | H | H | H | H | F | H | F | F | F | F | L | $m_1, m_6, m_8, m_9, m_{11}$ |
| T11 | R | H | L | R | H | L | L | L | L | H | F | F | L | F | F | F | F | $m_1, m_6, m_8, m_9, m_{10}, m_{11}, m_{12}$ |
| T12 | R | H | H | R | H | H | H | H | H | F | L | L | L | L | L | L | L | $m_1$ |
| … | … | … | … | … | … | … | … | … | … | … | … | … | … | … | … | … | … | … |

FIG. 27

| TEST PATTERN SEQUENCE IDENTIFIER | INPUT TERMINALS | | | | INTERNAL SIGNALS | | | | | OUTPUT TERMINALS | | DETECTABLE DELAY FAULT PATH |
|---|---|---|---|---|---|---|---|---|---|---|---|---|
| | $x_1$ | $x_2$ | $x_3$ | $x_4$ | $n_1$ | $n_2$ | $n_3$ | $n_4$ | $n_5$ | $z_1$ | $z_2$ | |
| T1 | F | H | H | L | F(1) | R(2) | H | R(4) | L | R(5) | L | $\{x_1, n_1, n_2, n_4, z_1\}$ |
| T2 | F | H | L | L | F(1) | R(2) | F(4) | R(4) | L | R(5) | L | $\{x_1, n_1, n_3, n_4, z_1\}$ |
| T3 | F | H | L | H | F(1) | R(2) | F(4) | F(6) | F(5) | F(7) | F(6) | $\{x_1, n_1, n_3, n_4, z_1\}$ $\{x_1, n_1, n_3, n_5, z_2\}$ |
| T4 | R | H | L | L | R(1) | F(2) | R(4) | L | L | L | L | |
| T5 | R | H | L | H | R(1) | F(2) | R(4) | L | R(5) | L | R(6) | $\{x_1, n_1, n_3, n_5, z_2\}$ |
| .... | .... | .... | .... | .... | .... | .... | .... | .... | .... | .... | .... | .... |

GENERATING TEST PATTERNS USED IN TESTING SEMICONDUCTOR INTEGRATED CIRCUIT

BACKGROUND OF THE INVENTION

The invention relates a method and an apparatus for generating test patterns used in testing a semiconductor integrated circuit, and in particular, to a method and an apparatus for generating test patterns which are used to detect a gate delay fault, an open fault which gives rise to a gate delay fault, and a path delay fault with the aid of a transient power supply current signal.

Test patterns for testing an abnormal delay time of a logic gate in a semiconductor integrated circuit under test (hereafter referred to as "gate delay fault") are provided in the prior art by preparing a test pattern which initializes an output from a logic gate under test of the circuit to a signal value (initial logic value) and another test pattern which tests the logic gate under test for a stuck-at fault, or a fault that the output from the logic gate under test is fixed to the initial logic value. FIG. 1$a$ shows an example of the semiconductor circuit under test. The circuit includes input terminals $x_2$ and $x_3$ connected to inputs of NAND gate $G_1$. Input terminals $x_3$ and $x_4$ are connected to inputs of NAND gate $G_2$. Outputs from NAND gates $G_1$ and $G_2$ feed NOR gate $G_3$, the output of which feeds NOR gate $G_4$ together with an input applied to an input terminal $x_1$. Output from NAND gate $G_3$ also feeds NAND gate $G_5$ together with an input applied to an input terminal $x_5$. Outputs from NOR gate $G_4$ and NAND gate $G_5$ feed NOR gate $G_6$, the output of which is connected to an output terminal $z_1$.

For the illustrated semiconductor circuit under test, a test pattern which examines a "slow-to-rise" gate delay fault of the logic gate $G_3$ is generated in a manner as described below. First of all, a test pattern $x_1=x$, $x_2=x$, $x_3=0$, $x_4=x$ and $x_5=x$ which produces an initial value of "0" at the output of the faulty gate $G_3$ is determined as shown in FIG. 1$a$. Here, "x" indicates a "don't care" value or either "1" or "0". This test pattern is denoted hereafter as v1=(xx0xx). Assuming a stuck-at fault at the faulty gate $G_3$ such that its output is fixed to the initial value of "0", a test pattern v2=(0x111) is then determined which allows the stuck-at fault to be detected at the output signal line of the semiconductor circuit (see FIG. 1($b$)). As a consequence, a test pattern sequence which detects a slow-to-rise fault at gate $G_3$ is defined as T=<v1, v2>=<"xx0xx", "0x111">. A technique for generating test patterns for the gate delay fault is disclosed, for example, in E. S. Park and M. R. Mercer, "An Efficient Delay Test Generation System for Combinatorial Logic Circuits", Transactions on Computer-Aided Design, 11(7), pp 926–938, 1992 or U. Mahlstedt, "DELTEST: Deterministic Test Generation for Gate Delay Faults", Proceedings of IEEE International Test Conference, pp. 972–980, 1993.

A signal propagation path in a semiconductor integrated circuit is referred as a path. A time interval required for a signal to propagate from an input signal line to an output signal line of a path is referred to as a path delay time. When a path delay time exceeds a given value, a circuit fails to operate normally, and this is referred as a path delay fault. Two test patterns are generally necessary to test a delay fault, and are commonly referred to as a test vector pair or a test pattern sequence. According to the conventional practice, a test pattern sequence which tests a path delay fault in an integrated circuit is generated by utilizing a five logic value system shown in FIG. 2 and assigning the logic values to various signal lines in the circuit under test according to an implication table shown in FIG. 3 or a sensitizing table shown in FIG. 4. In FIG. 2, S0 remains to be "0" for either pattern v1 or v2; S1 remains to be "1" for either pattern v1 or v2; U0 is equal to "x" for pattern v1 and to "0" for pattern v2; U1 is equal to "x" for pattern v1 and to "1" for pattern v2; and XX remains to be "x" for either pattern v1 or v2.

Output states of AND gate shown in FIG. 3$a$1 when its input terminals $x_1$, $x_2$ assume various combinations of S0, U0, S1, U1 and XX are illustrated in the implication table of FIG. 3$a$2. To give an example, when $x_1$ is equal to S0 and $x_2$ is equal to U0, it follows that v1=<0,x> and v2=<0,0>, and thus the output is <0,0>=S0. Output states of NOR gate shown in FIG. 3$b$1 when its input terminals $x_1$, $x_2$ assume various combinations of S0, U0, S1, U1, and XX are illustrated in the implication table of FIG. 3$b$2. Similarly, output states of an inverter shown in FIG. 3$c$1 when a single input terminal $x_1$ assumes one of S0, U0, S1, U1 and XX are illustrated in the implication table of FIG. 3$c$2.

FIG. 4$a$ shows a value of the other input signal to change the output status or to activate the circuit when one input to AND gate has changed from "0" to "1". In the present instance, it may be S1 or from "x" to "1". For the instance of FIG. 4$b$ where one input changes from "1" to "0", the other input may be U1 or remain to be "1" in order to change the output state (or to activate the circuit). FIG. 4$c$ shows the five value logic of the other input signal required to activate the respective gates when one input to AND gate, NAND gate, OR gate or NOR gate rises from "0" to "1" or falls from "1" to "0".

In an integrated circuit shown in FIG. 5$a$, inputs from input terminals $x_1$ and $x_2$ feed AND gate $G_1$; inputs from input terminals $x_3$ and $x_4$ feed OR gate $G_2$; the input from the input terminal $x_1$ feeds an inverter $G_3$; an output from the inverter $G_3$ and an input from an input terminal $x_5$ feed AND gate $G_5$; outputs from the gates $G_1$ and $G_2$ feed NOR gate $G_4$; and outputs from the gates $G_4$ and $G_5$ feed OR gate $G_6$. In order to generate a test pattern for a path delay fault which might occur on a path P shown in thick lines in this circuit or a path extending from the input terminal $x_3$ through $G_2$, $G_4$ and $G_6$ to an output line, transition signals as shown in FIG. 5$a$ are initially provided on signal lines located on the path P under test, the sensitizing table shown in FIG. 4$c$ is utilized to apply signal values which activate the gates $G_2$, $G_6$ to side inputs, namely, input signal lines to the logic gates $G_2$, $G_6$, but which are not disposed on the path P, as shown in FIG. 5$b$, and finally, signal values to be applied to individual input signal lines are determined on the basis of signal values which have been allotted in the manner mentioned above, using the implication table shown in FIG. 3, as illustrated in FIG. 6. In the example shown in FIGS. 5 and 6, the test pattern sequence which tests the path delay fault on the path P is determined as T=<v1, v2>=<"S0 XX U1 S0 U0">=<"0x00x", "0x100">. A technique for generating test patterns for the path delay fault is disclosed, for example, in C. J. Lin and S. M. Reddy, "On Delay Fault Testing in Logic Circuits", Transactions on Computer-Aided Design, CAD-6(5), pp 694–703, 1987 (referred to as literature 1) or K. T. Cheng, A. Kristic and H. C. Chen, "Generation of High Quality Tests for Robustly Untestable Path Delay Faults", Transactions on Computers, 45(12), pp 1379–1392, 1996.

The method of generating test patterns described above with reference to FIG. 1 is subject to a restriction that the influence of a fault must be propagated to an output terminal (pin) of a circuit under test because the technique is based on the observation of a voltage signal on the output terminal (pin) of the circuit under test, and thus the generation of test patterns involves a difficulty. In particular, to test for a small gate delay fault in which an increment in the delay time is minimal or less than a clock period of the circuit under test, an output signal from a faulty gate must be propagated to the output terminal (pin) through a signal transmission path having a greatest delay time, and accordingly, it is very difficult to generate two test patterns (test vector pair or test pattern sequence) to activate the fault.

In a conventional method of generating test patterns, the need to propagate the influence of a gate delay fault and an open fault to the output signal line increases the probability that logic values on signal lines which are produced by the implication operation to generate path test patterns may become contradictory among logic values on signal lines, resulting in difficulties that the number of times that the set-up of signals must be retried (back-track) to generate test patterns increases and that it takes an increased length of time to generate test patterns.

Accordingly, there is a need for a method of generating test patterns which is capable of generating test pattern sequence easily and rapidly in order to test for a gate delay fault, or an open fault which gives rise to a gate delay fault in an integrated circuit.

The method of generating test patterns described above with reference to FIGS. 5 and 6 is subject to a restriction that non-controlling input values must be set up to side inputs or every input signal line, which is not disposed on a path under test, to each logic gate disposed on the path under test in order to activate the path under test, and another restriction that there must not be any hazard (whisker-like voltage pulse) on the path under test and side inputs in order to generate a test pattern sequence which is qualified to a robust path delay fault testing, that is, test results independent from the timing of an output voltage sampling. As a consequence of this, it is with a great difficulty to generate a test pattern sequence. In addition, the number of path delay faults for which the test pattern sequence cannot be generated increases, presenting a problem that the trouble shooting rate of the path delay faults is degraded. The non-controlling input value refers to a logic value which cannot determine an output of a logic gate uniquely. For example, a non-controlling input value for AND gate or NAND gate is a logic value of "1", and a non-controlling input value for OR gate or NOR gate is a logic value of "0".

Accordingly, there is a need for a method of generating test patterns which is capable of easily and efficiently generating test pattern sequence which can be used with the path delay faults of an integrated circuit.

It is an object of the invention to provide a test pattern generating method and apparatus which is capable of generating easily and efficiently test pattern sequence which can be used with a delay fault or an open fault within a semiconductor integrated circuit, by utilizing a highly observable transient power supply current ($I_{DDT}$) testing technique which is capable of testing a transient phenomenon in a circuit.

It is another object of the invention to provide a test pattern generating method and apparatus which is capable of easily generating test pattern sequence which can be used with a path delay fault in a semiconductor integrated circuit and thus capable of providing an efficient test pattern sequence, by utilizing a highly observable transient power supply current ($I_{DDT}$) testing technique which is capable of testing a transient phenomenon in a circuit.

SUMMARY OF THE INVENTION

In a method of generating a test pattern sequence for testing a semiconductor integrated circuit according to a first aspect of the present invention, a fault list which can occur in a semiconductor integrated circuit under test is prepared, one of the faults for which the test patterns are to be generated is selected from the list, an initializing test pattern which applies an initial value which causes the fault to be activated to a location corresponding to the selected fault is determined, assuming that a fault occurs at the fault location where a stuck-at at the initial value occurs, a propagation test pattern which propagates the stuck-at fault to the output of a following logic gate which follows the fault location is determined, a test pattern sequence comprising the initializing test pattern and the propagation test pattern determined as mentioned above is registered with a test pattern list, and the steps including and subsequent to the step of selecting the fault are repeated until an unprocessed fault ceases to exist in the fault list.

The test pattern sequence mentioned above may be generated by generating a test pattern sequence which applies signal values according to the five value logic system which activate the selected fault to the location corresponding to the selected fault and which propagates the signal values to the output of a logic gate which follows the fault location. Alternatively, a different technique may be used.

As a further alternative, there may be provided a client system and a plurality of server systems wherein the client system prepares the fault list, which may be divided into a plurality of fault sub-lists to be transmitted to the plurality of server systems where each of the server systems selects one of faults for which test patterns are to be generated from the fault sub-list transmitted from the client system and determines a test pattern sequence which applies a signal which activates the fault to the location corresponding to the selected fault and which propagates the signal to a logic gate which follows the location of the fault and returns the test pattern sequence to the client system, the server system notifying the client system that it has completed the processing operation whenever an unprocessed fault ceases to exist in the fault sub-list, the client system registering a test pattern sequence which is returned from the plurality of servers with a test pattern list and terminating its processing operation upon receipt of notifications from all of the server systems that their generations of test patterns have been completed.

The test pattern sequence can be generated rapidly using such a distributed processing operation.

Using the registered test pattern sequence, a transient power supply current fault simulation may be conducted to prepare a fault list which can be detected with the test pattern sequence (hereafter referred to as a detectable fault list), and the faults contained in the detectable fault list may be deleted from the fault list.

In this manner, the processing of faults contained in the fault list can be rapidly completed.

When using the client system in combination with the plurality of server systems, rather than dividing the fault list into sub-lists and transmitting them immediately to the server systems, the faults may be transmitted one by one sequentially to a particular server system which has completed its processing operation, and a test pattern sequence which is returned from the server system or which is to be registered may be used to conduct a transient power supply current fault simulation to prepare a fault list which can be detected with this test pattern sequence (or a detectable fault list), and the faults contained in the detectable fault list may be deleted from the fault list. In this manner, the overall processing speed can be increased. Alternatively, the server systems may select a fault or faults from the fault list stored by the client system to process it, and may examine if there is any unprocessed fault in the fault list.

It is desirable that the step of generating the test pattern sequence generates the test pattern sequence in unit of a gate delay fault.

It is also desirable that the step of generating the test pattern sequence generates the test pattern sequence in unit of an open fault.

In a method of generating test patterns according to a second aspect of the present invention, a list of path delay faults for a semiconductor integrated circuit under test (a fault list) is prepared, a test pattern sequence comprising two or more test patterns which are to be applied to the semiconductor integrate circuit is generated, the test pattern sequence is used to perform a transition simulation of the semiconductor integrated circuit under test, a train of transition signal values which occur on signal lines within the circuit are calculated, using the transition signal values on the signal lines calculated by the transition simulation, a fault list which can be detected by the transient power supply current test using the test pattern sequence (a detectable fault list) is prepared, faults contained in the detectable fault list are deleted from the fault list, the test pattern sequence is registered with a test pattern sequence list, and the steps including and subsequent to generating the test pattern sequence is repeated until the path delay faults contained in the fault list is reduced below a given number.

Again, a client system and a plurality of server systems may be provided wherein the client system, for example, prepares a list of path delay faults (a fault list), test pattern sequence are generated and are transmitted one each to one or more server systems which are not performing a processing operation, each server system performs a transition simulation using the test pattern sequence which is transmitted from the client system, calculates a train of transition signal values produced on signal lines within the circuit, prepares a fault list which can be detected by the transient power supply current test in accordance with this test pattern sequence using the transition signal values (a detectable fault list) and deletes faults contained in the detectable fault list from the fault list, and the client system notifies the completion of a processing operation to each server system whenever the number of path delay faults which remain in the fault list is reduced below a given value. Alternatively, the client system may prepare a list of a sufficient number of test pattern sequence previously, which are then fractionated into a plurality of test pattern sequence sub-lists, which are transmitted to each server system, which in turn selects a test pattern sequence from the list of test sub-pattern sequence for purpose of its- processing operation.

In the description to follow, the principle of the present invention will be described in terms of a CMOS integrated circuit which represents a most common semiconductor integrated circuit. According to the invention, a transient power supply current testing technique is utilized, and accordingly, the transient power supply current of the CMOS integrated circuit and the fault detection which is based on the transient power supply current will be described below.

Transient Current in a CMOS Logic Gate

FIG. 7 shows a transient response of a CMOS inverter shown in FIGS. 7c and d. The transient response has been determined with a circuit simulator. FIG. 7a shows a response of an output voltage $V_{OUT}$ with respect to an input voltage $V_{IN}$ in a transient condition, while FIG. 7b shows a response of a current $I_{DD}$ which flows from a power supply into the CMOS inverter. The current $I_{DD}$ is referred to as a transient current. When the input IN of the inverter transitions from "1" to "0" (see FIG. 7c), n-MOS and p-MOS are only momentarily turned on as long as the input voltage is higher than the threshold voltage of n-MOS and lower than the threshold voltage of p-MOS, whereby a short-circuit current Is flows from a power supply terminal $T_{VD}$ to a ground GND. An output OUT from an output signal line of the inverter then transitions from "0" to "1", and accordingly, at the same time as the short-circuit current $I_S$, a current $I_C$ which is associated with a capacitance charging of a parasitic capacitance $C_{load}$ connected to the output signal line of the inverter flows from the power supply terminal $T_{VD}$ to the parasitic capacitance $C_{load}$. Accordingly, when a falling transition (denoted by suffix "f") occurs on the input IN of the inverter, the transient current $I_{Gf}$ which flows into the inverter is given by the sum of the short-circuit current $I_{Sf}$ and the capacitance charging current $I_C$.

$$I_{Gf} = I_{Sf} + I_C \quad (1)$$

On the other hand, when the input IN transitions from "0" to "1" or when the output transitions from "1" to "0" (denoted by suffix "r") (see FIG. 7d), a capacitance discharge occurs from the parasitic capacitance $C_{load}$ connected to the output signal line, thus producing a capacitance discharge current $I_D$, but the current $I_{Gr}$ which flows from the power supply terminal $T_{VD}$ to the inverter comprises only the short-circuit current $I_{Sr}$. Accordingly, a peak of the current $T_{VD}$ is slightly smaller than the peak of the transient current $I_{Gf}$ which occurs during the falling transition as shown in FIG. 7b.

$$I_{Gr} = I_{Sr} \quad (2)$$

The CMOS inverter has a transfer characteristic which is such that a triangular pulse current $I_S$ is produced in response to a change in the input voltage $V_{IN}$, as shown in FIG. 8a. Accordingly, when a rising transition occurs on the input of the CMOS inverter, the short-circuit current waveform $I_{Sr}$ which flow through the CMOS inverter can be approximated by a triangular pulse, as indicated by "$I_S$" in FIG. 8b, assuming a ramp transition for the input voltage $V_{IN}$. The short-circuit current waveform $I_{Sr}$ with respect to the rising transition of the input signal as indicated in FIG. 8b can be given by the following approximations:

$$I_{Sr} = \begin{cases} 0, & t \leq \frac{V_{THN}}{V_{DD}}t_r \\ \frac{V_{DD} \cdot I_{Smax}}{(V_{SP} - V_{THN}) \cdot t_r}t - \frac{V_{THN} \cdot I_{Smax}}{(V_{SP} - V_{THN})}, & \frac{V_{THN}}{V_{DD}}t_r < t \leq \frac{V_{SP}}{V_{DD}}t_r \\ \frac{V_{DD} \cdot I_{Smax}}{(V_{SP} - V_{DD} + V_{THP}) \cdot t_r}t - \frac{(V_{DD} - V_{THP}) \cdot I_{Smax}}{(V_{SP} - V_{DD} + V_{THP})}, & \frac{V_{SP}}{V_{DD}}t_r < t \leq \frac{V_{DD} - V_{THP}}{V_{DD}}t_r \\ 0, & t \geq \frac{V_{DD} - V_{THP}}{V_{DD}}t_r \end{cases} \quad (3)$$

where $I_{Smax}$ represents a maximum value of the transient current (short-circuit current) which flows into the CMOS inverter, $V_{DD}$ represents a power supply voltage, $V_{THN}$ a threshold voltage of n-MOS transistor, $V_{THP}$ a threshold voltage of a p-MOS transistor and $t_r$ a time interval for the rising transition of the input signal. It is to be noted that $V_{THP}$ is indicated in its absolute magnitude. To simplify the approximations, it is assumed that the transition of the input voltage $V_{IN}$ begins at time 0, and the input voltage reaches to $V_{DD}$ at time $t_r$ which represents the completion of the transition.

Similarly, the short-circuit current waveform $I_{Sf}$ of the CMOS inverter in response to the falling transition of the input signal can be given by the following approximations:

$$I_{Sf} = \begin{cases} 0, & t \leq \frac{V_{THP}}{V_{DD}}t_f \\ \frac{V_{DD} \cdot I_{Smax}}{(V_{DD} - V_{THP} - V_{SP}) \cdot t_f}t - \frac{V_{THP} \cdot I_{Smax}}{(V_{DD} - V_{THP} - V_{SP})}, & \frac{V_{THP}}{V_{DD}}t_f < t \leq \frac{V_{DD} - V_{SP}}{V_{DD}}t_f \\ \frac{V_{DD} \cdot I_{Smax}}{(V_{THN} - V_{SP}) \cdot t_f}t - \frac{(V_{DD} - V_{THN}) \cdot I_{Smax}}{(V_{THN} - V_{SP})}, & \frac{V_{DD} - V_{SP}}{V_{DD}}t_f < t \leq \frac{V_{DD} - V_{THN}}{V_{DD}}t_f \\ 0, & t \geq \frac{V_{DD} - V_{THN}}{V_{DD}}t_f \end{cases} \quad (4)$$

where $t_f$ represents a time interval for the falling transition of the input signal. For the sake of convenience, times for the start of the rising transition of the power supply current, the maximum value $I_{Smax}$ and the end of the falling transition are indicated in parentheses in FIG. 8b.

Denoting a voltage change on the output signal line by $v_{out}(t)$, the charging current $I_C$ to the parasitic capacitance $C_{load}$ connected to the output signal line of the CMOS inverter is given by the following equation:

$$I_C = C_{load}\frac{dv_{out}(t)}{dt} \quad (5)$$

Such equations can be similarly determined for logic gates other than the inverter.

Assuming that the transient current $I_G$ which flows into a logic gate is substantially short-circuit current, it can be approximated by a triangular pulse as indicated by $I_S$ in FIG. 8b. In actuality, the transient current waveform $I_G$ of the CMOS inverter represents a triangular pulse as shown in FIG. 7b. Accordingly, the transient current $I_G$ of the logic gate increases monotonously until the maximum value $I_{Smax}$ is reached whereupon it decreases monotonously, as shown in FIG. 8b. The transient current $I_G$ reaches its maximum value $I_{Smax}$ when the input voltage $V_{IN}$ reaches the switching voltage $V_{SP}$ for the logic gate. Specifically, as shown in FIG. 8b, the time when the current $I_G$ reaches its peak coincides with the time of input transition of the logic gate. Because the logic gate has a delay time, the time for the output transition of the logic gate will be slightly lagging with respect to the time for the input transition. Thus, the time when the current $I_G$ reaches its peak slightly precedes the time for the output transition of the logic gate. In this instance, the falling edge of the transient current waveform $I_G$ may be considered as coincident with the time for the output transition. In addition, the transient current waveform $I_G$ of the logic gate has a pulse width which is proportional to the transition time of the input voltage (for example the time interval $t_r$ for the rising transition).

In the above description, it has been assumed that the transient current $I_G$ which flows into the logic gate is substantially a short-circuit current $I_S$. However, with a miniaturization of a CMOS manufacturing process, the wiring delay will be more dominant over the gate delay. This means that assuming a constant transition time interval for the input voltage, the proportion of the charging current $I_C$ to the output signal line will be greater than the proportion of the short-circuit current $I_S$ in the transient current $I_G$ which flows into the CMOS logic gate. Accordingly, the time when the transient current waveform of the logic gate reaches its peak depends on the ratio of the charging current $I_C$ to the short-circuit current $I_S$. When $I_C$ is less than $I_S$, the peak of the transient current waveform $I_G$ coincides with the peak of $I_S$. Because the peak of $I_S$ coincides with the transition time interval of the input voltage, it follows that the peak of $I_G$ precedes the time for the output transition of the logic gate. Conversely, if $I_C$ is greater than $I_S$, the peak of the transient current waveform coincides with the peak of $I_C$. Because the charging current $I_C$ relates to the voltage transition on the output signal line, the peak of $I_G$ is substantially coincident with the time for the output transition of the logic gate.

Integral of Transient Power Supply Current

Using the equations (3) and (4), time integrals $Q_{Sr}$ and $Q_{Sf}$ of the short-circuit currents $I_{Sr}$ and $I_{Sf}$ are given as follows:

$$Q_{Sr} = \int_{-\infty}^{\infty} I_{Sr} dt = \frac{I_{Smax}(V_{DD} - V_{THN} - V_{THP})}{2V_{DD}} t_r \quad (6)$$

$$Q_{Sf} = \int_{-\infty}^{\infty} I_{Sf} dt = \frac{I_{Smax}(V_{DD} - V_{THN} - V_{THP})}{2V_{DD}} t_f \quad (7)$$

Accordingly, the integral $Q_S$ of the short-circuit current through the logic gate as it is switched is given as follows:

$$Q_S \equiv \int_{-\infty}^{\infty} I_S dt = \frac{I_{Smax}(V_{DD} - V_{THN} - V_{THP})}{2V_{DD}} t_T \propto t_T \quad (8)$$

where $t_T$ represents a transition time for the input signal. Thus, the integral $Q_S$ of the short-circuit current $I_S$ ($I_{Sr}$ or $I_{Sf}$) which flows into the logic gate is proportional to the time $t_T$ for the input transition of the logic gate. It will also be seen that $Q_S$ does not depend on whether the transition of the input signal is rising or falling.

From the equation (5), it is seen that the integral $Q_C$ of the charging current $I_C$ to an output load capacitance $C_{load}$ of a CMOS inverter is given by the equation indicated below.

$$Q_C = \int_{-\infty}^{\infty} I_C dt \quad (9)$$

$$= \int_{-\infty}^{\infty} C_{load} \frac{dv_{out}(t)}{dt} dt$$

$$= C_{load} [v_{out}(t)]_{-\infty}^{\infty}$$

$$= C_{load} (V_{DD} - 0)$$

$$= C_{load} V_{DD}$$

and it is seen that it does not depend on the time $t_T$ for the input transition of the CMOS inverter.

Consequently, the integrals $Q_{Gf}$ and $Q_{Gr}$ of the transient currents $I_{Gf}$ and $I_{Gr}$ passing through the logic gate are determined from the equations (1), (2), (8) and (9) as follows:

$$Q_{Gf} = \int_{-\infty}^{\infty} (I_{Sf} + I_C) dt \quad (10)$$

$$= \frac{I_{Smax}(V_{DD} - V_{THN} - V_{THP})}{2V_{DD}} t_T + C_{load} V_{DD} \propto t_T$$

$$Q_{Gr} = \int_{-\infty}^{\infty} I_{Sr} dt = \frac{I_{Smax}(V_{DD} - V_{THN} - V_{THP})}{2V_{DD}} t_T \propto t_T \quad (11)$$

Thus, an integral of the transient current through the logic gate is proportional to the time for the input transition of the logic gate.

Transient Power Supply Current $I_{DDI}$ in CMOS Integrated Circuit

A power supply current in a CMOS integrated circuit represents a power supply current which flows into the CMOS integrated circuit, and is represented by a sum of currents which flow through individual logic gates within the integrated circuit.

A CMOS integrated circuit shown in FIG. 9a comprises a combination of four ($G_1$, $G_2$, $G_3$, $G_4$) of the inverter shown in FIG. 7c and which are connected in tandem. Transient currents $I_{G1}, I_{G2}, I_{G3}, I_{G4}$ which flow through the inverters $G_1$, $G_2$, $G_3$, $G_4$ are normally fed from a single power supply terminal $T_{VD}$. Accordingly, the transient power supply current response of the integrated circuit is represented by a sum of transient currents flowing through the individual logic gates as shown in FIG. 9c and as given below.

$$I_{DDT} = \sum_{n=1}^{N} I_{Gn} \quad (12)$$

where N represents the number of logic gates which are switched by input test pattern sequence. In the example shown in FIG. 9a, N=4. FIG. 9b shows a relationship between an input voltage and an output voltage of each logic gate.

Accordingly, when there is a fault in the integrated circuit which causes a change in the transient current of the logic gate and when there is a test pattern sequence which is capable of activating the fault, the fault can be detected by an observation of $I_{DDT}$ of the integrated circuit.

An integrated value $Q_{DDT}$ of the transient power supply current $I_{DDT}$ can be represented as a sum of integrated values $Q_{Gn}$ ($1 \leq n \leq N$) of currents which pass through individual logic gates.

$$Q_{DDT} = \int_{-\infty}^{\infty} I_{DDT} dt \quad (13)$$

$$= \int_{-\infty}^{\infty} \left( \sum_{n=1}^{N} I_{Gn} \right) dt$$

$$= \sum_{n=1}^{N} \int_{-\infty}^{\infty} I_{Gn} dt$$

$$= \sum_{n=1}^{N} Q_{Gn}$$

In the example of FIG. 9a, the integrated value $Q_{DDT}$ of the transient power supply current $I_{DDT}$ is represented as a sum of integrated values ($Q_{G1}$, $Q_{G2}$, $Q_{G3}$, $Q_{G4}$) of the currents ($I_{G1}$, $I_{G2}$, $I_{G3}$, $I_{G4}$) passing through the individual inverters. Accordingly, if there is a fault within the integrated circuit which causes a transient current through the logic gate or its time integral to change and if there is a test pattern which is capable of activating the fault, the fault can be detected from an observation of the integrated value $Q_{DDT}$ of the transient power supply current $I_{DDT}$ of the integrated circuit.

Detection of Gate Delay Fault

A gate delay fault is a fault which causes a signal propagation delay from an input to an output of a logic gate to increase. A fault which causes a rising transition of an output from the logic gate to retard is referred to as a slow-to-rise fault while a fault which causes a falling transition to retard is referred to as a slow-to-fall fault. When a gate delay fault occurs through a logic gate disposed within a CMOS integrated circuit, the output transition time of the logic gate is retarded. Accordingly, a logic gate which receives at its input an output from the faulty logic gate will have a retarded timing for the peak of the transient current. Accordingly, if a test pattern sequence could activate a faulty logic gate and switch another logic gate which is driven by the faulty gate, the gate delay fault can be detected from an observation of a lag in the current peak of $I_{DDT}$ of the CMOS integrated circuit.

Detection of Open Fault

Next, an open fault which causes a delay fault will be defined. An open fault refers to an unintended electrical discontinuity, specifically indicating that a signal line is divided into two or more distinct signal lines. An open fault includes a breaking as may be caused by a poor contact due to an absence of metal or the presence of an oxide film, a breaking of a metal wiring due to poor patterning or etching, and a breaking in a diffusion layer or a polysilicon due to a mask failure. An open fault can be categorized into two types, including an open fault in which a wiring L is divided in two spaced portions L1 and L2, as shown in FIG. 10a and where an input $V_{IN}$ to one end of the wiring L cannot appear at an output $V_{OUT}$ at the other end of the wiring L to cause a "logic fault", and another open fault in which the divided wiring portions L1 and L2 are spaced very closely as shown in FIG. 10c and where an input signal $V_{IN}$ applied to one end of the wiring L flows as a tunnel current and transition signal appears at the other end of the wiring L with a delay to cause a "delay fault" as shown in FIG. 10d. An open fault which causes a logic fault involves a large scale of disconnection, so that there is no current flow if a voltage is applied across the signal lines (divided wiring portions L1 and L2) located on the opposite sides of the fault, and accordingly, there takes place no charging or discharge of the parasitic capacitance $C_{load}$ in response to a signal transition, thus causing a logic fault in which the logic is fixed to a given value. By contrast, in an open fault which causes a delay fault, a very weak current flows when a voltage is applied across the signal lines (L1 and L2) located on the opposite sides of the fault, but the magnitude of the current is less than a normal current flow, retarding the charging or discharge of the parasitic capacitance $C_{load}$ in response to the signal transition, thus increasing a delay time of the circuit. An open fault which causes a delay fault includes a resistive open fault in which a resistance between signal lines L1 and L2 becomes larger than a normal value as a result of a poor contact or the resistance of the signal line L becomes larger than a normal value as a result of a failure occurring in the signal line L, and a minuscule open fault (<100 nm) in which a very weak leak current flows across two broken signal line portions L1 and L2 by the tunnel effect. A tunnel current through a minuscule open fault is described, for example, in C. L. Henderson, J. M. Soden and C. F. Hawkins, "The Behavior and Testing Implications of CMOS IC Logic Gate Open Circuits" Proceedings of IEEE International Test Conference, pp. 302–310, 1991. An open fault which causes a delay fault is dealt with herein and will be simply referred to as an open fault.

With the open fault, there is a small current flow through the fault, and thus it can be modeled by resistive element $R_{open}$ having an increased resistance. FIG. 11a shows an example of a CMOS integrated circuit having an open fault. The CMOS integrated circuit comprises a pair of inverters $G_1$, $G_2$, and an open fault exists in a signal line M which connects between the inverters $G_1$ and $G_2$. The location of disconnection can be regarded as being equivalent to a connection through the resistor $R_{open}$. When the inverter $G_1$ switches to produce a signal transition on the signal line M, the presence of the open fault causes a time interval required for an input parasitic capacitor $C_{in}$ of the inverter $G_2$ to be charged or discharged increases (in proportion to the product of the resistance of the open fault and the parasitic capacitance), and accordingly, a signal transition on a signal line M' which is located on the inverter $G_2$ side of the equivalent resistive element $R_{open}$ is retarded as shown in FIG. 11c relative to an output from the inverter $G_1$ (FIG. 11b). Accordingly, as shown in FIG. 12, the transient current waveform (shown in dotted lines) of the inverter $G_2$ having the open fault on its input side has a greater width of the current pulse and a greater time integral of the transient current as compared with the transient current waveform (shown in solid line) of the normal inverter. Accordingly, by observing $I_{DDT}$ or $Q_{DDT}$ of the CMOS integrated circuit, the presence of an open fault in the input stage of the inverter $G_2$ can be detected. An open fault which exists on the output stage of the inverter $G_1$ is equivalent to an open fault present on the input stage of the inverter $G_2$, and thus can be similarly detected. For an open fault on any signal line in an integrated circuit generally, if an open fault can be activated by a test pattern sequence to cause a switching of a logic gate which is driven by the activated open fault, such open fault can be detected from an observation of $I_{DDT}$ or $Q_{DDT}$ of the integrated circuit.

Path Delay Fault

A route within an integrated circuit through which a signal is propagated is referred to as a path. When a delay time from a start point of the path (input signal line) to an end point (output signal line), which is referred to herein as path delay time, becomes greater (or less) than a given value, the integrated circuit exhibits an abnormal behavior, which is referred to as a path delay fault. A path delay fault will now be defined.

Consider that for a CMOS logic circuit that a path $P=\{g_0,g_1,g_2, \ldots, g_m\}$ is activated using a test pattern sequence $T=<v_1,v_2>$ meaning that it contains two test patterns $v_1$ and $v_2$ and that a voltage signal $v_2$ follows a voltage signal $v_1$. $g_0$ represents an input signal line of the path P while $g_1,g_2, \ldots, g_m$ represent output signal lines of logic gates $G_1,G_2, \ldots, G_m$ on the path P. At the same time, $g_0$, $g_1, \ldots, g_{m-1}$ represent input signal lines to the logic gates $G_1$, $G_2, \ldots, G_m$ on the path P. Denoting the time for a signal transition on each signal line $g_0, g_1, \ldots, g_m$ (the time when the voltage signal passes $V_{DD}/2$) by $\tau_0, \tau_1, \ldots \tau_m$, the gate delay time $t_{gdi}$ ($1 \leq i \leq m$) of the respective logic gates $G_1$, $G_2, \ldots, G_m$ on the path P is given as follows:

$$t_{gdi} = \tau_i - \tau_{i-1} \tag{14}$$

Accordingly, the path delay time $t_{pd}$ of the path P is given as a sum of the gate delay times $t_{gdi}$, as follows:

$$t_{pd} = \sum_{i=1}^{m} t_{gdi} = \tau_m - \tau_0 \tag{15}$$

However, the actual gate delay time $t_{gdi}$ varies under the influence of a fault as follows:

$$t_{gdi} = t_{gdi,typ} + \delta_i, \ 1 \leq i \leq m \tag{16}$$

where $t_{gdi,typ}$ represents a typical value of the gate delay time of the logic gate $G_i$, and $\delta_i$ represents a variation component in the gate delay time. For example, a breaking fault causes the gate delay time of only a faulty logic gate to increase without increasing the delay time of other logic gates. A parametric fault causes the delay time of every logic gate to increase. With the variation in the gate delay time, the path delay time $t_{pd}$ similarly varies as indicated by an equation given below.

$$t_{pd} = t_{pd,typ} + \Delta = \sum_{i=1}^{m}(t_{gdi,typ} + \delta_i) \quad (17)$$

where $t_{pd,typ}$ represents a typical value of a path delay time for the path P and $\Delta$ represents a variation component in the path delay time.

FIG. 13 is a schematic illustration of the fundamental principle of a delay fault testing technique. In order for a semiconductor integrated circuit (DUT) under test shown in FIG. 13a to operate normally, a signal transition which occurs in an input latch must pass through a path P in the semiconductor integrated circuit under test to be transmitted to an output latch in a given time interval. Accordingly, it will be seen from the relationship between an input $V_{IN}$ and an output $V_{OUT}$ and their relationship with respect to a system clock as shown in FIG. 13b, that the path delay time $t_{pd}$ of the path P must satisfy the following requirement:

$$t_{pd} + T_{SU} < T_{CLK} - T_{SKW} \quad (18)$$

where $T_{SU}$ represents a set-up time for the signal, $T_{CLK}$ the period of the system clock and $T_{SKW}$ a clock skew of the system clock. The clock skew $T_{SKW}$ is a jitter of the system clock and represents an amount by which the edge of the system clock changes in the positive or negative direction. The equation (18) can be modified as follows:

$$t_{pd} < T_{CLK} - T_{SKW} - T_{SU} \equiv T' \quad (19)$$

Thus, the path delay time $t_{pd}$ of the path P must be less than a time interval T' which results when margins such as the set-at time $T_{SU}$ and the clock skew $T_{SKW}$ are subtracted from the clock period $T_{CLK}$. If $t_{pd}$ is greater than T', the signal transmission along the path P cannot catch up with the system clock, and the circuit cannot operate properly. This condition is defined as a delay fault. In other words, the path P is defined as having a delay fault when $t_{pd}$ is greater than a given time interval T'. T' represents an upper limit of a permissible delay time.

Detection of Path Delay (Utilizing a Pulse Width of Transient Power Supply Current)

Since the peak or the falling edge of the transient current waveform of the logic gate corresponds to the time for the output transition of the logic gate, it follows that the last peak (or the last falling edge) of the transient power supply current waveform of the CMOS integrated circuit coincides with the time of the output transition of the logic gate which is the last to be switched in the CMOS integrated circuit. Accordingly, by detecting the last peak (or the last falling edge) of the transient power supply current waveform of the CMOS integrated circuit, and comparing the time of detection against the time for the input transition, a path delay time for the integrated circuit can be determined. The time for the last falling edge of the transient power supply current can be determined as a maximum value of the time when the transient power supply current assumes a given current value, for example, from the time for the input transition on the path of the integrated circuit. This current value represents a value of the power supply current when the output voltage from the last logic gate on the path under test reaches a value equal to one-half the supply voltage $V_{DD}$, and can be determined by the circuit simulation of the circuit under test or from statistical data obtained with an actual device.

A path delay fault on the path under test can be detected by comparing the determined path delay time against a given time (such as a period $T_{CLK}$ of a system clock, for example).

A technique for detecting a delay fault utilizing the pulse width of a transient power supply current mentioned above will now be described. According to this technique, the pulse width of the power supply current waveform of a circuit under test is measured and compared against a given time interval. The fundamental principle of the technique is illustrated in FIG. 14.

Assume that in a CMOS logic circuit, a plurality of paths $P_1, P_2, \ldots, P_n$ are activated using test pattern sequence $T = <v_1, v_2>$ including two test patterns $v_1, v_2$. Denoting the time when a j-th logic gate, as counted from the input of a path $P_i$, is switched by $\tau_{ij}$, it will be noted that the number of logic gates depends on each of the paths $P_1, P_2, \ldots, P_n$, and the time $\tau_{max}$ for the output transition of a logic gate $G_{final}$, which is the last to be switched among the paths $P_1, P_2, \ldots, P_n$ is given by the following equation:

$$\tau_{max} = \max_{i,j}\{\tau_{ij}\}, 1 \leq i \leq n, 1 \leq j \quad (20)$$

Thus, a maximum value of path delay time $t_{pd.max}$ among the paths $P_1, P_2, \ldots, P_n$ is determined as a time interval between $\tau_{max}$ and time $\tau_0$ for the input transition, as indicated below.

$$t_{pd.max} = \tau_{max} - \tau_0 \quad (21)$$

On the other hand, the pulse width $t_{PW}$ of the transient power supply current waveform of the CMOS logic circuit is defined as a time interval between the time $\tau_0$ for the signal transition of the circuit input and the $\tau_{IDD}$ of the last peak (falling edge) of the transient power supply current waveform. Thus $$t_{PW} = \tau_{IDD} - \tau_0 \quad (22)$$

As mentioned previously, the time $\tau_{IDD}$ for the last peak of the transient power supply current waveform either coincides with the time $\tau_{max}$ for the output transition of the logic gate $G_{final}$ which is the last to be switched or precedes $\tau_{max}$. Thus, the pulse width $t_{PW}$ of the transient power supply current waveform corresponds to the delay time $t_{pd.max}$ of the path P which is activated by a test pattern T.

$$t_{PW} = \tau_{IDD} - \tau_0 \leq \tau_{max} - \tau_0 = t_{pd.max} \quad (23)$$

If $t_{PW}$ is greater than the upper limit T' of the permissible delay time, it follows that $$T' < t_{PW} \leq t_{pd.max} \quad (24)$$

Thus, the signal transmission cannot catch up with the system clock on the path having the greatest delay time $t_{pd.max}$. Thus, there exists a delay fault in the circuit. In this manner, $t_{PW}$ greater than T' indicates the presence of a delay fault on some one of the activated paths, while $t_{PW}$ less than T' indicates the absence of a delay fault on any activated path.

$t_{PW} \leq T'$ no delay fault $t_{PW} > T'$ delay fault present  (25)

In this manner, a delay fault in the circuit can be tested by comparing the pulse width $t_{PW}$ of the transient power supply current waveform against a given time T'.

Delay Fault Detecting Technique (Utilizing the Instantaneous Value of the Transient Power Supply Current)

Because the transient power supply current of a logic gate decreases monotonously after its peak as shown in FIG. 7b, it will be seen that the power supply current of the CMOS integrated circuit shown in FIG. 9c decreases monotonously subsequent to the time for the output transition of a logic gate which is the last to be switched in the integrated circuit. In other words, in a fault-free CMOS integrated circuit, denoting the time for the output transition of the last logic gate to be switched by $\tau_{max}$ and the instantaneous value of the transient power supply current at time $\tau_{max}$ by I', the transient power supply current of the CMOS integrated circuit cannot become greater than I' subsequent to $\tau_{max}$.

Using this principle, a path delay fault in a circuit under test can be detected by measuring the instantaneous value of a transient power supply current of a CMOS integrated circuit at a given time. The current value I' which is used as a criterion for the judgment of a fault detection is a value of the power supply current at the time when an output from the last logic gate on a path under test assumes one-half the supply voltage, and can be determined by a circuit simulation of the circuit under test or from statistical data using an actual device.

A technique for detecting a delay fault utilizing the instantaneous value of the transient power supply current will be described. According to this technique, the instantaneous value of the transient power supply current of the circuit under test at a given time is measured, and is compared against the value of the transient power supply current of a golden circuit which is free from a delay fault. The fundamental principle of the technique is illustrated in FIG. 15.

Assume that in a CMOS logic circuit, a plurality of paths $P_1, P_2, \ldots, P_n$ are activated by test pattern sequence $T=<v_1, v_2>$. Denoting the time when a j-th logic gate as counted from the input of a path $P_i$ by $\tau_{ij}$, the time $\tau_{max}$ for the output transition of a logic gate $G_{final}$ which is the last to be switched among the paths $P_1, P_2, \ldots, P_n$ is given by the following equation:

$$\tau_{max} = \max_{i,j}\{\tau_{ij}\}, 1 \leq i \leq n, 1 \leq j \quad (26)$$

Accordingly, a maximum value $t_{pd.max}$ of the path delay time among the paths $P_1, P_2, \ldots, P_n$ can be determined as a time interval between $\tau_{max}$ and a time $\tau_0$ for the input transition, as indicated below.

$$t_{pd.max} = \tau_{max} - \tau_0 \quad (27)$$

As mentioned previously, because the time for the output transition of a logic gate coincides with the time for the peak or the falling edge of the transient power supply current of the logic gate, it follows that $\tau_{max}$ corresponds to a time $\tau_{IDD}$ for the last peak or the falling edge of the transient power supply current waveform $I_{DDT}$ of the circuit. The power supply current $I_G$ of the logic gate can be approximated by a triangular wave and $G_{final}$ represents the last gate to be switched, and hence, there is no logic circuit which has a peak of the power supply current subsequent to $\tau_{max}$. Accordingly, a power supply current waveform function $i_{DDT}(t)$ is a monotonously decreasing function at time t which is $t \geq \tau_{max}$. Thus, denoting the time function for the power supply current waveform by $i_{DDT}(t)$ and the instantaneous value of the power supply current at a time $\tau_{max}$ by I', the latter is given as follows:

$$I' \equiv i_{DDT}(\tau_{max}) \quad (28)$$

It follows that at time t which is $t \geq \tau_{max}$, $$i_{DDT}(t) \leq i_{DDT}(\tau_{max}) = I', \ t \geq \tau_{max} \quad (29)$$

In order for the circuit to operate properly, $t_{pd.max}$ must be less than the upper limit T' of the delay time (which is equal to $T_{CLK} - T_{SKEW} - T_{SU}$ as indicated in the equation (19)). Thus $$t_{pd.max} = \tau_{max} - \tau_0 < T' \quad (30)$$

Accordingly, in the absence of a fault in the circuit, it follows from the equation (29) that at time t which is $t = T' + \tau_0 > \tau_{max}$ $$i_{DDT}(T' + \tau_0) \leq I' \quad (31)$$

If the instantaneous value of $I_{DDT}$ at $T' + \tau_0$ is greater than I' or $$i_{DDT}(T' + \tau_0) > I' = i_{DDT}(\tau_{max}) \quad (32)$$

it follows from the equation (29) that because $T' + \tau_0$ cannot be greater than $\tau_{max}$ $$\tau_{max} > T' + \tau_0 \quad (33)$$

$$t_{pd.max} = \tau_{max} - \tau_0 > T' \quad (34)$$

This means that on a path having the greatest delay time $t_{pd.max}$, the signal transmission cannot catch up with the system clock. Thus the presence of a delay fault in the circuit is indicated. In this manner, the fact that a value of the transient power supply current $I_{DDT}(T'+\tau_0)$ at time $T'+\tau_0$ is greater than I' indicates the presence of a delay fault in one of the activated paths. Conversely, the fact that $i_{DDT}(T'+\tau_0)$ is less than I' indicates the absence of a delay fault on any activated path.

$$i_{DDT}(T'+\tau_0) \leq I' \text{ no delay fault}$$

$$i_{DDT}(T'+\tau_0) > I' \text{ delay fault present} \quad (35)$$

As discussed above, a delay fault in the circuit can be detected by comparing the instantaneous value of $I_{DDT}$ at a given time against $I_{DDT}$ level of a fault-free circuit.

Detection of Path Delay Fault (Utilizing a Time Integral of Transient Power Supply Current)

In addition, by using the integrated value $Q_{DDT}$ of the transient power supply current $I_{DDT}$, a path delay fault which is caused by an open fault can be detected. A technique for detecting a path delay fault by utilizing an integrated value of the transient power supply current will now be described. According to this technique, an integrated value of a transient power supply current through a circuit under test is measured, and is compared against a given value to evaluate a path delay fault.

The integrated value $Q_{DDT}$ of the transient power supply current $I_{DDT}$ is represented as a sum of integrated values $Q_{Gn}(1 \leq n \leq N)$ of currents passing through individual logic gates.

$$Q_{DDT} = \int_{-\infty}^{\infty} I_{DDT} dt \quad (13)$$

$$= \int_{-\infty}^{\infty} \left( \sum_{n=1}^{N} I_{Gn} \right) dt$$

$$= \sum_{n=1}^{N} \int_{-\infty}^{\infty} I_{Gn} dt$$

$$= \sum_{n=1}^{N} Q_{Gn}$$

Since the integral $Q_{Gn}$ ($1 \leq n \leq N$) of the current passing through each logic gate is proportional to the time $t_{Tn}$ ($1 \leq n \leq N$) for the input transition of each logic gate, as indicated by the equation (10) or (11), $Q_{DDT}$ is given by a linear polynomial of $t_{Tn}$ ($1 \leq n \leq N$). In the example shown in FIG. 9a, $Q_{DDT}$ is given by a linear polynomial 36, indicated below, of the times ($t_{T1}, t_{T2}, t_{T3}, t_{T4}$) for the input transitions of the respective inverters ($G_1, G_2, G_3, G_4$).

$$Q_{DDT} = \sum_{n=1}^{N} Q_{Gn} = \sum_{n=1}^{N} Q_{Sn} + \sum_{n=1}^{N} Q_{Cn} = \sum_{n=1}^{N} a_n t_{Tn} + b \quad (36)$$

In the equation (36), $a_n$ represents a factor of proportionality between the integral $Q_{Sn}$ of the short-circuit current through the logic gate $G_n$ and the time $t_{Tn}$ for the input transition of the logic gate $G_n$, and b a constant term which is represented by a sum of charging currents $Q_{Cn}$ which flow into the respective logic gates.

An open fault can be modeled by a large resistance $R_{open}$ since a very weak current flows through the fault. FIG. 16a shows an example of CMOS inverter having an open fault at its input. When a signal transition as shown in FIG. 16b occurs on an input signal line A, a signal transition occurring on an signal line A' which is located subsequent to the location of the fault is retarded due to the open fault as indicated in FIG. 16c. At this time, denoting the resistance of the open fault by $R_{open}$ and the parasitic capacitance at the input of the inverter by $C_{in}$, the time interval $t_T$ for the signal transition on the signal line A' is given as indicated below $$t_T \approx t_{T,typ} + 2.2 R_{open} C_{in} \quad (37)$$

where $t_{T,typ}$ represents a typical value of the transition time for the input signal when there is no fault. The transition time $t_T$ is determined here as a time interval for the voltage to rise from 0.1 $V_{DD}$ to 0.9 $V_{DD}$ (or to fall from 0.9 $V_{DD}$ to 0.1 $V_{DD}$). $2.2 R_{open} C_{in}$ represents a time interval in order for a voltage across $C_{in}$ rises from 0.1 $V_{DD}$ to 0.9 $V_{DD}$, and is determined from $\log_e(0.9\ V_{DD}/0.1\ V_{DD}) \times R_{open} C_{in}$. Thus, an increment in the transition time for the input signal of the inverter is proportional to the resistance $R_{open}$ of the open fault. Accordingly, when there is an open fault on the input of a k-th inverter on the path under test, the integral $Q_{DDT}$ of the power supply current of the CMOS integrated circuit is determined from the equations (36) and (37) as indicated by an equation (38). Thus, $Q_{DDT}$ linearly changes in accordance with the resistance $R_{open}$ of the open fault and the increment is proportional to the resistance $R_{open}$ of the open fault.

$$Q_{DDT} = \sum_{n=1}^{N} a_n t_{Tn} + b \quad (38)$$

$$= \left( \sum_{n=1}^{N} a_n t_{Tn,typ} + b \right) + 2.2 a_k C_{in} R_{open}$$

$$= Q_{DDT,typ} + 2.2 a_k C_{in} R_{open} \propto R_{open}$$

where $Q_{DDT,typ}$ represents a typical value of the integral of the power supply current when there is no fault. $2.2 a_k C_{in} R_{open}$ appearing as a second term on the right hand side of the equation (38) is an addition which is based on the input open fault of the k-th inverter. The equation (38) shows a coincidence with a result of simulation performed on a change in $Q_{DDT}$ with respect to $R_{open}$ as shown in FIG. 17. FIG. 17 is a plot of a change in $Q_{DDT}$ with respect to the resistance $R_{open}$ of the open fault when there is an open fault in the input signal line IN2 of the inverter $G_2$ in the circuit shown in FIG. 9.

A gate delay time $t_{gd}$ of a logic gate is proportional to the time $t_T$ for the transition of an input signal as indicated by an equation (39) below. (see equations 4.52 and 4.53, "Principles of CMOS VLSI Design—A Systems Perspective", Second Edition, Addison-Weely Publishing Company, issued 1999, pp. 216–217)

$$t_{gd} = t_{gd,step} + \frac{1}{6}\left(1 - 2\frac{V_{TH}}{V_{DD}}\right) t_T \quad (39)$$

where $t_{gd,step}$ represents a delay time of a fault free inverter with respect to a step input at transition time 0, and $V_{TH}$ a threshold voltage for p-MOS or n-MOS, it being understood that $V_{TH} = V_{THN}$ for a rising transition of an input, and $V_{TH} = V_{THP}$ for a falling transition of an input. Accordingly, since a gate delay time $t_{gd}$ of a logic gate having an open fault which can be modeled by a resistance $R_{open}$ on an input signal line is given by the equation (37), it can be determined by substitution of the equation (37) into the equation (39), as indicated below.

$$t_{gd} = t_{gd,step} + \frac{t_T}{6}\left(1 - 2\frac{V_{TH}}{V_{DD}}\right) \quad (40)$$

$$= t_{gd,step} + \frac{t_{T,typ} + 2.2 R_{open} C_{in}}{6}\left(1 - 2\frac{V_{TH}}{V_{DD}}\right)$$

$$= t_{gd,step} + \frac{t_{T,typ}}{6}\left(1 - 2\frac{V_{TH}}{V_{DD}}\right) + \frac{2.2 C_{in}}{6}\left(1 - 2\frac{V_{TH}}{V_{DD}}\right) R_{open}$$

$$= t_{gd,typ} + \frac{2.2 C_{in}}{6}\left(1 - 2\frac{V_{TH}}{V_{DD}}\right) R_{open} \propto R_{open}$$

where $t_{gd,typ}$ is a typical value of the gate delay time of a fault-free logic gate. Specifically, the gate delay time $t_{gd}$ of a logic gate having an open fault varies depending on the resistance $R_{open}$ of the fault, and the increment δ of the gate delay time is proportional to the resistance $R_{open}$ of the fault. Consequently, when there is a braking fault on the input of any logic gate on the path under test, the path delay time $t_{pd}$ of the path under test is also proportional to $R_{open}$. This is indicated by an equation (41) given below which is obtained by the substitution of the equation (40) into the equation (17).

$$t_{pd} = \sum_{i=1}^{m} t_{gdi} \qquad (41)$$

$$= \sum_{i=1}^{m} t_{gdi,typ} + \frac{2.2C_{ink}}{6}\left(1 - 2\frac{V_{TH}}{V_{DD}}\right)R_{open}$$

$$= t_{pd,typ} + \frac{2.2C_{ink}}{6}\left(1 - 2\frac{V_{TH}}{V_{DD}}\right)R_{open} \propto R_{open}$$

This agrees with the result of simulation conducted on a change of $t_{pd}$ with respect to $R_{open}$ as indicated in FIG. 18, which is a plot of a change of $t_{pd}$ with respect to the resistance $R_{open}$ of an open fault when there is an open fault in the input signal line IN2 of an inverter $G_2$ in the circuit shown in FIG. 9a.

When an open fault exist on the input of a logic gate $G_k$ on the path P, the integral $Q_{Sk}$ of the short-circuit current of the gate $G_k$ is determined from the equations (8) and (37) as given below.

$$Q_{Sk} = \frac{I_{Smax}(V_{DD} - V_{THN} - V_{THP})}{2V_{DD}} t_{Tk}$$

$$= \frac{I_{Smax}(V_{DD} - V_{THN} - V_{THP})}{2V_{DD}}(t_{Tk,typ} + 2.2R_{open}C_{ink})$$

$$= \frac{I_{Smax}(V_{DD} - V_{THN} - V_{THP})}{2V_{DD}} \cdot t_{Tk,typ} +$$

$$\frac{I_{Smax}(V_{DD} - V_{THN} - V_{THP})}{2V_{DD}} \cdot 2.2R_{open}C_{ink}$$

$$= Q_{Sk,typ} + \frac{2.2I_{Smax}(V_{DD} - V_{THN} - V_{THP})C_{ink}}{2V_{DD}} \cdot R_{open}$$

Accordingly, the integral $Q_{DDT}$ of the transient power supply current of the integrated circuit is determined according to the equation (36) as given below.

$$Q_{DDT} = \sum_{n=1}^{N} Q_{Gn} \qquad (42)$$

$$= \sum_{n=1}^{N} Q_{Sn} + \sum_{n=1}^{N} Q_{Cn}$$

$$= \sum_{n=k}^{N} Q_{Sn,typ} + Q_{Sk,typ} +$$

$$\frac{2.2I_{Smax}(V_{DD} - V_{THN} - V_{THP})C_{ink}}{2V_{DD}} \cdot R_{open} + \sum_{n=k}^{N} Q_{Cn}$$

$$= \sum_{n=1}^{N} Q_{Sn,typ} + \sum_{n=1}^{N} Q_{Cn} +$$

$$\frac{2.2I_{Smax}(V_{DD} - V_{THN} - V_{THP})C_{ink}}{2V_{DD}} \cdot R_{open}$$

$$= Q_{DDT,typ} + \frac{2.2I_{Smax}(V_{DD} - V_{THN} - V_{THP})C_{ink}}{2V_{DD}} \cdot R_{open}$$

Thus, the integral $Q_{DDT}$ of the transient power supply current of the integrated circuit is also proportional to the resistance $R_{open}$ of the open fault.

Thus, it will be seen from the equations (41) and (42) that the delay time $t_{pd}$ of the path P having an open fault changes linearly with respect to the integral $Q_{DDT}$ of the transient power supply current of the CMOS integrated circuit, and this agrees with the result of a simulation conducted on the change of $t_{pd}$ with respect to $Q_{DDT}$ as indicated in FIG. 19, which is a plot of a change $t_{pd}$ with respect to the integral $Q_{DDT}$ of the transient power supply current when an open fault is present on the input signal line IN2 of an inverter $G_2$ in the circuit shown in FIG. 9a.

The substitution of $R_{open}$ which is determined from the equation (42) into the equation (41) yields an equation (43).

$$t_{pd} = t_{pd,typ} + \frac{2.2C_{ink}}{6}\left(1 - 2\frac{V_{TH}}{V_{DD}}\right)R_{open} \qquad (43)$$

$$= t_{pd,typ} + \frac{2.2C_{ink}}{6}\left(1 - 2\frac{V_{TH}}{V_{DD}}\right) \cdot$$

$$\frac{(Q_{DDT} - Q_{DDT,typ}) \cdot 2V_{DD}}{2.2I_{Smax}(V_{DD} - V_{THN} - V_{THP})C_{ink}}$$

$$= t_{pd,typ} + \frac{V_{DD} - 2V_{TH}}{3I_{Smax}(V_{DD} - V_{THN} - V_{THP})}(Q_{DDT} - Q_{DDT,typ})$$

Denoting the integral of the transient power supply current when the path delay time $t_{pd}$ is equal to the upper limit T' of the permissible delay time by $Q_{max}$, an equation (44), given below, is obtained by solving the equation (43) for $Q_{max}$ by putting $t_{pd}$=T' and $Q_{DDT}$=$Q_{max}$.

$$Q_{max} = Q_{DDT,typ} + \frac{3I_{Smax}(V_{DD} - V_{THN} - V_{THP})}{V_{DD} - 2V_{TH}}(T' - t_{pd,typ}) \qquad (44)$$

The $Q_{max}$ represents the upper limit of the integral $Q_{DDT}$ of the transient power supply current of the CMOS integrated circuit which is free from a delay fault. Thus it can be determined that there is no path delay fault in the CMOS integrated circuit when $Q_{DDT}$ is less than $Q_{max}$ while there exists a path delay fault due to a break fault in the CMOS integrated circuit when $Q_{DDT}$ is greater than $Q_{max}$.

$Q_{DDT} \leq Q_{max}$ no delay fault $Q_{DDT} > Q_{max}$ delay fault present (45)

As discussed above, by comparing the integral $Q_{DDT}$ of the transient power supply current against the given value $Q_{max}$, a delay fault in the circuit can be tested. The given value $Q_{max}$ can be determined by a circuit simulation or from the equation (45) using statistical data.

Features of a Delay Fault Test by Way of the Transient Power Supply Current

The transient power supply current is a transient current which flows through a power supply pin of an integrated circuit, and a higher observability is assured for this transient current than for a voltage signal. Accordingly, a delay fault testing method which employs the transient power supply current is capable of assuring a high observability of a delay fault than with a delay fault testing technique which employs a voltage signal. By way of example, a delay fault testing technique which employs a voltage signal can not detect a delay fault unless the voltage signal is transmitted to an output signal line of an integrated circuit. By contrast, with a delay fault testing technique which employs a transient power supply current signal, a transient power supply current signal having a pulse width which corresponds to a delay time on a path on which the voltage signal is transmitted is observable if the voltage signal is not transmitted to an output signal line of the integrated circuit, and thus is capable of detecting a delay fault. Concomitantly, there is no need to transmit a voltage signal to an output signal line of an integrated circuit with the delay fault testing technique which employs the transient power supply current signal and accordingly, limitations imposed upon generating test patterns are reduced with this technique in comparison to the generation of test patterns for a conventional delay fault testing technique which employs a voltage signal where it is necessary to transmit the voltage signal to the output signal line of the integrated circuit. This allows the generation of test patterns to be facilitated. In extreme cases, if test pattern sequence are selected at random, the delay fault testing technique which employs the transient power supply current signal is capable of detecting a delay fault on a path which is activated by selected test pattern sequence.

Test Pattern Generating Technique (for Gate Delay Fault)

A test pattern generating method according to a first aspect of the present invention with respect to a single delay fault will be described. FIG. 20 shows an example of a CMOS integrated circuit under test. The integrated circuit under test remains the same as the circuit shown in FIG. 1, and includes five input terminals $x_1$, $x_2$, $x_3$, $x_4$, $x_5$, a single output terminal $z_1$, five internal signal nodes $n_1$, $n_2$, $n_3$, $n_4$, $n_5$, and six logic gates $G_1$, $G_2$, $G_3$, $G_4$, $G_5$, $G_6$. Nodes $n_1$ and $n_2$ represent junctions between the gates $G_1$ and $G_2$ with the gate $G_3$, $n_3$ represents a junction between the gate $G_3$ and the gates $G_4$ and $G_5$, and $n_4$ and $n_5$ represent junctions of the gates $G_4$ and $G_5$ with the gate $G_6$. While not shown, the power supply terminals for the gates $G_1$ to $G_6$ are connected to a common power supply. Generation of test patterns for a slow-to-rise gate delay fault in which a rising transition of the logic gate $G_3$ is retarded will be considered.

Initially, a test pattern v1="xx0xx" which applies an initial value of "0" for the slow-to-rise fault to the output of the faulty gate $G_3$ will be determined by the implication operation, as shown in FIG. 20a. The implication operation is a procedure which is based on logic values on signal lines within the integrated circuit to determine logic values which are uniquely selected for the input and output signal lines of logic gates which are connected to the signal lines in a sequential manner, and takes place for both the input side (rearward operation) and the output side (forward operation) of the circuit. It is to be understood that signals "0", "1" and "x" represent a low level signal, a high level signal and a don't care signal which may be either a low level or high level signal. For example, when a signal value "0" is to be set up at the output of NAND gate $G_3$, it is necessary that every input signal value to the gate $G_3$ be "1". Thus, as a result of the implication operation, the output signal values from the logic gates $G_1$ and $G_2$ can be determined to be "1". Similarly, in order for the output signal values from NAND gates $G_1$ and $G_2$ to be "1", either one of the two inputs to each of NAND gates $G_1$ and $G_2$ may be chosen to be "0". Thus, a signal value for the input terminal $x_3$ can be determined by the implication operation to be "0". At this time, the remaining input terminals may have either value of "0" or "1". In this manner, the implication operation allows a test pattern v1 which applies an initial value of "0" to the output of the faulty gate $G_3$ to be determined as "xx0xx". The implication operation is described, for example, in chapter 8 of "design and test of a computer" by Hideo Fujiwara, Kougaku Tosho K.K., 1990.

Suppose now a stuck-at fault which causes the output from the faulty gate $G_3$ to be fixed to the initial value of "0" which is set up, and a test pattern v2="0x11x" which causes the stuck-at fault to propagate to the output of the logic gate $G_4$ is determined by the implication operation (FIG. 20b). Accordingly, a test pattern sequence which detects the slow-to-rise fault at the gate $G_3$ by the transient power supply current testing technique is determined to be as T=<v1, v2>=<"xx0xx", "0x11x">.

Alternatively, a test pattern sequence T'="S0 S0 U1 S1 XX" may be determined by the implication operation (FIG. 20c) which applies a signal "U1" corresponding to the slow-to-rise fault at the output of the faulty gate $G_3$ and which causes the influence of the slow-to-rise fault to propagate to the output of the logic gate $G_4$. It is to be noted that the signals "S0", "S1", "U0", "U1" and "XX" are signal values according to the five value logic system which has been developed by C. J. Lin et al. As indicated in FIG. 2, they represent a normally low level signal <"0", "0">, a normally high level signal <"1", "1">, a signal having a final low level <"x", "0">, a signal having a final high level <"x", "1">, and a don't care signal <"x", "x">, respectively. The implication operation according to the five value logic system is a procedure which is based on a signal value on a signal line within the integrated circuit to set up signal values which are uniquely selected for the input and output signal lines of logic gates which are connected to the signal line in a sequential manner.

For example, to set up a signal value "U1" at the output of NAND gate $G_3$, it is necessary that one of input signal values to the gate $G_3$ be "U0" while the other input signal value be "S1". It is assumed here that the output signal value of the logic gate $G_1$ is "S1" and the output signal value of the gate $G_2$ is "U1". In order for the output signal value from NAND gate $G_1$ to be "1", either input to the gate $G_1$ may be set up as "S0". It is assumed that the signal "S0" is applied to the input terminal $x_2$. On the other hand, in order to set up the output signal value of NAND gate $G_2$ to be "U0", one input to the gate $G_2$ may be chosen to be "U0" while the other input may be chosen to be "S1". Thus, the signal value on the input terminal $x_3$ is chosen to be "U0" while the signal value on the input terminal $x_4$ is chosen to be "S1". Similarly, in order to cause the influence "U1" of the faulty gate $G_3$ to be propagated to the output of NOR gate $G_4$, the other input or the input signal line for the gate $G_4$ may be chosen to be "S0". Accordingly, a test pattern sequence T' which applies a signal "U1" corresponding to the slow-to-rise fault to the output of the faulty gate $G_3$ and which causes the influence of the slow-to-rise fault to propagate to the output of the logic gate $G_4$ is determined by the implication operation to be determined as "S0 S0 U1 S1 XX". As described earlier in the paragraphs of Background of the invention, the five value logic system is described in the literature 1. Consequently, the test pattern sequence which detects the slow-to-rise fault at the gate $G_3$ by the transient power supply current testing technique is determined to be as T'="S0 S0 U1 S1 XX"=<v1, v2>=<"0001x", "0011x">.

When the logic gate $G_3$ has a gate delay fault, the output transition time of the logic gate $G_3$ will be retarded. When the influence of the fault is caused to be propagated to the next logic gate $G_4$ (or to the output thereof) by the test pattern sequence T or T', the transient power supply current waveform of the logic gate $G_4$ becomes different from a normal condition, thus indicating an abnormality in the transient power supply current of the integrated circuit under test. Accordingly, by applying the test pattern sequence T or T' and observing whether or not any abnormality occurs in the transient power supply current of the integrated circuit under test, it is possible to determine whether or not there exists a slow-to-rise fault in the logic gate $G_3$.

It will be seen from the foregoing that a test pattern sequence which examines a gate delay fault in the integrated circuit under test can be generated. In addition, the method of generating test patterns according to the present invention is not limited to generating test patterns in unit of a gate delay fault, but a test pattern sequence can also be generated in unit of an open fault by assuming the presence of an open fault on a signal line within the integrated circuit.

Test Pattern Generating Method (for Open Faults)

A method of generating test patterns according to the first aspect of the present invention with respect to a single open fault will now be described. FIG. 21 shows an example of a CMOS integrated circuit under test. This integrated circuit under test remains the same as the circuit shown in FIG. 20, and there are nine internal signal lines including signal lines $m_1$ and $m_2$ between the input terminal $x_3$ and the gates $G_1$ and $G_2$, signal lines $m_3$ and $m_4$ between the gates $G_1$ and $G_2$ on one hand and a gate $G_3$, a signal line $m_5$ on the output side of the gate $G_3$, signal lines $m_6$ and $m_7$ between the signal line $m_5$ and the gates $G_4$ and $G_5$ and signal lines $m_8$ and $m_9$ between the gates $G_4$ and $G_5$ on one hand and the gate $G_6$. It will be considered to generate test patterns for an open fault (indicated by x mark) in the signal line $m_6$. Initially, a test pattern $v1$="xx0xx" which applies an initial value of "0" of the slow-to-rise fault to the faulty signal line $m_6$ is determined by the implication operation to establish signal conditions as indicated in FIG. 21a. A stuck-at fault which fixes the logic value of the faulty signal line $m_6$ to the established initial value of "0" is then assumed, and test pattern $v2$="0x11x" which causes the stuck-at fault to be propagated to the output of the logic gate $G_4$ is determined by the implication operation, thus establishing signal conditions as illustrated in FIG. 21a. In this manner, a test pattern sequence which detects the open fault on the signal line $m_6$ according to the transient power supply current testing technique can be determined as T=<v1, v2>=<"xx0xx", "0x11x">.

Alternatively, a test pattern sequence T'="S0 S0 U1 S1 XX" may be determined by the implication operation which applies a signal "U1" corresponding to the slow-to-rise fault to the faulty signal line $m_6$ and which causes the influence of the slow-to-rise fault to be propagated to the output of the logic gate $G_4$ (FIG. 21c). In this manner, a test pattern sequence which detects the open fault on the signal line $m_6$ according to the transient power supply current testing technique is determined to be as T'="S0 S0 U1 S1 XX"=<v1, v2>=<"0001x", "0011x">.

When the signal line $m_6$ has an open fault, the input transition time of the logic gate $G_4$ increases. When the influence of this fault is propagated to the logic gate $G_4$ (or to its output) by either test pattern sequence T or T', the transient power supply current waveform of the logic gate $G_4$ becomes different from a normal condition, and accordingly, the transient power supply current of the integrated circuit under test exhibits an abnormality. In this manner, by applying the test pattern sequence T or T' and seeing if there occurs an abnormality in the transient power supply current of the integrated circuit under test, it is possible to determine whether or not an open fault exists on the signal line $m_6$.

It will be seen from the foregoing that a test pattern sequence which can be used with an open fault within the integrated circuit under test can be generated. The method of generating test patterns according to the present invention is not limited to generating test patterns in unit of open faults on signal lines which connect between logic gates, but test patterns can also be generated which are effective to detect open faults within the logic gate by assuming the presence of an open fault on a signal line which is disposed within the logic gate.

In addition, the method of generating test patterns according to the present invention is not limited in its application to combinatorial logic circuits which do not include flip-flops, but is equally applicable to sequential circuits including storage elements such as flipflops.

In addition, the method of generating test patterns according to the present invention is not limited in its application to a CMOS integrated circuit, but is equally applicable to semiconductor integrated circuits of other types.

$I_{DDT}$ Fault Simulation Technique (for Gate Delay Fault)

A transient power supply current fault simulation (hereafter referred to as $I_{DDT}$ fault simulation) technique which prepares a detectable fault list in unit of gate delay faults will now be described.

FIG. 22 shows an example of CMOS integrated circuit under test. The integrated circuit under test includes three input terminals $x_1$, $x_2$, $x_3$, two output terminals $z_1$, $z_2$, five logic gates $G_1$, $G_2$, $G_3$, $G_4$, $G_5$, five internal signal nodes $n_1$, $n_2$, $n_3$, $n_4$, $n_5$ and two output buffers $G_6$, $G_7$. Specifically, the input terminal $x_1$ is connected to the input of an inverter logic gate $G_1$; the input terminals $x_2$, $x_3$ are connected to the inputs of NAND logic gate $G_2$; the outputs from the logic gates $G_1$ and $G_2$ are connected to NAND logic gate $G_3$ through the nodes $n_1$, $n_2$; the output of the logic gate $G_3$ is connected through the node $n_3$ to the input of the inverter logic gate $G_4$ and to one input of NOR logic gate $G_5$; the input terminal $x_3$ is connected to the other input of the logic gate $G_5$; the output of the logic gate $G_4$ is connected through the node $n_4$ and the buffer $G_6$ to the output terminal $z_1$; and the output of the logic gate $G_5$ is connected through the node $n^5$ and the buffer $G_7$ to the output terminal $z_2$. While not shown, the logic gates $G_1$ to $G_5$ and the output buffers $G_6$, $G_7$ have their power supply terminals connected to a common power supply.

An example of results of the $I_{DDT}$ fault simulation which is performed on the CMOS integrated circuit under test is illustrated in FIG. 23. In FIG. 23, the first column, as counted from the left, represents an identifier of a test pattern sequence. A second column indicates input signals applied to the input terminals $x_1$, $x_2$, $x_3$ of the CMOS integrated circuit under test, and the third column shows signals appearing at the internal signal nodes $n_1$, $n_2$, $n_3$, $n_4$, $n_5$ of the CMOS integrated circuit under test when each test pattern sequence is applied. A fourth column indicates signals appearing at the output terminals $z_1$, $z_2$ of the CMOS integrated circuit under test when each test pattern sequence is applied. Signals "L", "H", "R", and "F" entered in the second, the third and the fourth column in FIG. 23 represent a normally low level signal <"0", "0"> (it being understood that a first element within <> represents an initial signal value and a second element represents a final signal value), a normally high level signal <"1", "1">, a signal which rises from a low level to a high level <"0", "1"> and a signal which falls from a high level to a low level <"1", "0">, respectively.

Thus each test pattern sequence comprises two test patterns. For example, a test pattern sequence T1="LLR" signifies that $x_1$, $x_2$, $x_3$=<"000", "001">. A fifth column in FIG. 23 shows a set of gate delay faults which can be detected by the transient power supply current testing technique when each test pattern sequence is applied to the CMOS integrated circuit under test (or a detectable fault list). It is to be noted that $G_5F$ represents a falling transition delay fault of the gate $G_5$ and $G_3R$ represents a rising transition fault of the gate $G_3$. When a logic gate has a gate delay fault, the output transition time of the logic gate will be retarded. Concomitantly, a logic gate which receives at its input the output from the faulty logic gate will have its timing of the peak of the transient current retarded, and the transient power supply current of the integrated circuit under test exhibits an abnormality. Accordingly, by applying a test pattern sequence and observing whether or not there occurs an abnormality in the transient power supply current, it is possible to determine, when the input test pattern sequence causes a switching operation (either a rising transition or a falling transition) of logic gates, which in turn causes a switching operation of a logic gate or gates which have at its input the output signal lines from the first mentioned logic gates, whether or not these logic gates are faulty.

By way of example, when the test pattern sequence T2 is applied to the CMOS integrated circuit under test shown in FIG. 22, a switching operation occurs in the logic gates $G_2$, $G_3$, $G_4$, $G_5$ and the output buffers $G_6$ and $G_7$ which are contained in the CMOS integrated circuit under test, producing a falling transition on the signal lines $n_2$, $n_4$, $n_5$ and the output terminals $z_1$, $z_2$ while producing a rising transition on the signal line $n_3$. Accordingly, if there exists a slow-to-fall fault in one of the logic gates $G_2$, $G_4$, and $G_5$ or if a slow-to-rise fault exists in the logic gate $G_3$, an abnormality in the transient power supply current is observed during the transient power supply current testing which uses the test pattern sequence T2. In this manner, the transient power supply current testing using the test pattern sequence T2 allows a slow-to-fall fault in the logic gates $G_2$, $G_4$, and $G_5$ and a slow-to-rise fault in the logic gate $G_3$ to be detected. Accordingly, a detectable fault list which are provided by the test pattern sequence T2 can be determined to be as $\{G_2F, G_3R, G_4F, G_5F\}$ by the described $I_{DDT}$ fault simulation. It is to be understood that "F" and "R" represent a slow-to-fall fault and a slow-to-rise fault, respectively.

In this manner, a detectable fault list can be prepared in unit of gate delay faults which can be detected with a given test pattern sequence.

$I_{DDT}$ Fault Simulation Technique (for Open Faults)

$I_{DDT}$ fault simulation technique which prepares a fault list in unit of open faults will now be described. FIG. 24 shows an example of CMOS integrated circuit under test. This is the same as shown in FIG. 22, but signal lines connecting between input terminals $x_1$, $x_2$, $x_3$ and logic gates as well as signal lines connecting between the logic gates are identified by signal lines $m_1$, $m_2$, ..., $m_{12}$. It is to be understood that the signal lines also include input and output signal lines, and any branch line is treated as a distinct signal line. It is also assumed that output signal lines $m_{11}$, $m_{12}$ are connected to the output buffers $G_6$, $G_7$, respectively.

An example of results of $I_{DDT}$ fault simulation which is performed upon the CMOS integrated circuit under test is illustrated in FIG. 25. In FIG. 25, the first column, as counted from the left, represents an identifier of a test pattern sequence; the second column shows input signals applied to the input terminals $x_1$, $x_2$, $x_3$ of the CMOS integrated circuit under test; the third column shows signals appearing on signal lines $m_1$, $m_2$, ..., $m_{12}$ of the CMOS integrated circuit under test when each test pattern sequence is applied; and the fourth column shows signals appearing at the output terminals $z_1$, $z_2$ of the CMOS integrated circuit when each test pattern sequence is applied. The signals "L", "H", "R", "F" remains the same as described above in connection with FIG. 23. For example, the test pattern sequence T1="LLR" signifies that $x_1$ $x_2$ $x_3$=<"000", "001">. The fifth column in FIG. 25 shows a set of signal lines having open faults which can be detected during the transient power supply current testing when each test pattern sequence is applied to the CMOS integrated circuit under test, or a detectable fault list. When a signal line within the integrated circuit has an open fault, the switching operation of a logic gate which is connected to the faulty signal line at its input will be retarded, and concomitantly, the transient power supply current waveform of the logic circuit will change, whereby an abnormality occurs in the transient power supply current of the integrated circuit under test. Accordingly, by applying a test pattern sequence and observing whether or not an abnormality occurs in the transient power supply current, it is possible to determine, when the input test pattern sequence causes a switching operation to occur on a signal line, which in turn causes a switching operation to occur in a logic gate which is connected to the signal line at its input, whether or not the logic circuit is faulty.

For example, when a test pattern sequence T6 is applied to the CMOS integrated circuit under test shown in FIG. 24, a switching operation occurs on the signal lines $m_2$, $m_7$, $m_8$, $m_9$, $m_{10}$, $m_{11}$ within the CMOS integrated circuit under test, and this in turn causes a switching operation to occur in the logic gates $G_2$, $G_3$, $G_4$ and the output buffer $G_6$ within the CMOS integrated circuit under test. Accordingly, if an open fault exists in one of the signal lines $m_2$, $m_7$, $m_8$, $m_9$, $m_{11}$, an abnormality in the transient power supply current is observed during the transient power supply current testing which uses the test pattern sequence T6. In this manner, the transient power supply current testing which uses the test pattern sequence T6 allows an open fault on the signal lines $m_2$, $m_7$, $m_8$, $m_9$, $m_{11}$ to be detected. Consequently, a detectable fault list which are obtained with the test pattern sequence T6 can be defined to be $\{m_2, m_7, m_8, m_9, m_{11}\}$ from $I_{DDT}$ fault simulation. The list of open faults is represented in terms of signal lines on which an open fault is likely to occur.

It will be seen from the foregoing that a detectable fault list can be prepared in unit of open faults which can be detected with a test pattern sequence. $I_{DDT}$ fault simulation technique is not limited in its application to open faults on signal lines which connect between the logic gates, but is also applicable to open faults on signal lines which are disposed within the logic gate, by assuming a fault on a signal line which is disposed within the logic gate.

A Test Pattern Generating Technique Utilizing $I_{DDT}$ Fault Simulation

The test pattern generating method according to the first aspect of the invention will now be described. As indicated by the results of $I_{DDT}$ fault simulation mentioned above, a single test pattern sequence can be utilized to detect a plurality of gate delay faults or open faults. Accordingly, when a test pattern sequence which is generated for the sake of a selected fault has successfully detected a different or non-selected fault, it is unnecessary to generate a test pattern for the non-selected fault. Since $I_{DDT}$ fault simulation can be implemented as a logic simulation which determines a logic signal value on an internal signal line relative to an input signal, a required processing time interval is generally shorter than when generating test patterns in order to calculate the input signal from the internal signal value in a reverse manner. Consequently, when test patterns are generated for a selected fault, a non-selected fault which is detected by $I_{DDT}$ fault simulation can be removed from the fault list to be detected, thus allowing the processing time which is required for generating test patterns to be reduced.

Technique for Preparing a detectable Fault List (for Path Delay Faults)

A technique for preparing a detectable fault list will now be described. FIG. 26 shows an example of a MOS integrated circuit under test. The integrated circuit under test includes four input terminals $x_1$, $x_2$, $x_3$, $x_4$, two output terminals $z_1$, $z_2$, five internal signal nodes $n_1$, $n_2$, $n_3$, $n_4$, $n_5$, five logic gates $G_1$, $G_2$, $G_3$, $G_4$, $G_5$ and output buffers $G_6$, $G_7$. Input terminals $x_1$ and $x_2$ are connected to two inputs of NAND gate $G_1$, the output of which is connected through the signal node n1 to the input of the inverter gate $G_2$ and to one input of OR gate $G_3$. The output from the inverter gate $G_2$ is connected through the node $n_2$ to one input of AND gate $C_4$, and the output from the gate $G_3$ is connected through the node $n_3$ to the other input of AND gate $G_4$ and to one input of AND gate $G_5$. The input terminal $x_3$ is connected to the other input of OR gate $G_3$, and the input terminal $x_4$ is connected to the other input of AND gate $G_5$. Outputs from AND gates $G_4$ and $G_5$ are connected through the nodes $n_4$ and $n_5$, respectively, and further through the output buffers $G_6$, $G_7$ to the output terminals $z_1$ and $z_2$, respectively. The power supply terminals of the gates $G_1$ to $G_7$ are connected to a common power supply, while this is not shown.

Here it is assumed that the gates $G_1$, $G_2$, $G_3$, $G_4$, $G_5$, $G_6$ and $G_7$ have gate delays (propagation delays) equal to 1, 1, 3, 2, 1, 1 and 1, respectively. An example of results of a fault simulation which is performed upon the MOS integrated circuit under test is illustrated in FIG. 27. In FIG. 27, the first column, as counted from the left, represents an identifier of a test pattern sequence; the second column shows input signals applied to the input terminals $x_1$, $x_2$, $x_3$, $x_4$ of the CMOS integrated circuit under test; the third column shows a train of transition signal values which appear on the internal signal nodes $n_1$, $n_2$, $n_3$, $n_4$, $n_5$ of the CMOS integrated circuit under test when each test pattern sequence is applied to the input terminals $x_1$, $x_2$, $x_3$, $x_4$,; and the fourth column shows a train of transition signal values which occur on the output terminals $z_1$, $z_2$ of the CMOS integrated circuit under test which result from the transition signal values on these nodes. It should be understood that signals "L", "H", "R" and "F" represent the same denotations as used in FIGS. 23 and 25. For example, a test pattern sequence T1="FHHL" signifies that $x_1$ $x_2$ $x_3$ $x_4$=<"1110", "0110">. Numerals entered in parentheses below corresponding signal values represent a transition time of each signal as referenced to the transition time of the signal at the input terminal which is chosen to be 0. For example, R(3) indicates the occurrence of a rising transition signal ("R") at time 3.

The fifth column in FIG. 27 shows a set of delay fault paths which can be detected during the transient power supply current testing or a detectable fault list when each test pattern sequence is applied to the integrated circuit under test. When the integrated circuit under test has a path delay fault, an output transition time from the faulty path is retarded. Concomitantly, a change in the output transition time of every or any one of logic gates located on the faulty path causes the timing of a peak in the transient current of a next stage logic gate which receives the output from such logic gate at its input to be retarded, whereby the transient power supply current of the integrated circuit under test exhibits an abnormality. Accordingly, by applying a test pattern sequence to the integrated circuit under test and observing whether or not an abnormality occurs in the transient power supply current of the integrated circuit under test, it is possible to determine whether or not a path delay fault has occurred on any signal propagation path on which every logic gate on this path undergoes a switching operation (either rising or falling transition) in response to the input test pattern sequence.

By way of example, when the test pattern sequence T1 is applied to the CMOS integrated circuit under test, there occurs a transition signal F(1) at the output node $n_1$ of the logic gate $G_1$ disposed within the CMOS integrated circuit under test, as shown in FIG. 28*a*. Similarly, signals R(2), R(4) and R(5) occur at the outputs of the logic gates $G_2$, $G_4$ and the output buffer $G_6$, respectively. In this manner, because every logic gate located on a signal propagation path $\{x_1, n_1, n_2, n_4, z_1\}$ is subject to a switching operation, it follows that whenever there is a path delay fault on the signal propagation path $\{x_1, n_1, n_2, n_4, z_1\}$, an abnormality in the transient power supply current is observed during the transient power supply current testing which uses the test pattern sequence T1. In other words, the transient power supply current testing which uses the test pattern sequence Ti allows a path delay fault or faults on the signal propagation path $\{x_1, n_1, n_2, n_4, z_1\}$ to be detected. In this manner, a detectable fault list which can be obtained with the test pattern sequence T1 can be determined by the described fault simulation to be as $\{\{x_1, n_1, n_2, n_4, z_1\}\}$.

In another example, when a test patterns series T2 is applied to the CMOS integrated circuit under test, a transition signal F(1) occurs at the output node $n_1$ of the logic gate $G_1$ within the CMOS integrated circuit under test, and similarly, signals R(2), F(4), R(4)–F(6), R(5)–F(7) occur at the outputs of the logic gates $G_2$, $G_3$, $G_4$ and the output buffer $G_6$, as shown in FIG. 28*b*. Since every logic gate located on signal propagation paths $\{x_1, n_1, n_2, n_4, z_1\}$ and $\{x_1, n_1, n_3, n_4, z_1\}$ is subject to a switching operation, if there is a path delay fault on either signal propagation path $\{x_1, n_1, n_2, n_4, z_1\}$ or $\{x_1, n_1, n_3, n_4, z_1\}$, an abnormality in the transient power supply current is observed during the transient power supply current testing which uses the test pattern sequence T2. If a path delay time on the signal propagation path $\{x_1, n_1, n_2, n_4, z_1\}$ increases, the rising transition R(5) at the output signal line $z_1$ will be retarded, causing a likelihood that a signal transition may not occur at $z_1$. This prevents the path delay time on the signal propagation path $\{x_1, n_1, n_2, n_4, z_1\}$ from being determined by the transient power supply current testing, resulting in a failure to detect a path delay fault on the signal propagation path $\{x_1, n_1, n_2, n_4, z_1\}$. Thus, a path delay fault or faults which can be detected by the transient power supply current testing which uses the test pattern sequence T2 are only those path delay faults which occur on the signal propagation path $\{x_1, n_1, n_3, n_4, z_1\}$. Consequently, a detectable fault list which can be determined with the test pattern sequence T2 is determined from the described fault simulation to be $\{\{x_1, n_1, n_3, n_4, z_1\}\}$.

It will be understood from the foregoing that a detectable fault list can be prepared for those path delay faults which can be detected with a given test pattern sequence. A signal propagation path which contains a path delay fault that is registered with the detectable fault list is not limited to a path which extends from the input terminal to the output terminal of the circuit under test, but may also include a signal propagation path such as $\{x_1, n_1\}$ or $\{x_1, n_1, n_3\}$ of the semiconductor integrated circuit shown in FIG. 16 which does not reach the output terminal.

The preparation of the detectable fault list is not limited to a CMOS integrated circuit, but is equally applicable to other types of semiconductor integrated circuits.

Test Pattern Generating Method

A test pattern generating method according to the second aspect of the present invention will now be described. As shown in the results of the technique of preparing a detectable fault list according to the transition simulation illustrated in FIG. 27, a plurality of path delay faults can be detected with a single test pattern sequence T3. Accordingly, when a test pattern sequence which is generated for a particular fault (or selected fault) can detect other faults (non-selected faults), there is no need to generate test patterns which would be required otherwise for these different faults (non-selected faults). Since the transition simulation can be implemented by a logic simulation which determines a logic signal value on an internal signal line with respect to an input signal, the simulation has a fast processing time generally as compared with the generation of test patterns where the input signal is calculated from the internal signal value by a reverse process. Accordingly, the processing time that would be required for generating test patterns can be reduced. In addition, the transient power supply current testing technique on which the second aspect of the present invention is based allows a path delay fault to be efficiently tested if there is a hazard on a signal line or side inputs of the path under test. For example, when a hazard occurs on the output of the path under test $\{x_1, n_1, n_3, n_4, z_1\}$ as shown in FIG. 28b, the transient power supply current testing technique allows a path delay fault on the path under test to be detected with the test pattern T2. This indicates the possibility that the number of path delay faults which can be detected with a single test pattern sequence can be increased, with consequence that the total number of test pattern sequence which are required to test the path delay faults of the semiconductor integrated circuit under test can be reduced.

The test pattern generating method according to the second aspect of the present invention is not limited to CMOS integrated circuits, but is equally applicable to other types of semiconductor integrated circuits.

BRIEF DESCRIPTION OF THE DRAWINGS

FIG. 1b shows patterns, entered at several points in the circuit, which are used to detect a stuck-at fault which is assumed in the circuit shown in FIG. 1a;

FIG. 2 is a diagram indicating signal values in the five value logic system which is used in the conventional test pattern generating technique;

FIGS. 3a1, 3b1 and 3c1 are logic circuit diagrams and FIGS. 3a2, 3b2 and 3c2 are charts indicating the implication tables which are used according to the conventional test pattern generating method with respect to the logic circuits shown in FIGS. 3ba, 3b1 and 3c1, respectively;

FIGS. 4a and 4b are diagrams indicating values of the five value logic system which are applied to one input of AND circuit to activate the circuit, and FIG. 4c is a chart representing a sensitizing table used according to the conventional test pattern generating method;

FIG. 10a is a schematic view of a model of a perfectly open fault, FIG. 10b is an illustration of an exemplary input and output at the location of the fault, FIG. 10c shows a model of a delay open fault, and FIG. 10d illustrates an exemplary input and output with respect to the location of the fault;

FIGS. 20a, 20b and 20c are schematic views showing an exemplary CMOS integrated circuit under test and examples of signals appearing when there is a gate delay fault, illustrating one form of a test pattern generating method according to the first aspect of the present invention;

FIGS. 21a, 21b and 21c are similar views to FIGS. 20a, 20b and 20c, illustrating another form of the test pattern generating method according to the first aspect of the present invention;

FIG. 23 is a chart showing results of $I_{DDT}$ fault simulation used in the test pattern generating method according to the first aspect of the present invention;

FIG. 25 is a chart showing results of $I_{DDT}$ fault simulation applied to the circuit shown in FIG. 24;

FIG. 27 is a chart showing results of the fault simulation applied to the circuit shown in FIG. 26;

DESCRIPTION OF EMBODIMENTS

Several embodiments of the present invention will now be described.

Figure 29:
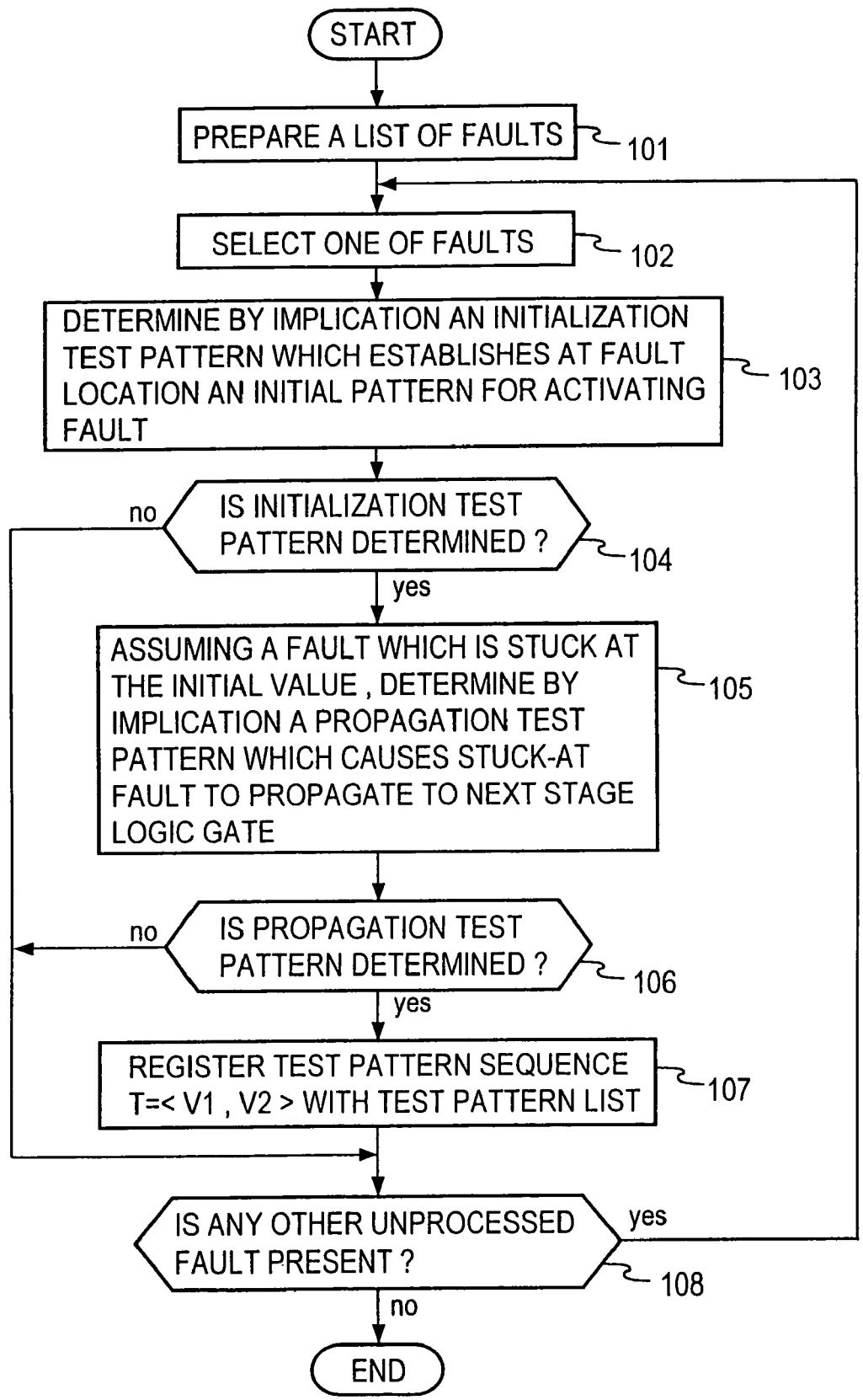
FIG. 29 is a flow chart of an exemplary processing procedure for the test pattern generating method according to the first aspect of the present invention.

FIG. 29 shows a processing procedure for a test pattern generating method according to an embodiment of the first aspect of the present invention. Initially, at step 101, a fault list in which all faults of a semiconductor integrated circuit under test are registered is prepared. The preparation of the fault list may take place by manually enumerating slow-to-fall faults (GF) and slow-to-rise (GR) for all logic gates, for example, in the semiconductor integrated circuit under test in a sequential manner, or by automatically deriving each logic gate (each internal signal line) by an electronic computer on the basis of circuit information. At next step 102, one of the faults in the list is selected for which test patterns are to be generated. At step 103, an attempt is made to determine, by the implication operation, an initialization test pattern v1 which applies an initial value to a fault location corresponding to the selected fault in order to activate the fault. At step 104, a confirmation is made to see whether or not the implication operation which attempted to generate the initialization test pattern v1 has successfully generated an initialization test pattern without causing any conflict with logic signals on input signal lines and internal signal lines of the semiconductor integrated circuit under test. If the initialization test pattern could have been generated without introducing a conflict, the operation proceeds to step 105, while if the initialization test pattern could not have been generated without producing a conflict, the operation transfers to step 108.

Thus, when the generation of the initialization test pattern v1 is attempted at step 103 by the implication operation, and has successfully generated it, the initialization test pattern is generated without causing any conflict at step 104.

At step 105, it is assumed that the fault location has a stuck-at fault which causes the output to be stuck at the initial value, and an attempt is made to determine, by the implication operation, a propagation test pattern v2 which causes the stuck-at fault to propagate to the output of a following logic gate which input is connected to the fault location. At step 106, a confirmation is made to see whether or not the implication operation which tried to generate the propagation test pattern v2 has successfully produced a propagation test pattern without introducing any conflict with logic signals on input signal lines and internal signal lines of the semiconductor integrated circuit under test. If the propagation test pattern has been successfully produced, the operation proceeds to step 107, while if the attempt failed to produce the propagation test pattern, the operation transfers to step 108.

At step 107, a test pattern sequence T=<v1, v2> is assembled from the initialization test pattern v1 and propagation test pattern v2 which are determined at steps 103 and 105, and the test pattern sequence T is registered with a test pattern list. Finally, at step 108, a confirmation is made to see whether or not there remains any fault which is not yet processed in the fault list. If there is an unprocessed fault, the steps 102, 103, 104, 105, 106, 107 and 108 are repeated. However, if there remains no unprocessed fault, the operation is completed. The test pattern generating method mentioned above may choose a gate delay fault or an open fault for the selected fault for which test patterns are to be generated.

Figure 30:
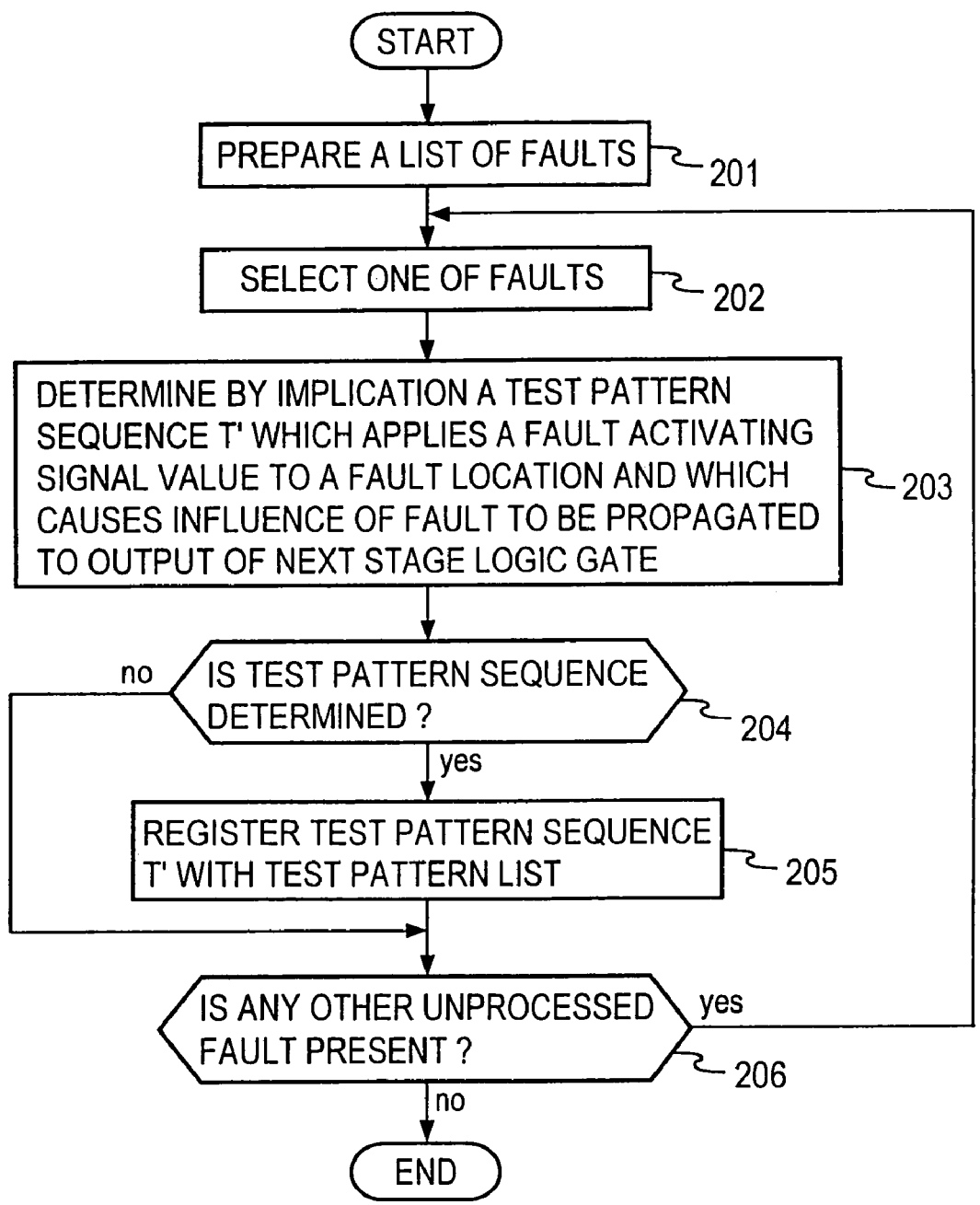
FIG. 30 is a flow chart of another processing procedure for the test pattern generating method according to the first aspect of the present invention.

FIG. 30 shows a processing procedure according to another embodiment for the test pattern generating method according to the first aspect of the present invention. Initially, at step 201, a fault list which registers every fault in a semiconductor integrated circuit under test is prepared. At next step 202, one of the faults for which test patterns are to be generated is selected from the list. At step 203, an attempt is made to determine, by the implication operation, a test pattern sequence T' which applies a signal value according to the five value logic system to a fault location corresponding to the selected fault to activate the fault and which causes the signal value to propagate to the output of a following logic gate which input is connected at its input to the fault location. At step 204, a confirmation is made to see whether or not the implication operation has successfully generated a test pattern sequence T' without introducing a conflict with logic values on input signal lines and internal signal lines of the semiconductor integrated circuit under test. If the test pattern sequence T' has been successfully generated, the operation proceeds to step 205, while if the implication operation has failed to generate the test pattern sequence T', the operation transfers to step 206. At step 205, the test pattern sequence T' which is determined at step 203 is registered with a test pattern list. Finally, at step 206, a confirmation is made to see whether or not there is any other fault in the list which is not yet processed. When there remains an unprocessed fault, the steps 202, 203, 204, 205 and 206 are repeated. If there remains no unprocessed fault, the operation is completed. The test pattern generating method mentioned above may choose a gate delay fault or an open fault for the selected fault for which test patterns are to be generated.

Figure 31:
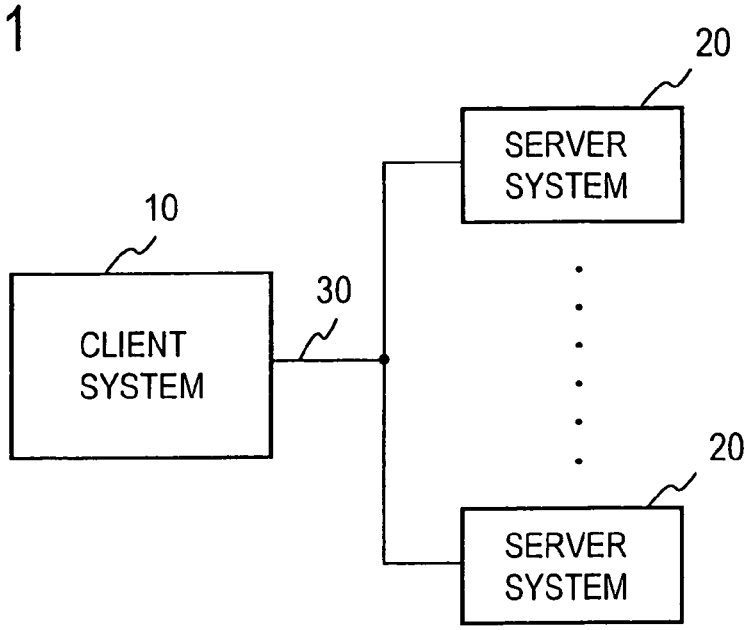
FIG. 31 is a schematic illustration of an apparatus according to the present invention which comprises a client system and a plurality of server systems.

A method of generating test patterns by a cooperation between a client system and server systems will now be described. A client system 10 and a plurality of server systems 20 are connected together through a communication channel 30 as shown in FIG. 31. This arrangement can be constructed as a so-called LAN (local area network). In the description to follow, the client system will be simply referred to as a client and the server system as a server.

Figure 32:
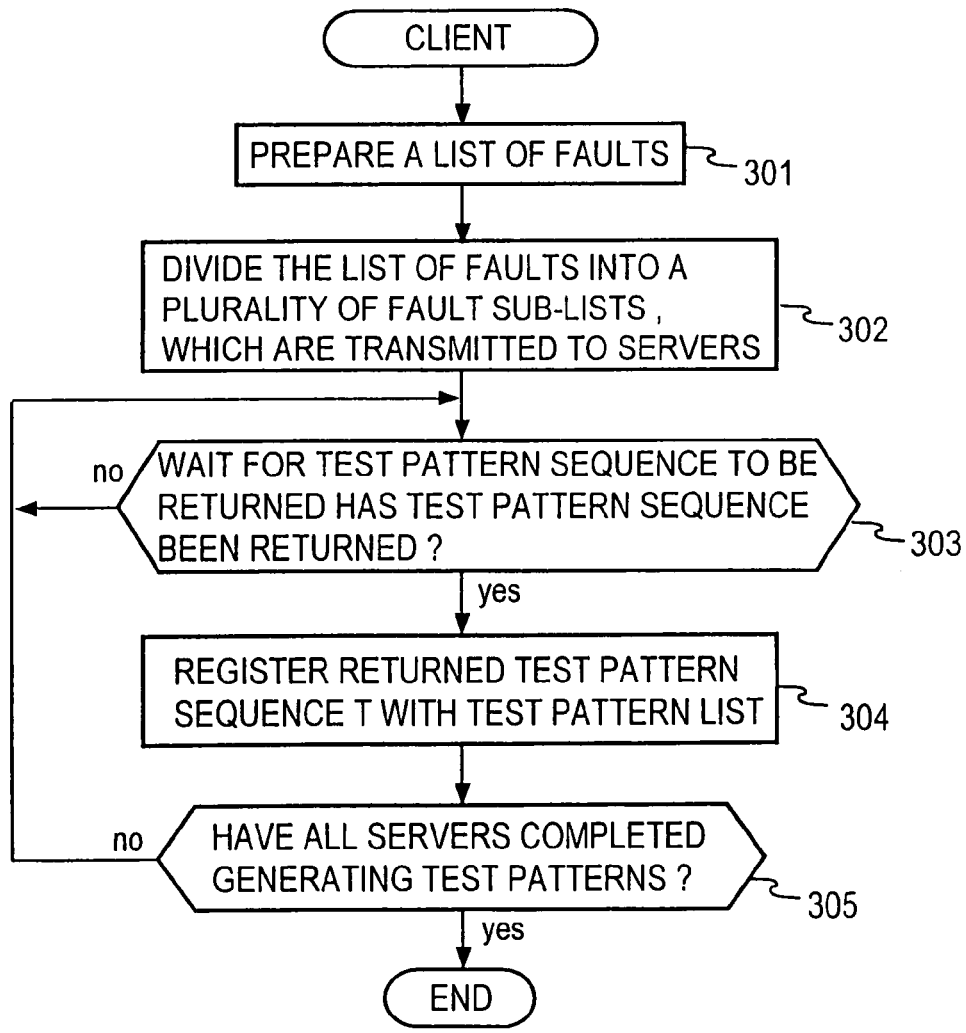
FIG. 32 is a flow chart of an exemplary processing procedure which occurs on the client side in the test pattern generating method according to the first aspect of the present invention.

FIG. 32 shows a processing procedure for the client system 10 in another embodiment of the test pattern generating method according to the first aspect of the present invention. Initially, at step 301, a client (an electronic computer which manages test patterns) prepares a fault list in which every fault in a semiconductor integrated circuit under test is registered. At next step 302, the client divides the fault list into a plurality of fault sub-list which are transmitted to the plurality of servers. Subsequently, at step 303, the client waits for a test pattern sequence which will be returned from each server. When a test pattern sequence T is returned, the test pattern sequence T is registered with a test pattern list at step 304. Finally, at step 305, the client confirms whether or not all of the servers have completed generating test patterns. If the server operation has not been completed, the steps 303, 304 and 305 are repeated, and when all of the servers have completed the processing, the operation is completed.

Figure 33:
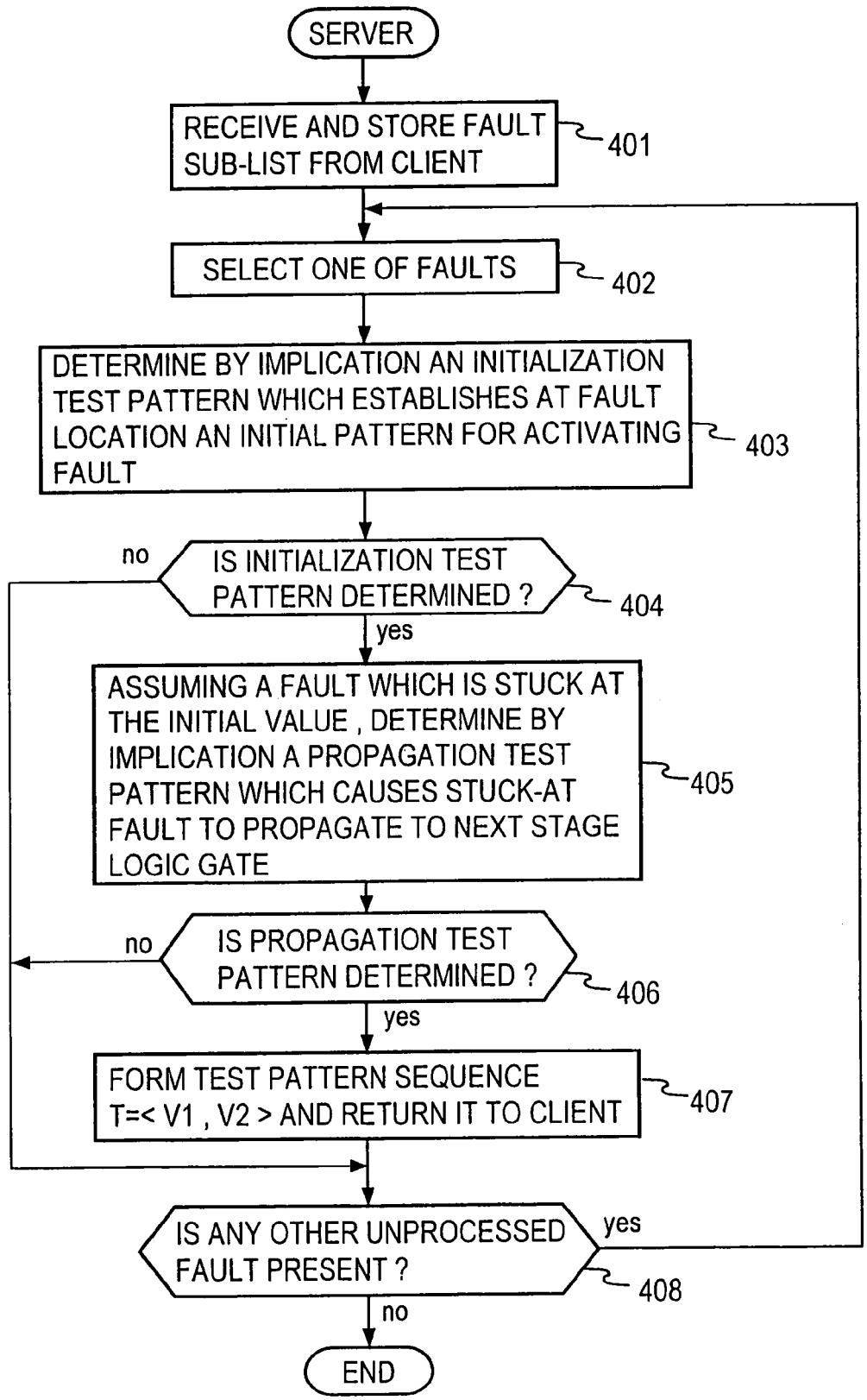
FIG. 33 is a flow chart of an exemplary processing procedure which occurs on the server side and which relates to the processing procedure occurring on the client side shown in FIG. 32.

On the other hand, as shown in FIG. 33, each server receives a fault sub-list which is transmitted from the client and stores it in storage means at step 401. At next step 402, the server selects one of the faults for which test patterns are to be generated from the fault sub-list stored in the storage means. At step 403, the server attempts to determine, by the implication operation, an initialization test pattern v1 which applies an initial value to a fault location corresponding to the selected fault in order to activate the fault. At step 404, the server confirms whether or not the implication operation which is intended to generate the initialization test pattern has successfully generated the initialization test pattern without introducing a conflict with logic signals on input signal lines and internal signal lines within the semiconductor integrated circuit under test. If the initialization test pattern has been successfully generated, the operation proceeds to step 405, while if the initialization operation has failed to generate the initialization test pattern, the operation transfers to step 408.

At step 405, the server assumes a stuck-at fault at the fault location which causes the output to be fixed to the initial value, and then attempts to determine, by the implication operation, a propagation test pattern v2 which causes the stuck-at fault to be propagated to the output of a next stage logic gate which is connected at its input to the fault location. At step 406, a confirmation is made by the server to see whether or not the implication operation which is intended to generate the propagation test pattern v2 has successfully generated a propagation test pattern without introducing a conflict with logic signals on input signal lines and internal signal lines of the semiconductor integrated circuit under test. If the propagation test pattern has been successfully generated, the operation proceeds to step 407, while if the implication operation failed to generate the propagation test pattern, the operation transfers to step 408. At step 407, the server forms a test pattern sequence T=<v1, v2> from the initialization test pattern v1 and the propagation test pattern v2 which are determined at steps 403 and 405, and returns the test pattern sequence T to the client. Finally, at step 408, a confirmation is made by the server to see if there remains any other unprocessed fault in the fault sub-list which is stored in the storage means. If there remains an unprocessed fault, the steps 402, 403, 404, 405, 406, 407 and 408 are repeated. However, if there remains no unprocessed fault, the server reports the completion of generating test patterns to the client, thus completing its operation. When the plurality of servers generate test pattern sequence in this manner, the overall processing speed can be improved. The test pattern generating method mentioned above may choose a gate delay fault or an open fault for the selected fault for which test patterns are to be generated.

Figure 34:
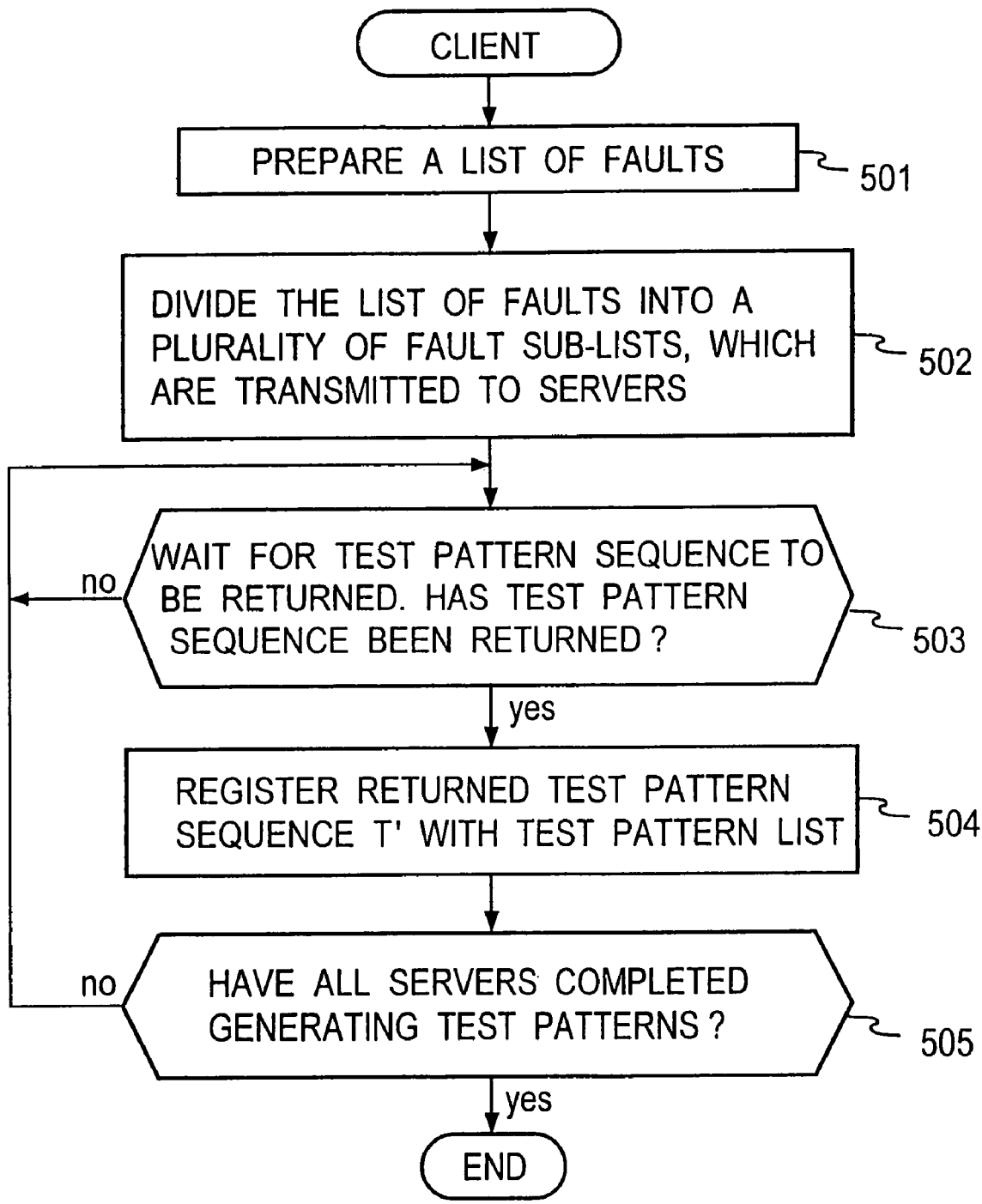
FIG. 34 is a flow chart of another processing procedure which occurs on the client side according to the test pattern generating method according to the first aspect of the present invention.

FIG. 34 shows a processing procedure which takes place by the client in a further embodiment of the test pattern generating method according to the first aspect of the present invention. Initially, at step 501, the client prepares a fault list in which every fault in a semiconductor integrated circuit under test is registered. At step 502, the client divides the fault list into a plurality of fault sub-lists, which are transmitted to a plurality of servers. Subsequently, at step 503, the client waits for a test pattern sequence which will be returned by each server. A returned test pattern sequence T' is registered with a test pattern list at step 504. Finally, at step 505, the client confirms whether or not all the servers have completed generating test patterns. If all the servers have not completed the generation of test pattern sequence, the steps 503, 504 and 505 are repeated, and when all the servers have completed the generation of test patterns, the operation is completed.

Figure 35:
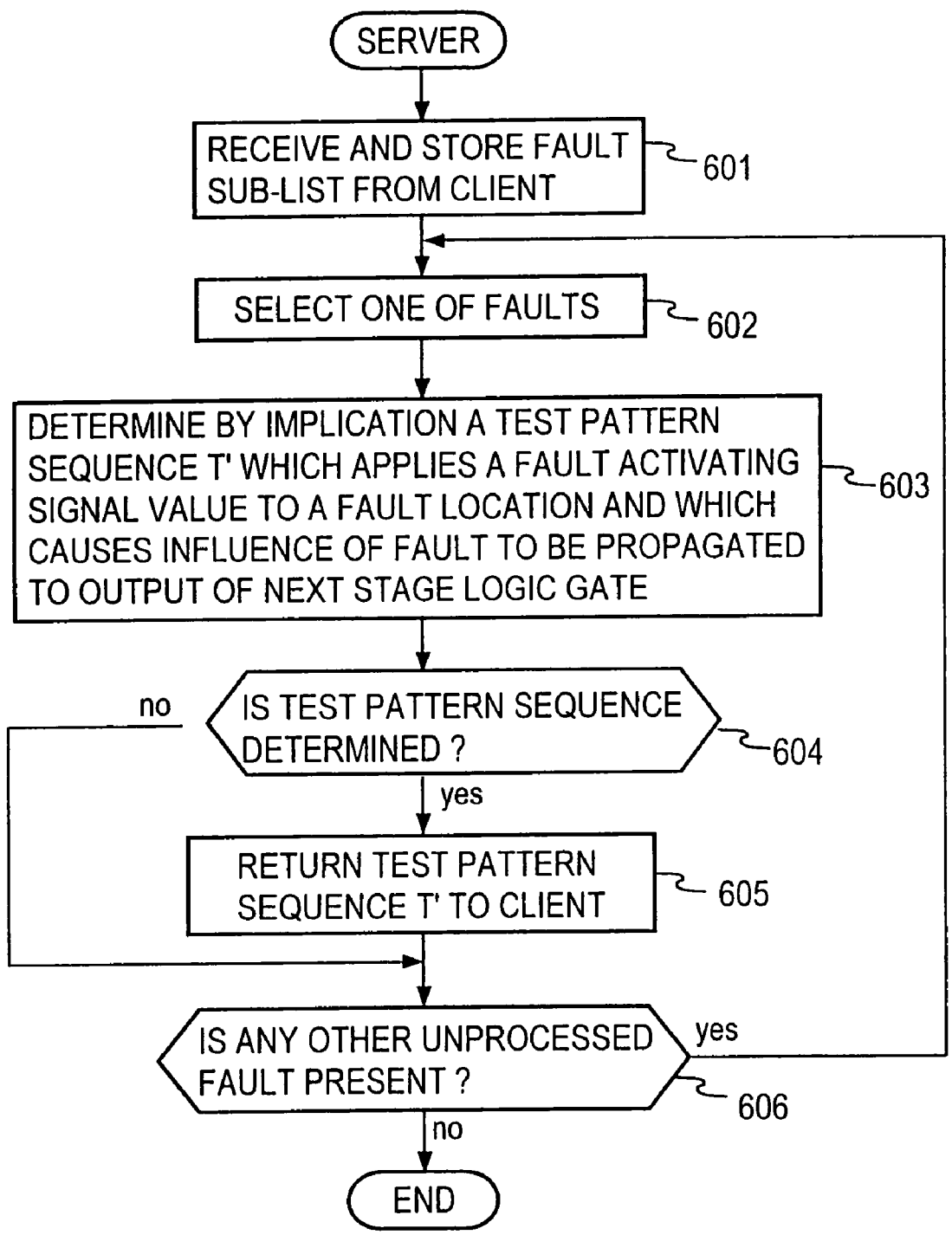
FIG. 35 is a flow chart of an exemplary processing procedure which occurs on the server side and which is related to the client side processing procedure shown in FIG. 34.

On the other hand, as shown in FIG. 35, at step 601, each server receives a fault sub-list which is transmitted from the client and stores it in storage means. At next step 602, the server selects one of the faults, for which test patterns are to be generated, from the fault sub-list stored in storage means. Subsequently, at step 603, the server attempts to determine, by the implication operation, a test pattern sequence T' which applies a signal value according to the five value logic system to a fault location corresponding to the selected fault in order to activate the fault and for causing the signal value to be propagated to the output of a next stage logic gate which is connected at its input to the fault location. At step 604, a confirmation is made by the server to see whether or not the implication operation which is intended to generate the test pattern sequence T' has successfully generated the test pattern sequence T' without introducing a conflict with signal values on input signal lines and internal signal lines of the semiconductor integrated circuit under test. If the test pattern sequence T' has been successfully generated, the operation proceeds to step 605, while if the implication operation has failed to generate the test pattern sequence T', the operation transfers to step 606. At step 605, the server returns the test pattern sequence T' which is determined at step 603 to the client. Finally, at step 606, a confirmation is made to see whether or not any other unprocessed fault remains in the fault sub-list stored in the storage means. If there remains an unprocessed fault, the steps 602, 603, 604, 605 and 606 are repeated. However, if there remains no unprocessed fault, the server reports the completion of generating test patterns to the client, thus completing its operation. The test pattern generating method mentioned above may choose a gate delay fault or an open fault for the selected fault for which test patterns are to be generated.

Figure 36:
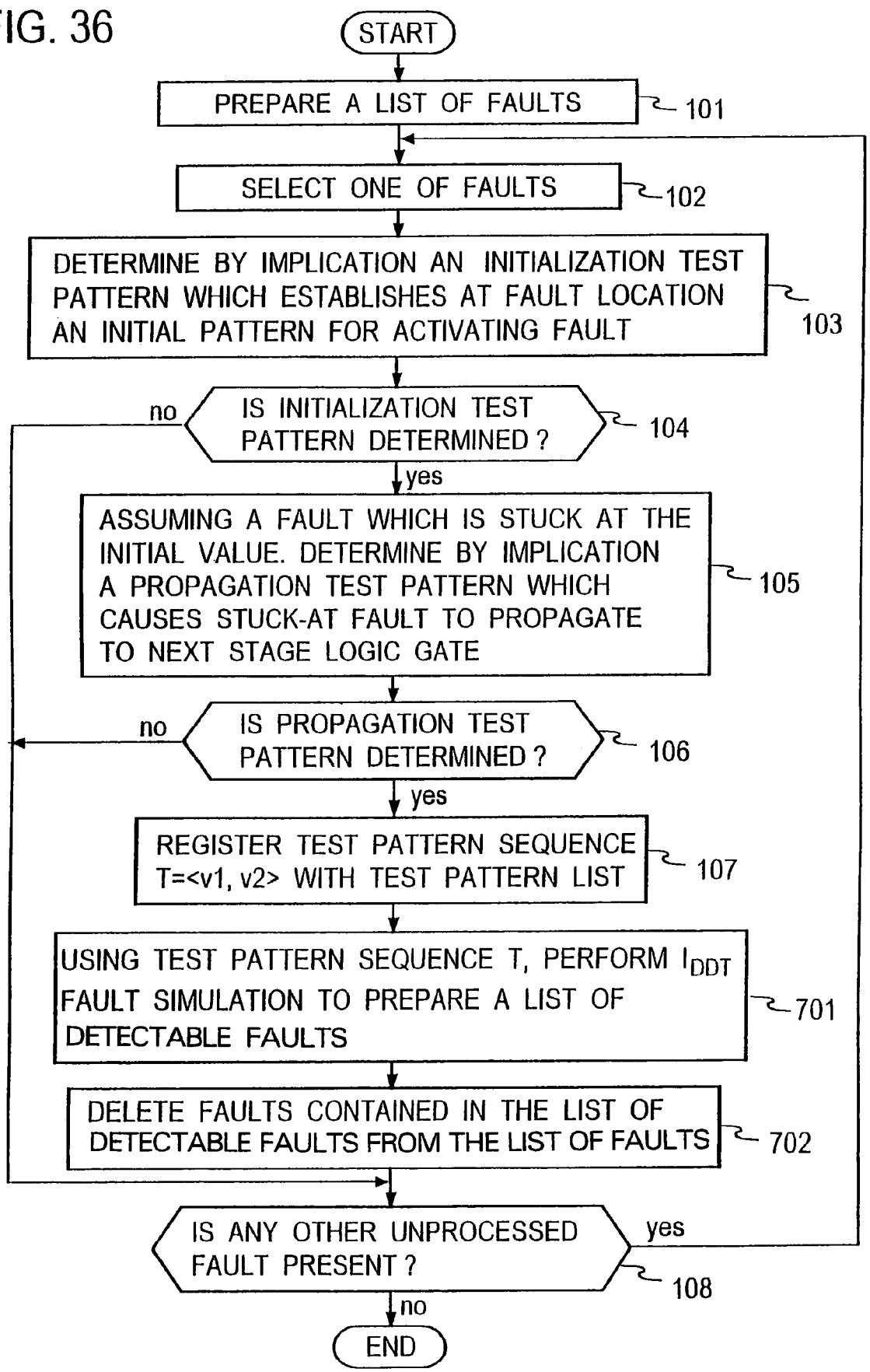
FIG. 36 is a flow chart of a further processing procedure for the test pattern generating method according to the first aspect of the present invention.

FIG. 36 shows a processing procedure according to still another embodiment of the test pattern generating method according to the first aspect of the present invention. This processing procedure is substantially similar to the embodiment shown in FIG. 29 except that the step 107 where the initialization test pattern v1 and the propagation test pattern v2 determined at steps 103 and 105 are combined together to define the test pattern sequence T=<v1, v2>, which is then registered with the test pattern list, is followed by a step 701 where the test pattern sequence T determined at step 107 is used to perform a transient power supply current fault simulation ($I_{DDT}$ fault simulation) to prepare a fault list which can be detected with the test pattern sequence (a detectable fault list). Then follows a step 702 where those faults which are contained in the detectable fault list which is prepared at step 701 are deleted from the fault list prepared at step 101. Finally, at step 108, a confirmation is made to see whether or not any other fault which has not yet been processed or deleted remains in the fault list. When a fault which has not yet been processed or deleted remains, the steps 102, 103, 104, 105, 106, 107, 701, 702 and 108 are repeated. However, if there remains no fault which has not been processed or deleted, the operation is completed. The deletion described above promotes the completion of generating test patterns. The test pattern generating method mentioned above may choose a gate delay fault or an open fault for the selected gate for which test patterns are to be generated. The registration at step 107 and the deletion at steps 701 and 702 may be interchanged in order.

Figure 37:
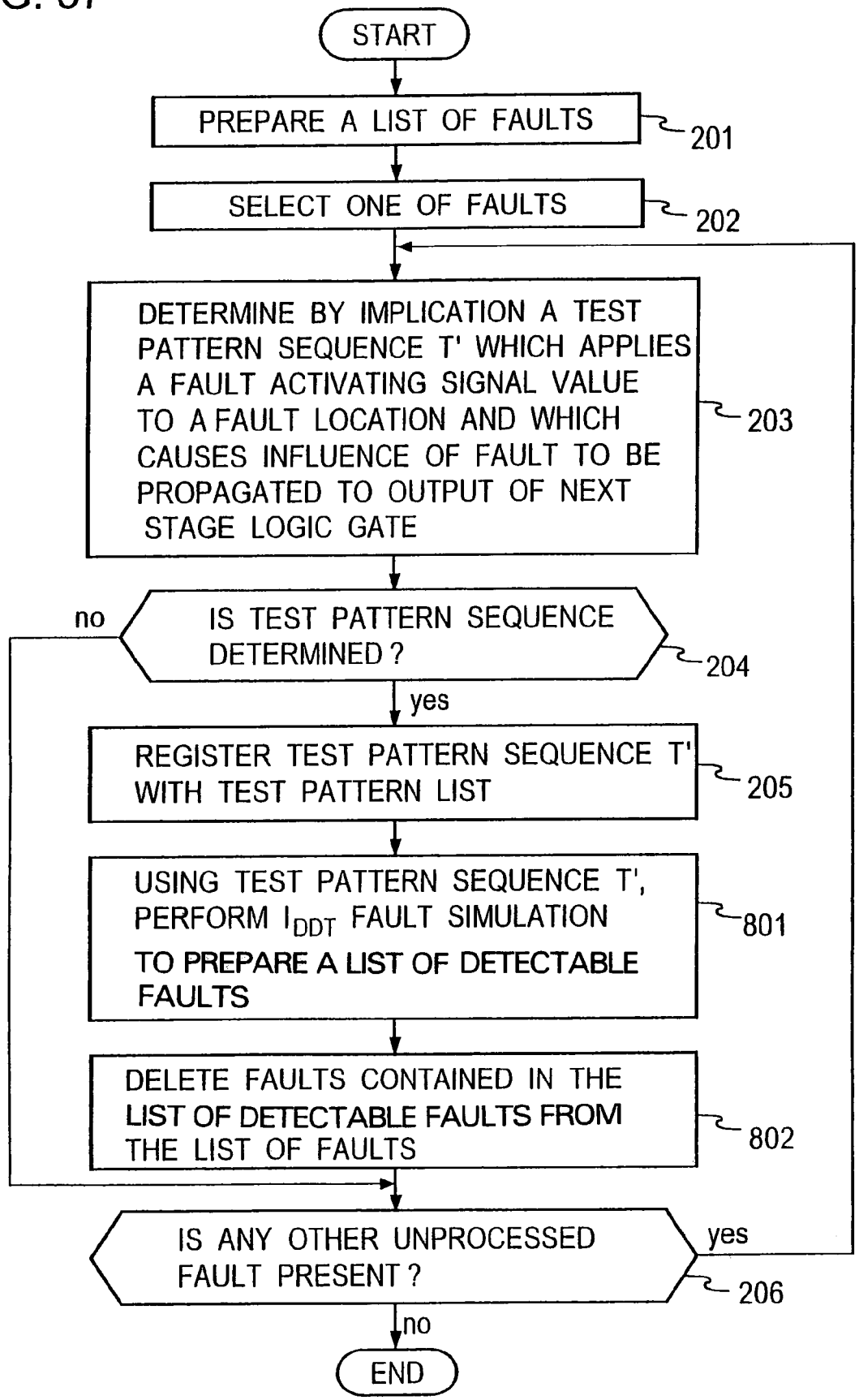
FIG. 37 is a flow chart of yet another processing procedure for the test pattern generating method according to the first aspect of the present invention.

FIG. 37 shows a processing procedure according to yet another embodiment of the test pattern generating method according to the first aspect of the present invention. This processing procedure is equivalent to the processing procedure shown in FIG. 30, to which the additional processing operation which took place in FIG. 36 with respect to FIG. 29 is added. Namely, as a distinction from FIG. 30, after step 205 where the test pattern sequence T' is registered with the test pattern list, there follows a step 801 where the test pattern sequence T' determined at step 203 is used to perform a transient power supply current fault simulation ($I_{DDT}$ fault simulation) to prepare a fault list which can be detected with the test pattern sequence (a detectable fault list). Then follows a step 802 where the faults contained in the detectable fault list which is prepared at step 801 are deleted from the fault list which is prepared at step 201. Finally, at step 206, a confirmation is made to see whether or not there remains any other fault which has not yet been processed or deleted in the fault list. If there remains a fault which has not been processed or deleted, the steps 202, 203, 204, 205, 801, 802 and 206 are repeated. However, if there remains no fault which has not been processed or deleted, the operation is completed. The test pattern generating method mentioned above may choose a gate delay fault or an open fault for the selected gate for which test patterns are to be generated. The registration at step 205 and the deletion at steps 801 and 802 may be interchanged in order.

Figure 38:
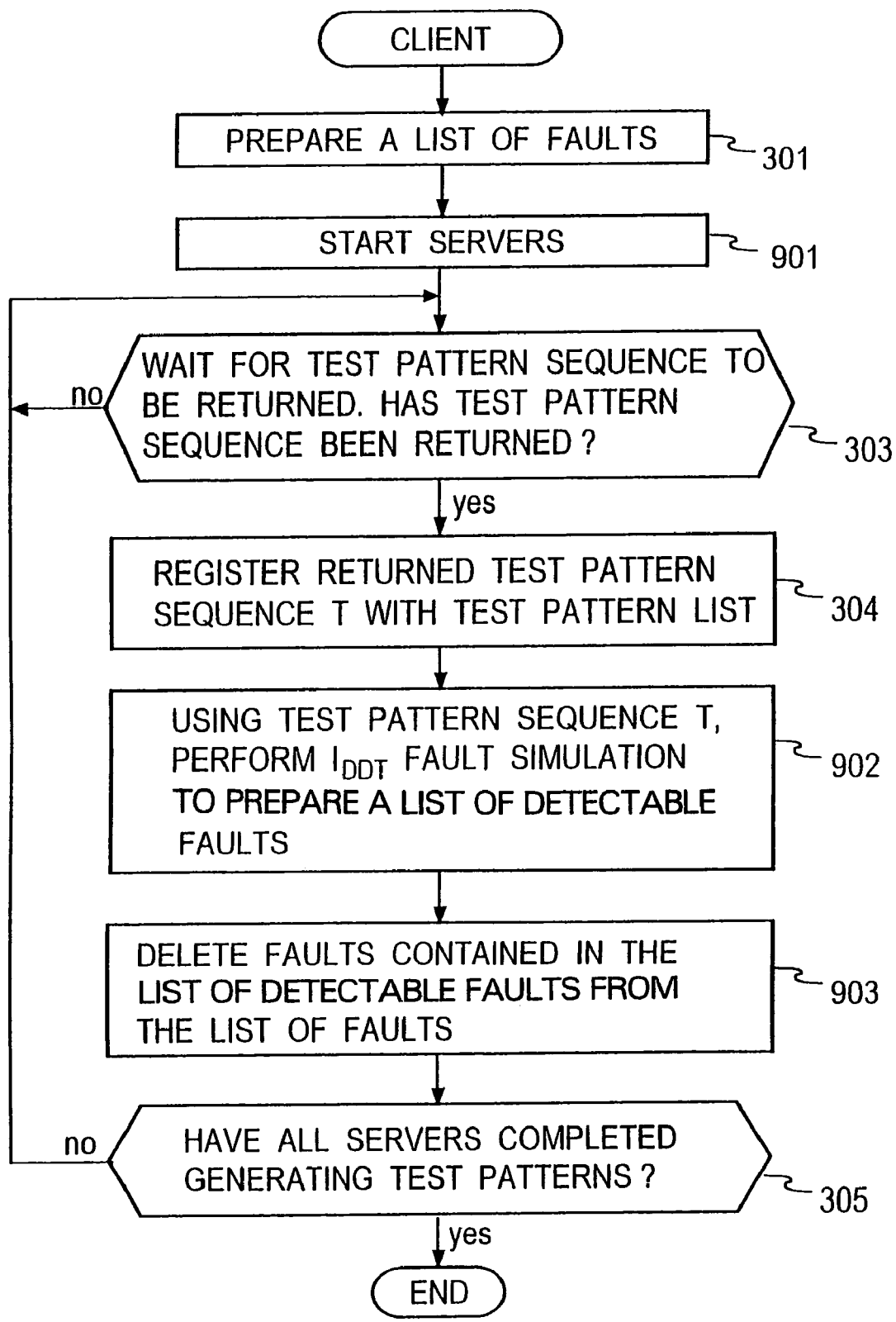
FIG. 38 is a flow chart of a further processing procedure which occurs on the client side for the test pattern generating method according to the first aspect of the present invention.
Figure 39:
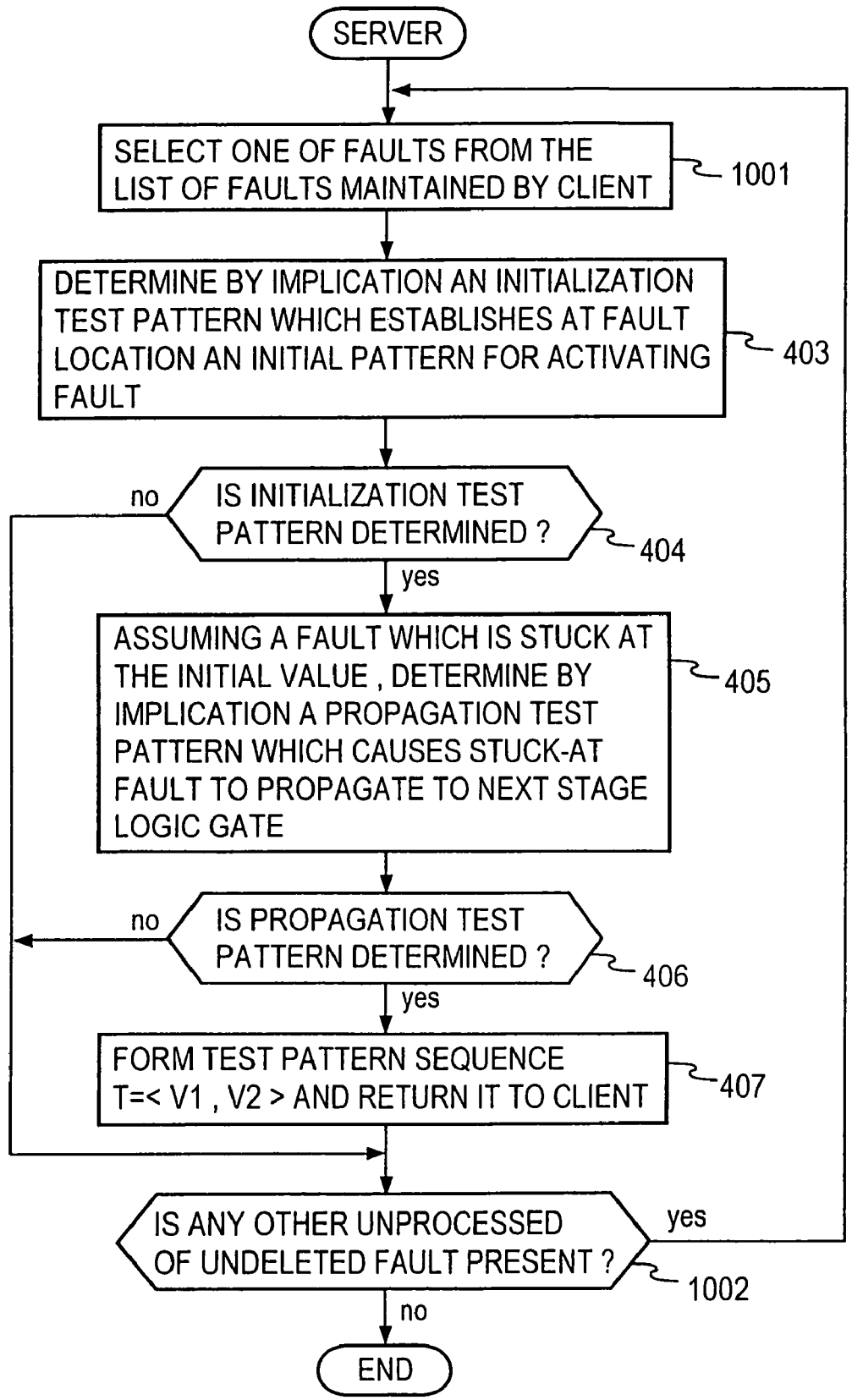
FIG. 39 is a flow chart of a processing procedure which occurs on the server side and which is related to the client side processing procedure shown in FIG. 38.

FIGS. 38 and 39 show a processing procedure according to a yet further embodiment of the test pattern generating method according to the first aspect of the present invention. A difference over the embodiment shown in FIGS. 32 and 33 will be principally dealt with. After preparing a fault list at step 301, the client activates or starts a plurality of servers for generating test patterns at step 901. At next step 303, the client waits for test pattern sequence which will be returned from each server. When a test pattern sequence T is returned, the client registers the test pattern sequence T with a test pattern list at step 304. At next step 902, the client performs a transient power supply current fault simulation ($I_{DDT}$ fault simulation) using the test pattern sequence T to prepare a fault list which can be detected with the test pattern sequence (a detectable fault list). At next step 903, the client deletes the faults contained in the detectable fault list which is prepared at step 902 from the fault list which is prepared at step 301, and then proceeds to step 305. The registration at step 304 and the deletion at steps 902 and 903 may be interchanged in order. At step 305, when there is no fault in the fault list which has not been selected, all of the servers which are not engaged with generating test patterns are successively deactivated.

As shown in FIG. 39, when activated by the client, each server selects one of the faults for which test patterns are to be generated, from the fault list which is maintained by the client at step 1001. Subsequently, an initialization test pattern vi and a propagation test pattern v2 which are used to detect the selected fault are determined and are combined together to define a test pattern sequence T=<v1, v2>, which is then returned to the client in the similar manner as described above in connection with FIG. 33. After returning the test pattern sequence at step 407, the server finally makes a confirmation at step 1002 to see whether or not there remains any other fault in the fault list maintained by the client which has not yet been processed or deleted. If there remains a fault which has not been processed or deleted, the steps 1001, 403, 404, 405, 406, 407 and 1002 are repeated. However, if there remains no fault which has not been processed or deleted, the operation of generating test patterns is completed. The test pattern generating method mentioned above may choose a gate delay fault or an open fault for the selected fault for which test patterns are to be generated. In FIGS. 38 and 39, at the same time as the client activates the servers, the client transmits a selected fault, one each for the server, from the fault list, and when a test pattern sequence is returned from the server, the client registers it, prepares a detectable fault list which takes place by the simulation, and deletes the fault contained in the detectable fault list from the fault list. Subsequently, the client selects one of unprocessed faults from the fault list and transmits it to the server. In the event it is found that there remains no unprocessed fault in the fault list when the registration, the preparation of the detectable fault list and the deletion have been completed for a test pattern sequence which is returned from the server, the client immediately notifies the servers to this effect, whereupon the servers complete their operations. Alternatively, when there is no unprocessed fault in the fault list and when the client has received a last test pattern sequence which is returned from each server, it may register to this effect and complete its operation.

Figure 40:
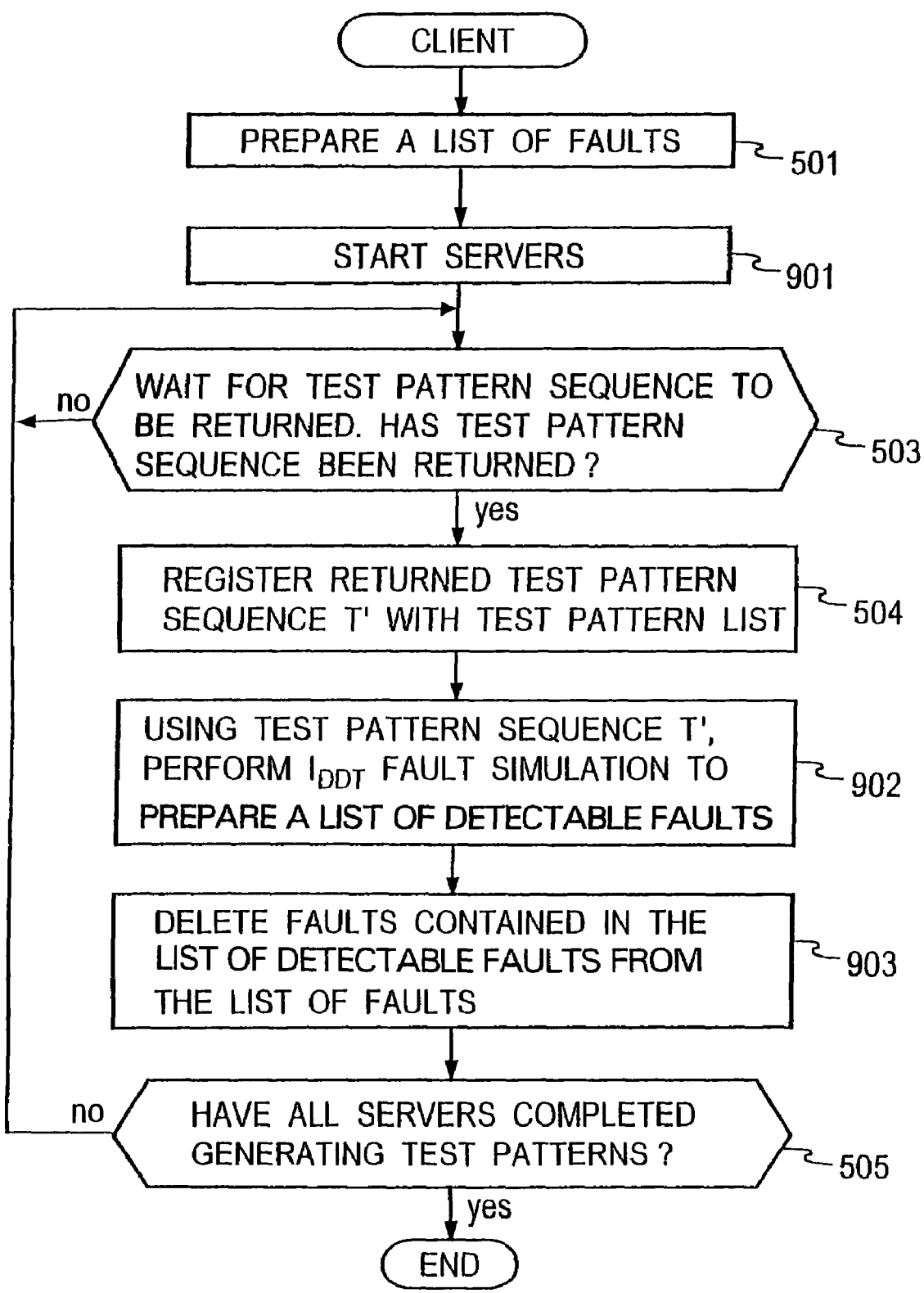
FIG. 40 is a flow chart of still another processing procedure which occurs on the client side for the method according to the first aspect of the present invention.
Figure 41:
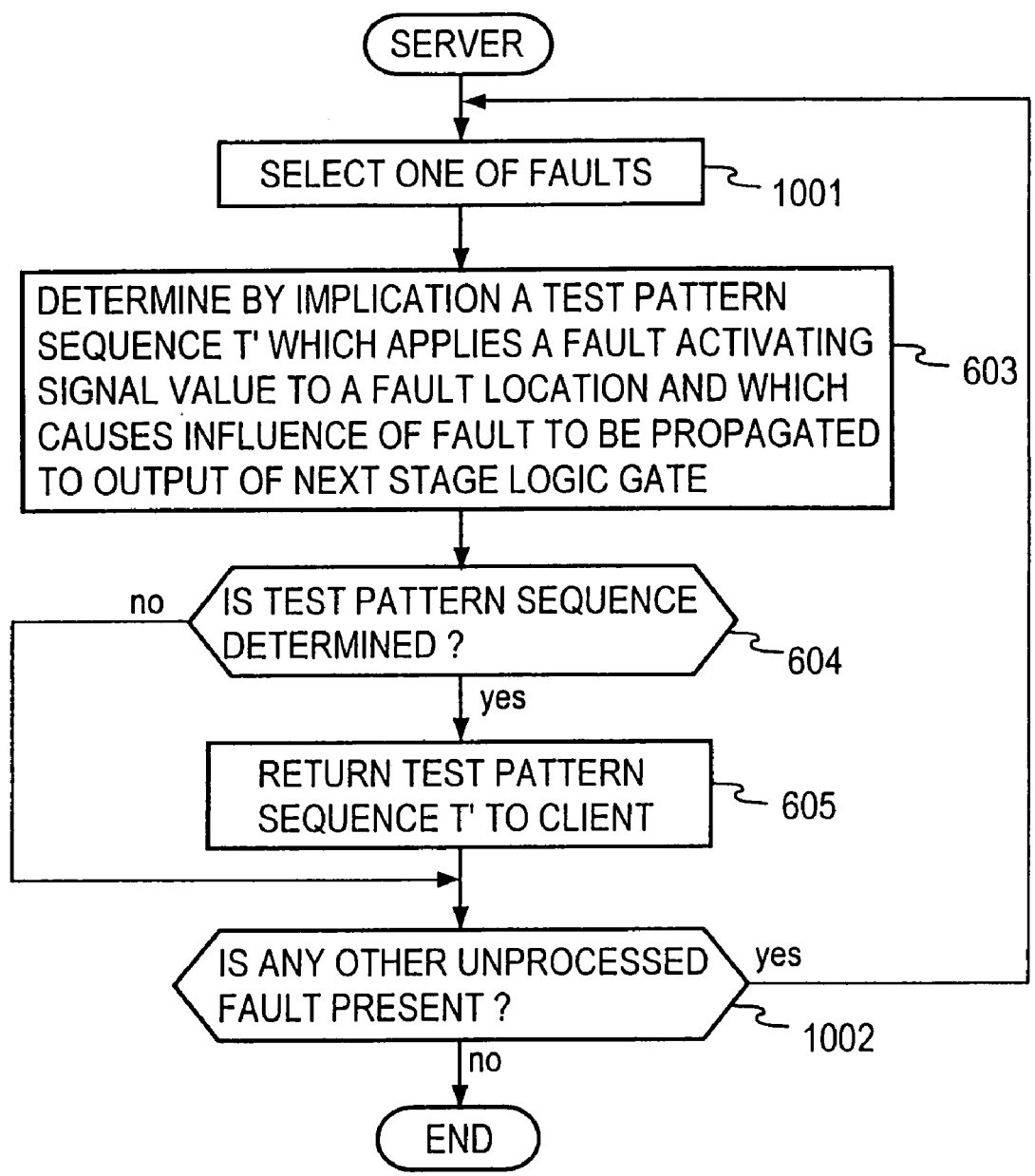
FIG. 41 is a flow chart of a processing procedure which occurs on the server side and which is related to the client side processing procedure shown in FIG. 40.

FIGS. 40 and 41 show different processing procedures used by the client and servers in carrying out the test pattern generating method according to the first aspect of the present invention. This represents a modification of the embodiment shown in FIGS. 34 and 35 in the same manner as the embodiments shown in FIGS. 32 and 33 are modified into the embodiments shown in FIGS. 38 and 39. Accordingly, steps shown in FIGS. 40 and 41 which perform the same function as certain steps in FIGS. 38 and 39 are designated by like reference numerals as used before without repeating their descriptions. Again, this test pattern generating method may choose a gate delay fault or an open fault for the selected fault. In addition, the registration with the test pattern list and deletion from the fault list which are performed by the client may be interchanged in order.

An embodiment of the first aspect of the present invention using a plurality of servers in which the client selects a fault for which test patterns are to be generated and confirms the presence of an unprocessed fault will now be described with reference to FIG. 42 which shows a processing procedure which occurs on the client and FIG. 43 which shows a processing procedure which occurs on the server.

On the client side, a fault list is prepared at step 301, and a plurality of servers are activated at step 901. At subsequent step 1201, the client examines if it has received a request for a fault to be processed from one of the servers. If it has received the request, at step 1202, the client selects one of faults from the fault list, and transmits it to the requesting server. At next step 303, the client examines if there has been returned a test pattern sequence from the server. If there has been returned a test pattern sequence, the client registers the test pattern sequence with the test pattern list at step 304. At next step 1203, the client examines if there remains any fault within the fault list which has not been processed. If there is, the operation returns to step 1201.

If it is found at step 1201 that the client has not received any request for a fault, the operation transfers to step 303. If it is found at step 303 that no test pattern sequence has been returned, the operation transfers to step 1203. If it is found at step 1203 that there is no unprocessed fault which remains in the fault list, the client notifies each server the completion of operation, and ceases to operate.

Figure 43:
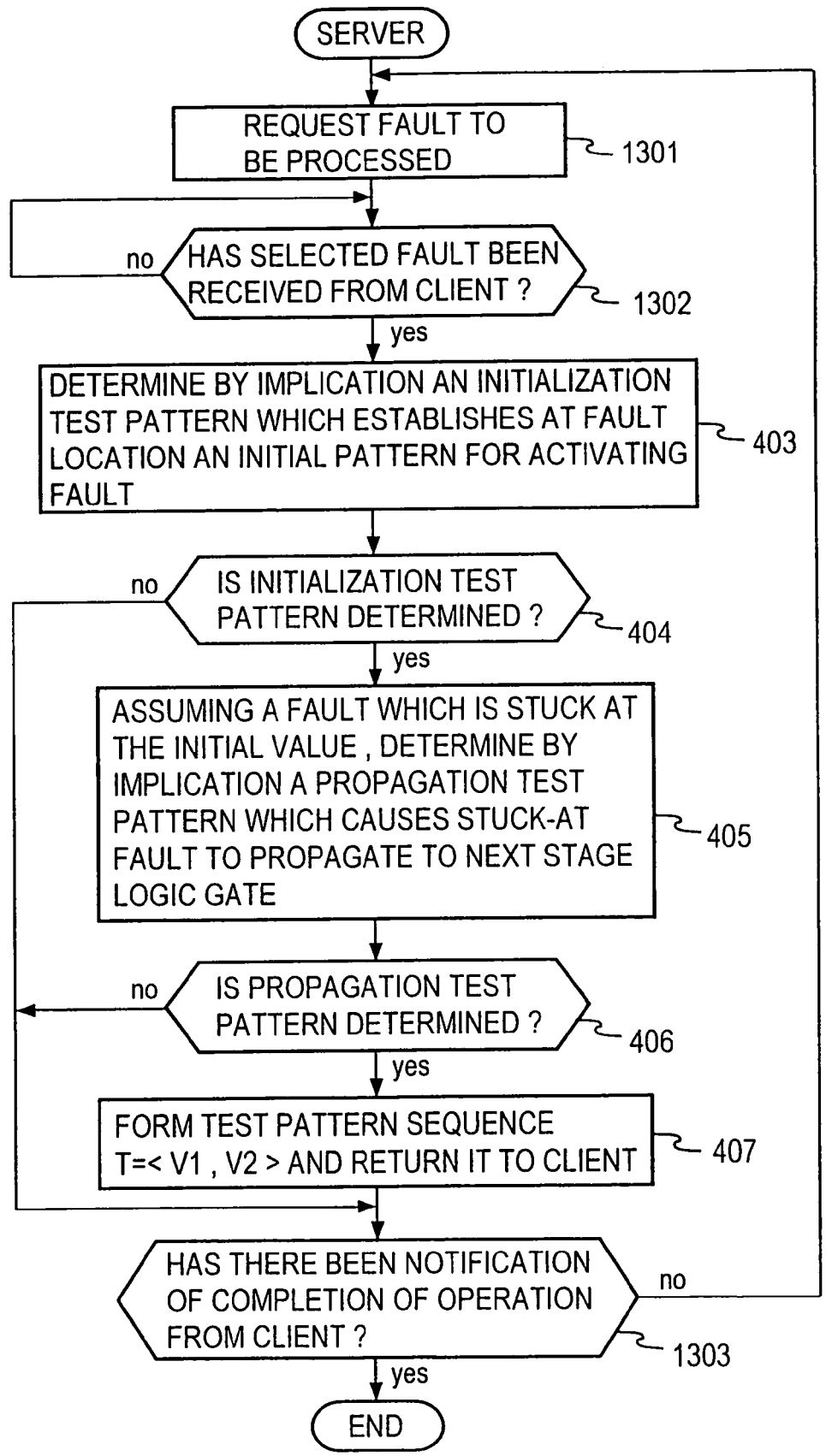
FIG. 43 is a flow chart of a processing procedure which occurs on the server side and which is related to the client side processing procedure shown in FIG. 42.

Referring to FIG. 43, on the server side, when it is activated by the client, it requests the client to transmit a fault to be processed at step 1301. At step 1302, the server waits for the selected fault which is to be transmitted from the client. When the selected fault is received, it executes steps 403 to 407 shown in FIG. 33. Specifically, it attempts to determine the initialization test pattern v1 and the propagation test pattern v2 by the implication operation. If these test patterns are determined, the resulting test pattern sequence T=<v1, v2> is returned to the client. After returning the test pattern sequence or if the server failed to generate the test pattern sequence, it examines to see if a notification of the completion operation has been received from the client at step 1303. If such notification has not been received, the operation returns to step 1301, and if it has received the notification, it ceases to operate.

Figure 44:
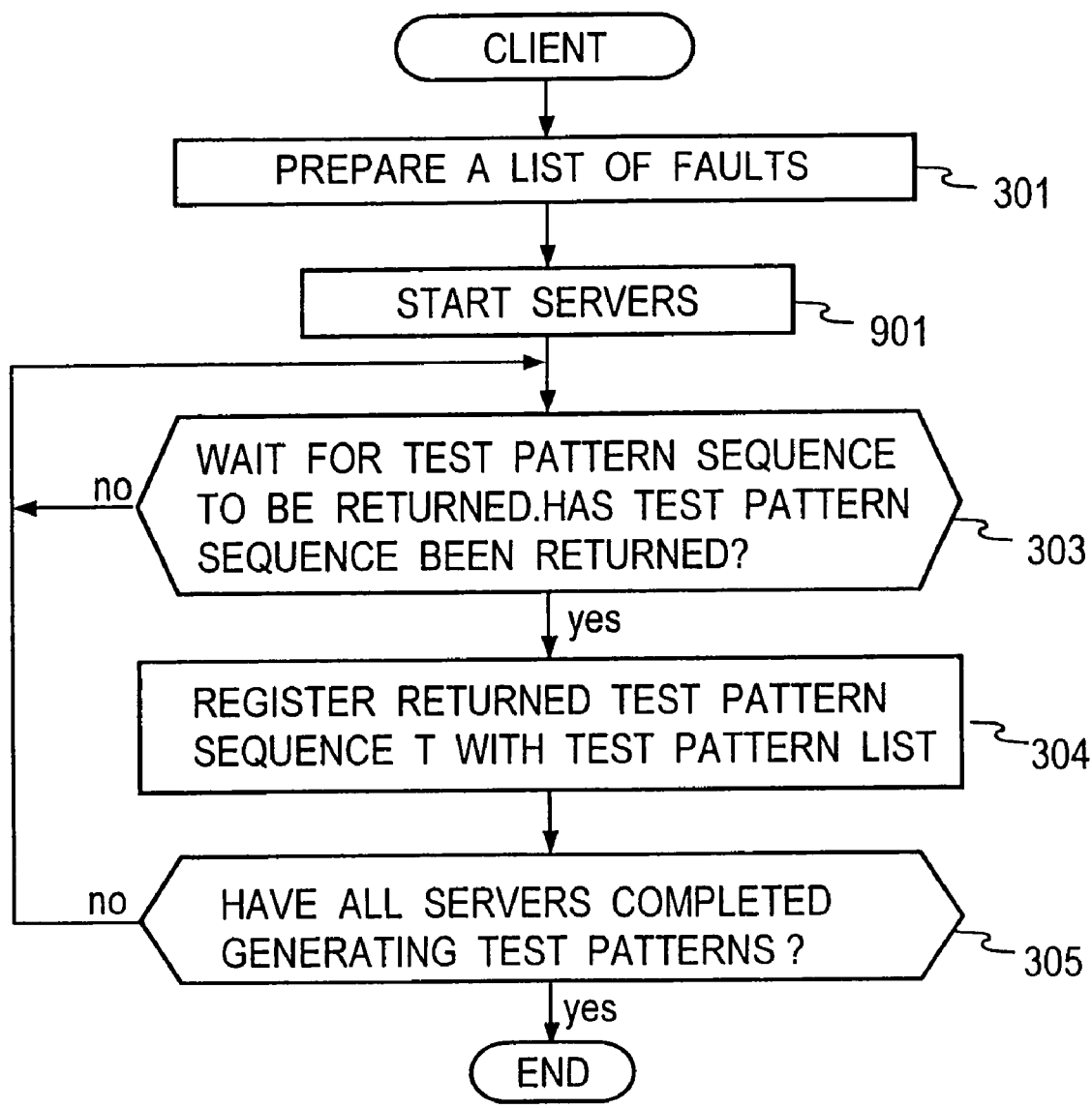
FIG. 44 is a flow chart of a different processing procedure which occurs on the client side for the method according to the first aspect of the present invention.

In an embodiment in which each server selects a fault for which test patterns are to be generated and confirms the presence of an unprocessed fault, a processing procedure to be followed by the client may be as shown in FIG. 44 where steps 902 and 903 shown in FIG. 38 are omitted. A processing procedure followed by the server remains substantially the same as shown in FIG. 39. However, at step 1002 shown in FIG. 39, an examination is made to see whether there remains any fault in the fault list which has not been processed, and accordingly, the deletion of a fault or faults from the fault list is not carried out as a result of the omission of steps 902 and 903 on the client side.

Figure 42:
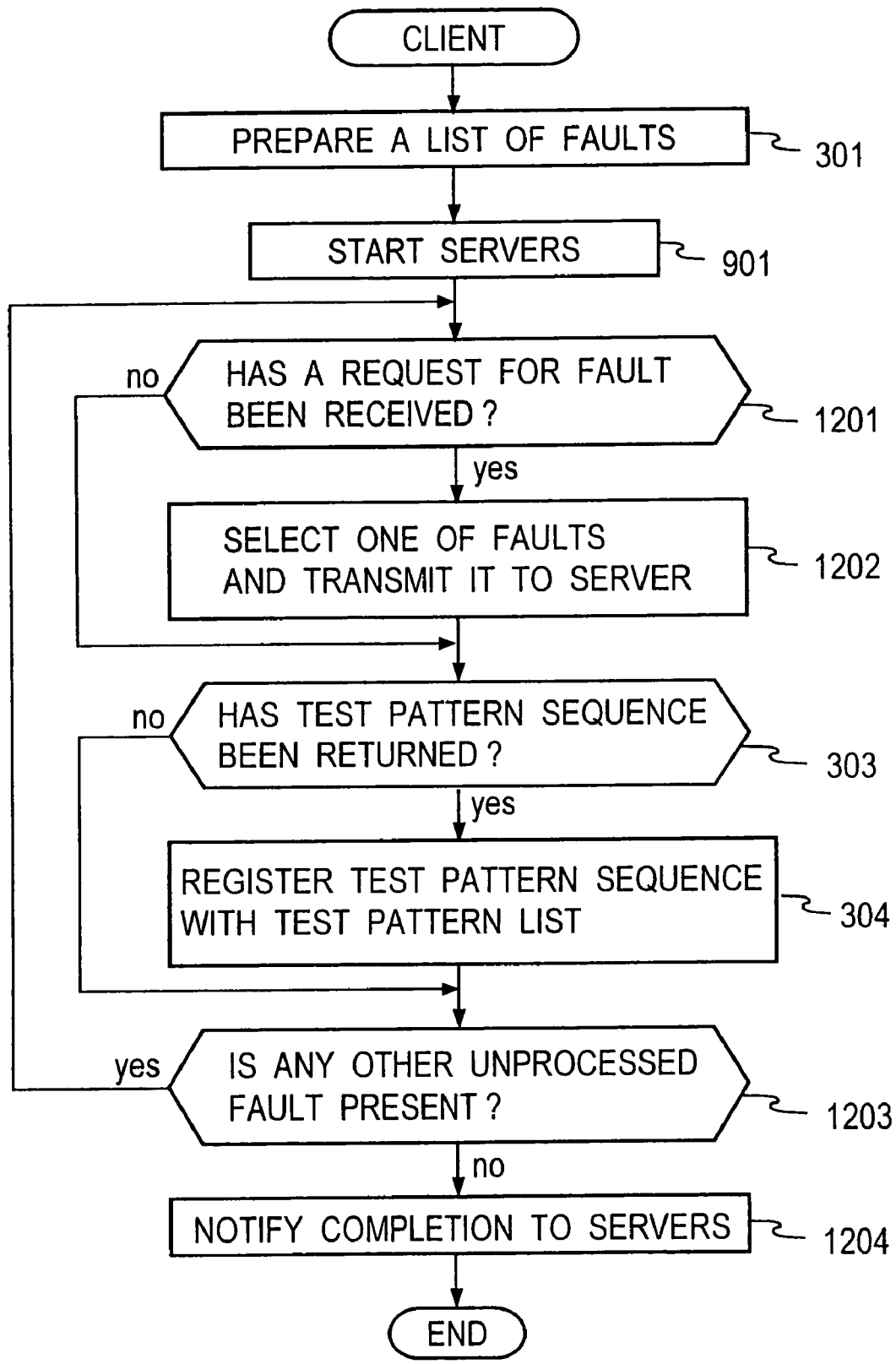
FIG. 42 is a flow chart of a still further processing procedure which occurs on the client side for the method according to the first aspect of the present invention.
Figure 45:
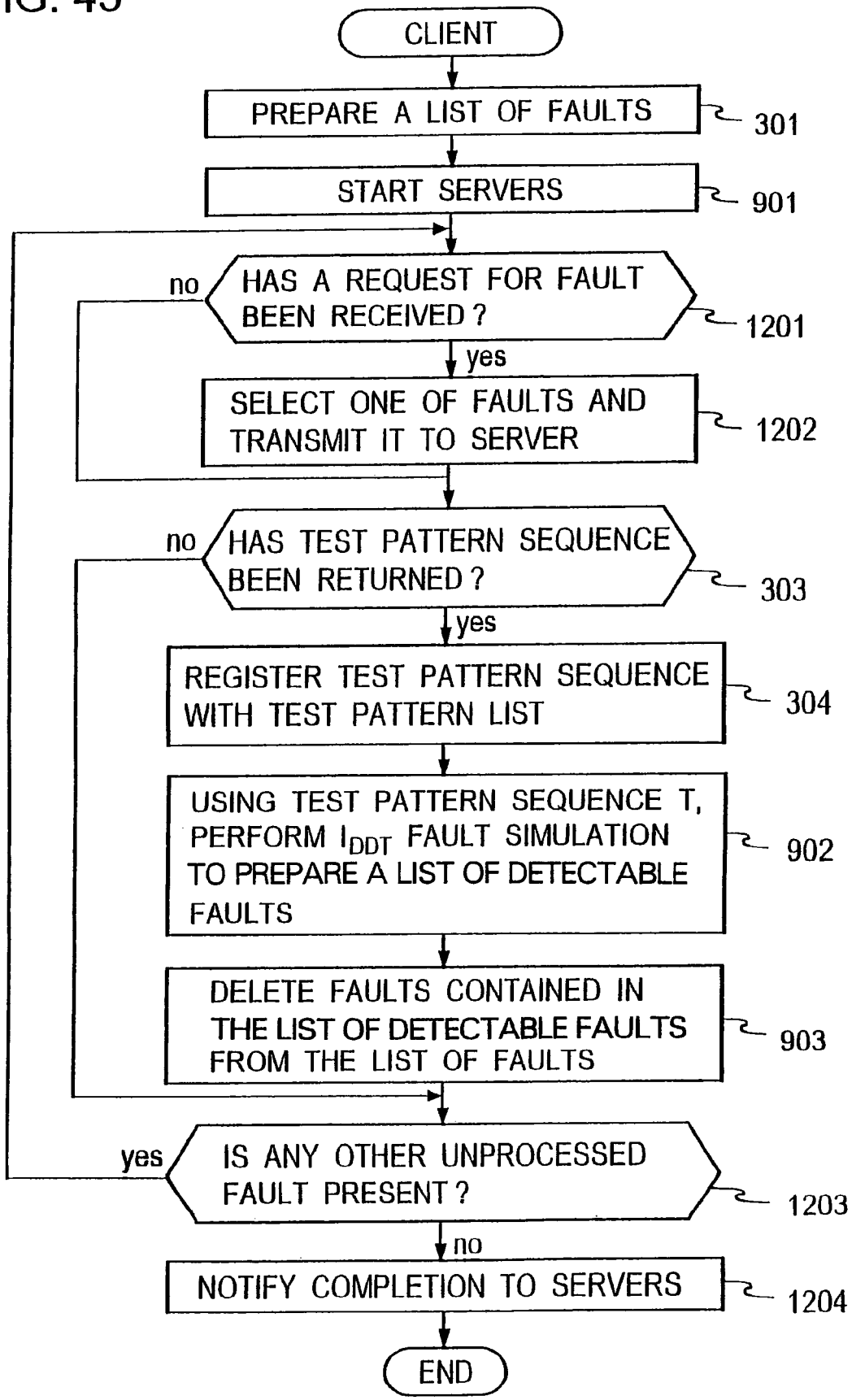
FIG. 45 is a flow chart of a still different processing procedure which occurs on the client side for the method according to the first aspect of the present invention.

In the embodiment shown in FIGS. 42 and 43 where a test pattern sequence T returned from the server is used to perform a fault simulation, a detectable fault list is prepared and faults contained in the detectable fault list are deleted from the fault list, the client operates according to a processing procedure shown in FIG. 45. In this instance, in the processing procedure shown in FIG. 42, steps 902 and 903 shown in FIG. 38 are executed subsequent to step 304 before transferring to step 1203. The processing procedure followed by the server in this instance is the same as the procedure shown in FIG. 43.

In the embodiments described above with reference to FIGS. 42 to 45, the test pattern sequence has been generated by determining the initialization test pattern and the propagation test pattern. However, as shown in the embodiment of FIGS. 40 and 41, signal values according to the five value logic system may be employed to generate a test pattern sequence T'.

Figure 46:
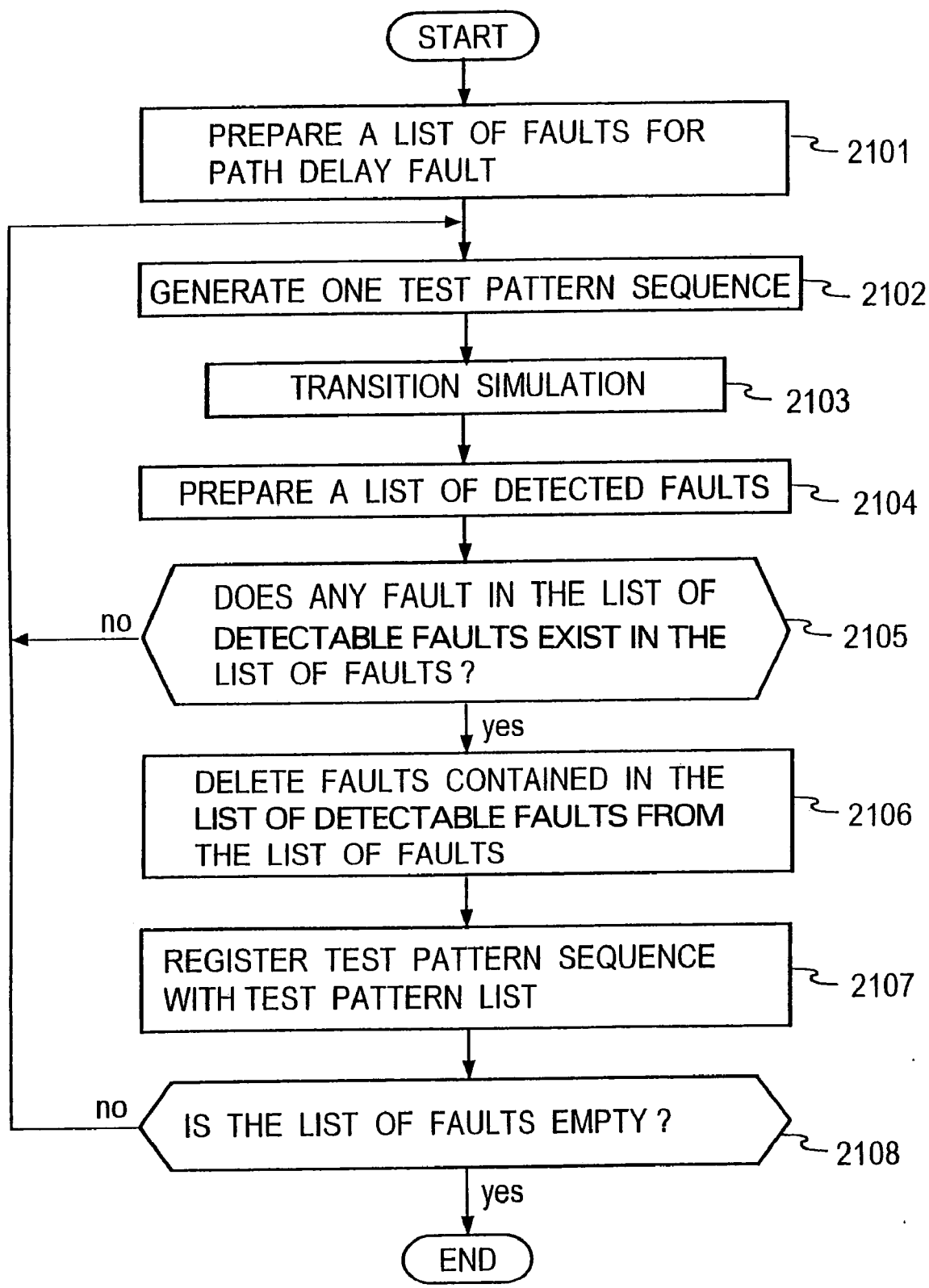
FIG. 46 is a flow chart of an exemplary processing procedure for the method according to the second aspect of the present invention.

FIG. 46 shows a processing procedure for the test pattern generating method according to the second aspect of the present invention. Initially, at step 2101, a fault list in which every path delay fault for a semiconductor integrated circuit under test is registered is prepared. The fault list may be prepared by manually tracing a circuit to pick up every path delay fault (or any path which is likely to cause a delay fault) or by enumerating path delay faults by an electronic computer on the basis of circuit information for the semiconductor integrated circuit under test. At step 2102, a test pattern sequence comprising two or more test patterns and which is to be applied to the semiconductor integrated circuit under test is generated. At next step 2103, a transition simulation is performed with the test pattern sequence to calculate a train of transition signal values which occur on signal lines within the semiconductor integrated circuit under test. At step 2104, the transition signal values on various signal lines which are calculated by the transition simulation are used to prepare a list of path delay faults which can be detected by the transient power supply current testing which uses the test pattern sequence (or a detectable fault list). At next step 2105, a confirmation is made to see if a fault or faults which are contained within the detectable fault list exist in the fault list prepared at step 2101. If faults contained in the detectable fault list exist in the fault list, the operation proceeds to step 2106. However, if a fault contained in the detectable fault list does not exist in the list of fault, the steps 2102, 2103, 2104 and 2105 are repeated.

At step 2106, a fault or faults contained in the detectable fault list are deleted from the fault list which is prepared at step 2101. At next step 2107, the test pattern sequence is registered with a test pattern list. At final step 2108, a confirmation is made to see if the fault list is empty. If the fault list is not empty, the steps 2102, 2103, 2104, 2105, 2106, 2107 and 2108 are repeated. If the fault list is empty, the operation is complete. At step 2102 where a test pattern sequence is generated, two or more random patterns may be generated as a test pattern sequence, or one from a group of previously generated test pattern sequence may be selected. In addition, at step 2108 where a confirmation is made to see if the fault list is empty, a decision may be rendered to complete the operation by confirming that the number of faults which remain in the fault list is equal to or less than a given number (a positive number including 0). However, in order to improve the path delay fault detection rate for the semiconductor integrated circuit under test, it is desirable that the threshold value mentioned above may be chosen as small as possible. It will be understood that as the number of remaining path delay faults is reduced, it takes time to obtain a test pattern sequence which is capable of detecting such remaining fault. On the other hand, depending on the circuit requirement, the fault detection rate demanded may be above a certain level such as 99% or above, for example. The number of remaining path delay faults may be increased in consideration of such demand so as to satisfy the requirement.

Figure 47:
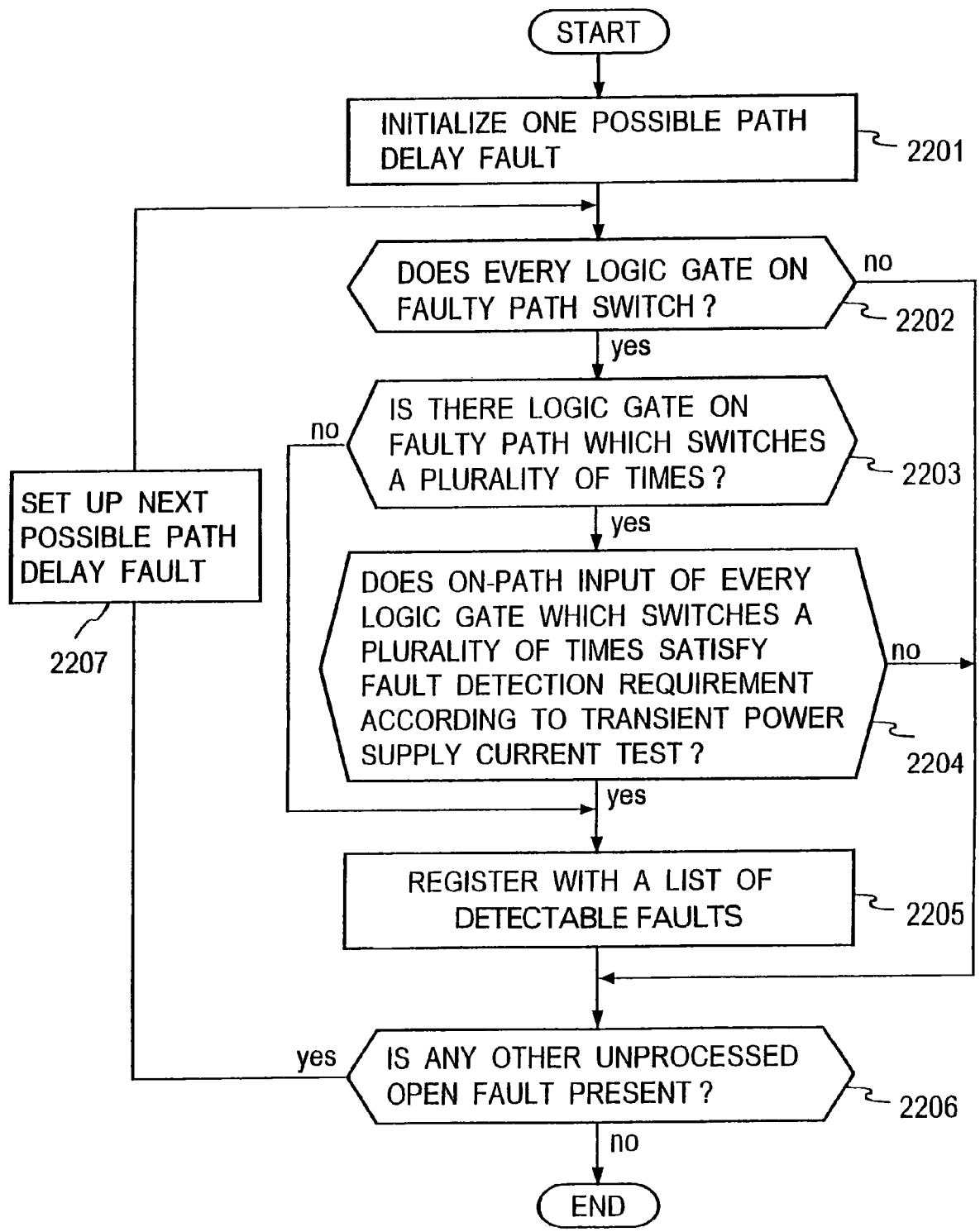
FIG. 47 is a flow chart of a specific example of the step of preparing a detectable fault list shown in FIG. 46.

FIG. 47 shows a processing procedure for preparing a detectable fault list at step 2104 in FIG. 46. Initially, at step 2201, an initialization is made by selecting one path delay fault which may occur in the semiconductor integrated circuit under test from the fault list which is prepared at step 2101 shown in FIG. 46. At next step 2202, a confirmation is made to see if every logic gate on a path having the path delay fault (faulty path) is subject to a switching operation on the basis of the result of the transition simulation. If every logic gate on the faulty path is subject to a switching operation, the operation proceeds to step 2203, but if there is some logic gate which is not subject to a switching operation, the operation transfers to step 2206.

At step 2203, a confirmation is made to see whether or not there exists a logic gate on the faulty path which undergoes a switching operation a plurality of times in response to the test pattern sequence which is generated at step 2102 in FIG. 46 on the basis of the result of the transition simulation. If there exists a logic gate which undergoes a switching operation a plurality of times, the operation proceeds to step 2204, but if a logic gate which undergoes a switching operation a plurality of times does not exist, the path delay fault is registered with the detectable fault list at step 2205. At step 2204, a confirmation is made to see if an on-path input of any logic gate (an input signal line of the logic gate which is located on the faulty path) which undergoes a switching operation a plurality of times satisfies a fault detecting requirement according to the transient power supply current testing. If the on-path input satisfies the fault detection requirement according to the transient power supply current testing, the path delay fault is registered with the detectable fault list at step 2205. If the on-path input does not satisfy the fault detection requirement according to the transient power supply current testing, the operation transfers to step 2206.

Figure 1A:
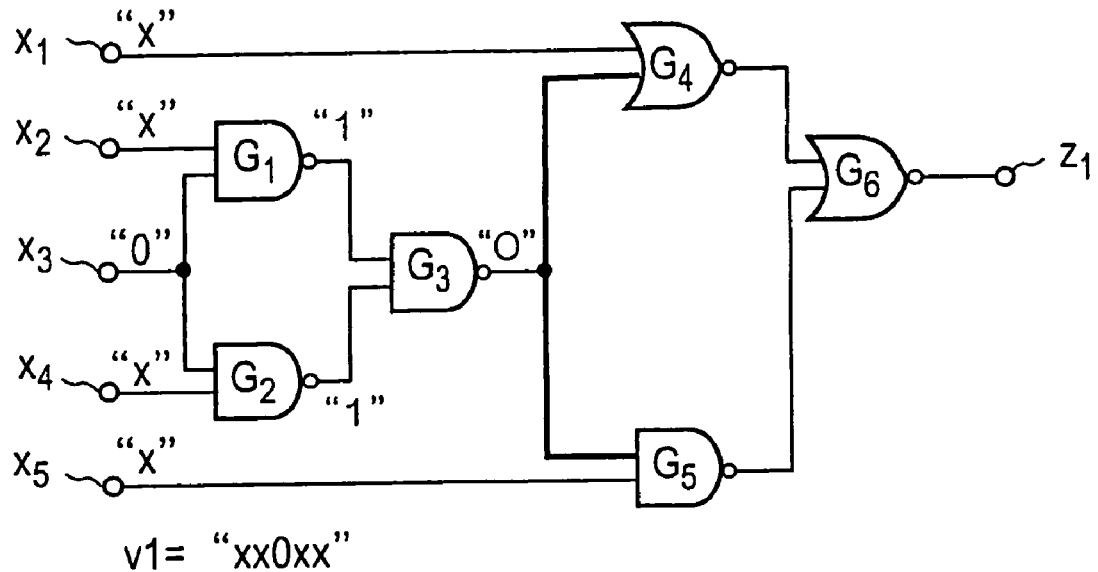
FIG. 1a is a circuit diagram of a logic circuit which is used to illustrate a conventional test pattern generating technique.
Figure 1B:
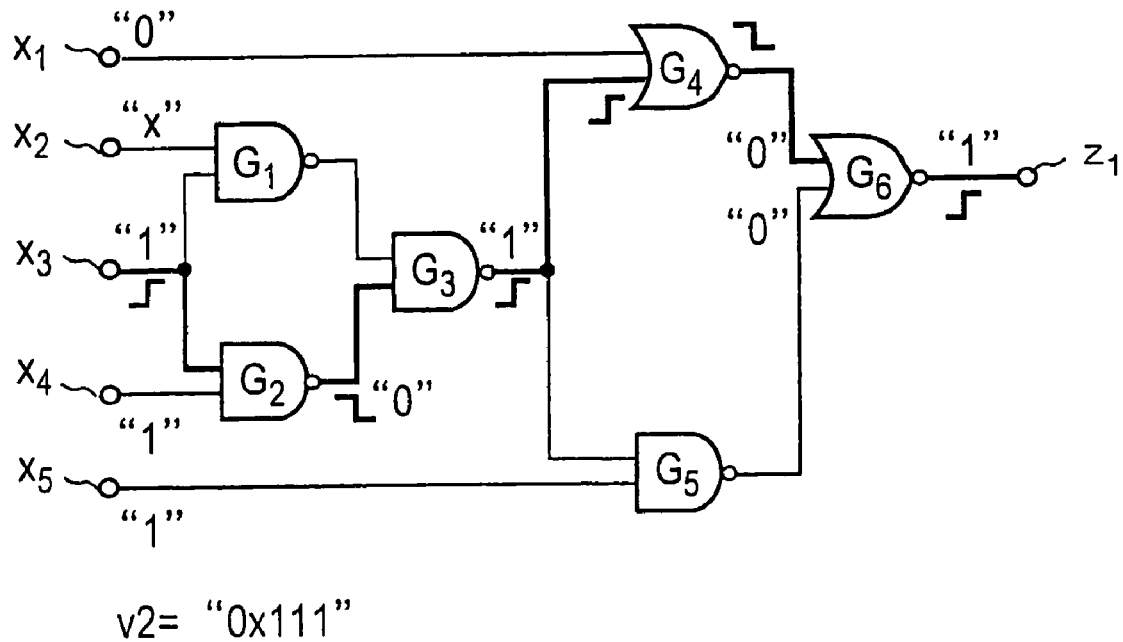
Figure 5A:
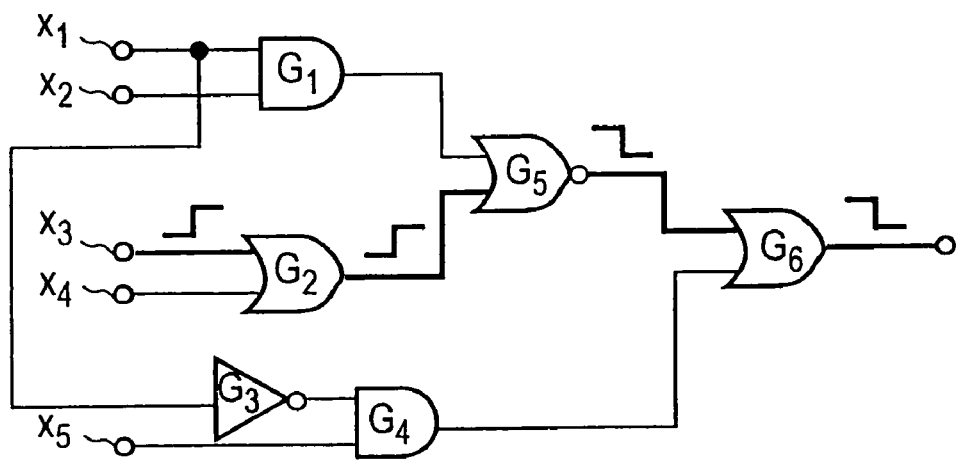
FIGS. 5a and 5b are circuit diagrams indicating logic waveforms illustrating an exemplary test pattern generating method of the prior art.
Figure 5B:
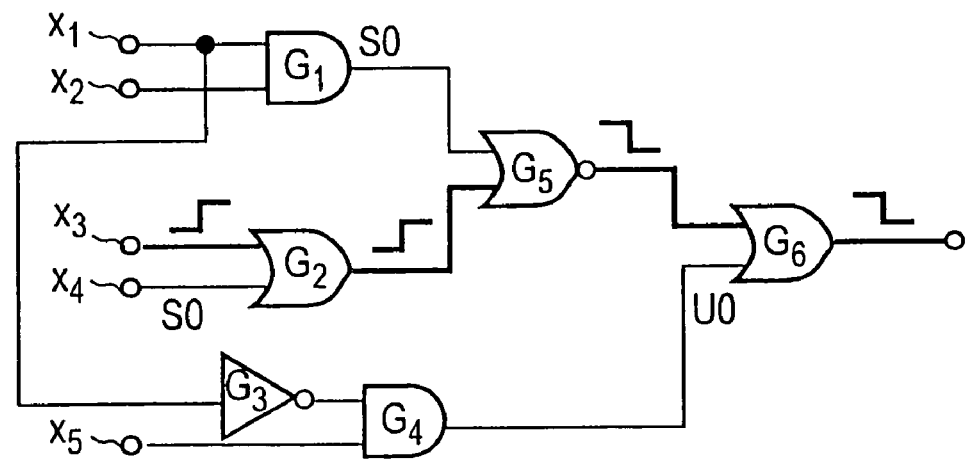
Figure 6:
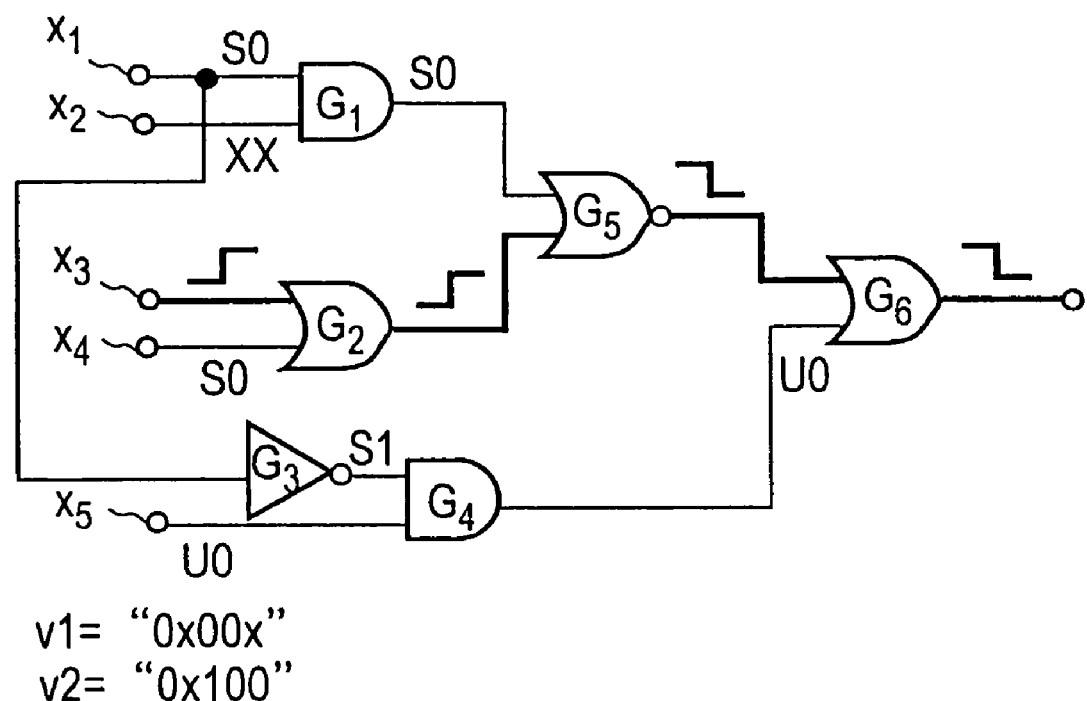
FIG. 6 is a circuit diagram of the circuit shown in FIGS. 5a and 5b, illustrating test patterns applied to the circuit and waveforms appearing therein.
Figure 7A:
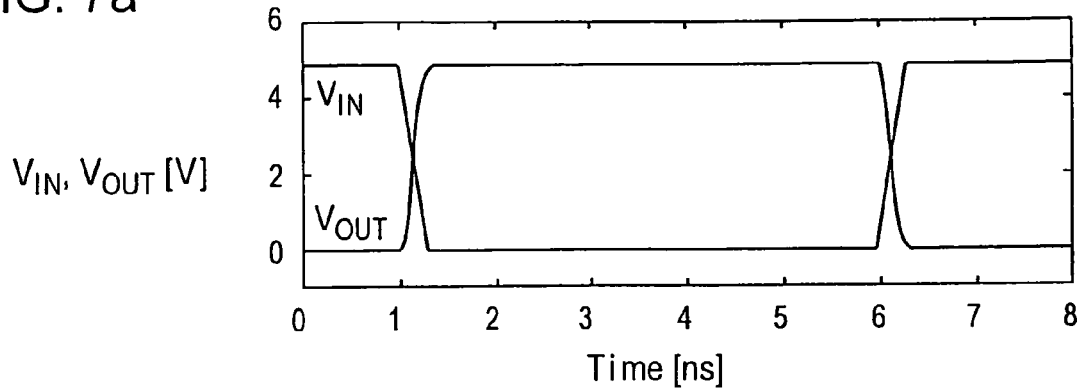
FIG. 7a graphically shows an input voltage $V_{IN}$ and an output voltage $V_{OUT}$ of a CMOS inverter plotted against time, FIG. 7b graphically shows an exemplary transient response of a power supply current $I_{DD}$.
Figure 7B:
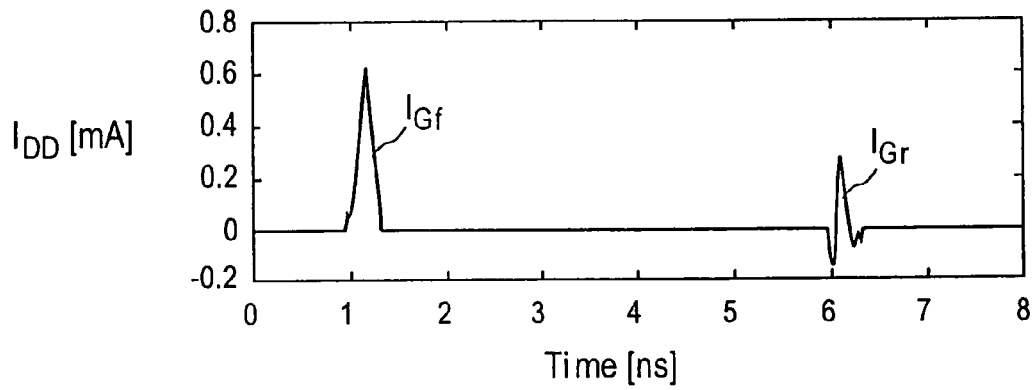
FIG. 7c is a circuit diagram of the MOS inverter circuit, also indicating a power supply current which flows upon a rising transition of the output.
FIG. 7d is a similar view to FIG. 7c, but indicating a power supply current which flows upon a falling transition of the output.
Figure 7C:
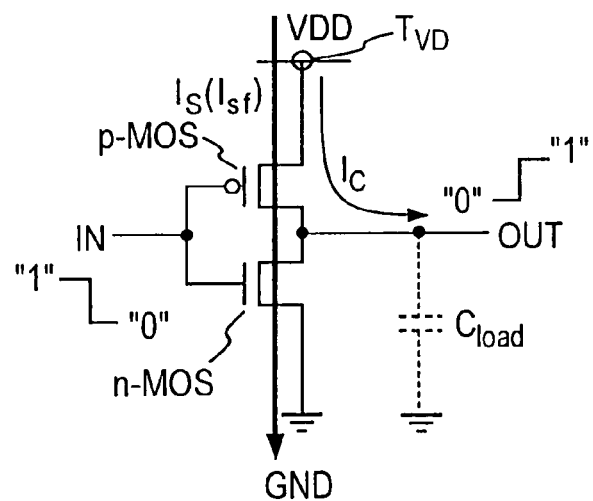
Figure 7D:
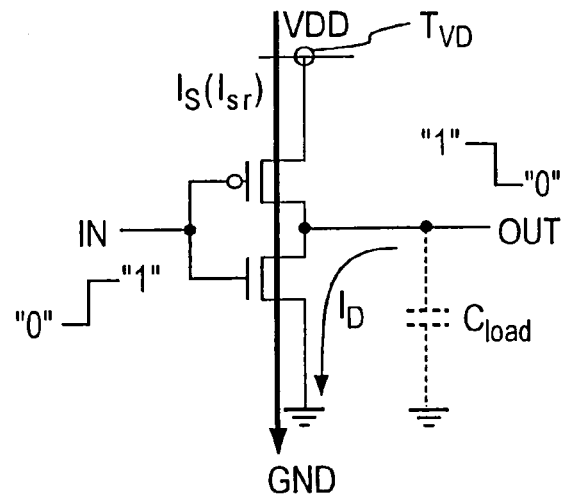
Figure 8A:
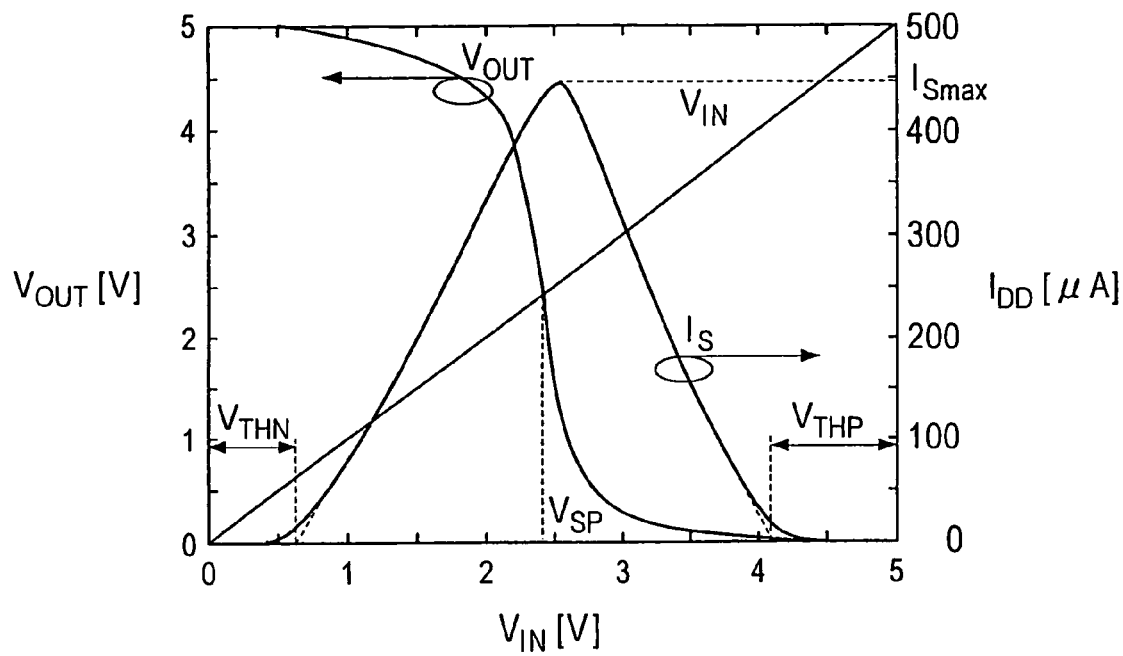
FIG. 8 graphically shows a typical example of a transient response of a CMOS logic gate, specifically FIG. 8a graphically showing an input voltage $V_{IN}$, an output voltage $V_{OUT}$ and a power supply current $I_S$ in the form of a transfer characteristic, and FIG. 8b illustrating an approximated waveform for the transient current.
Figure 8B:
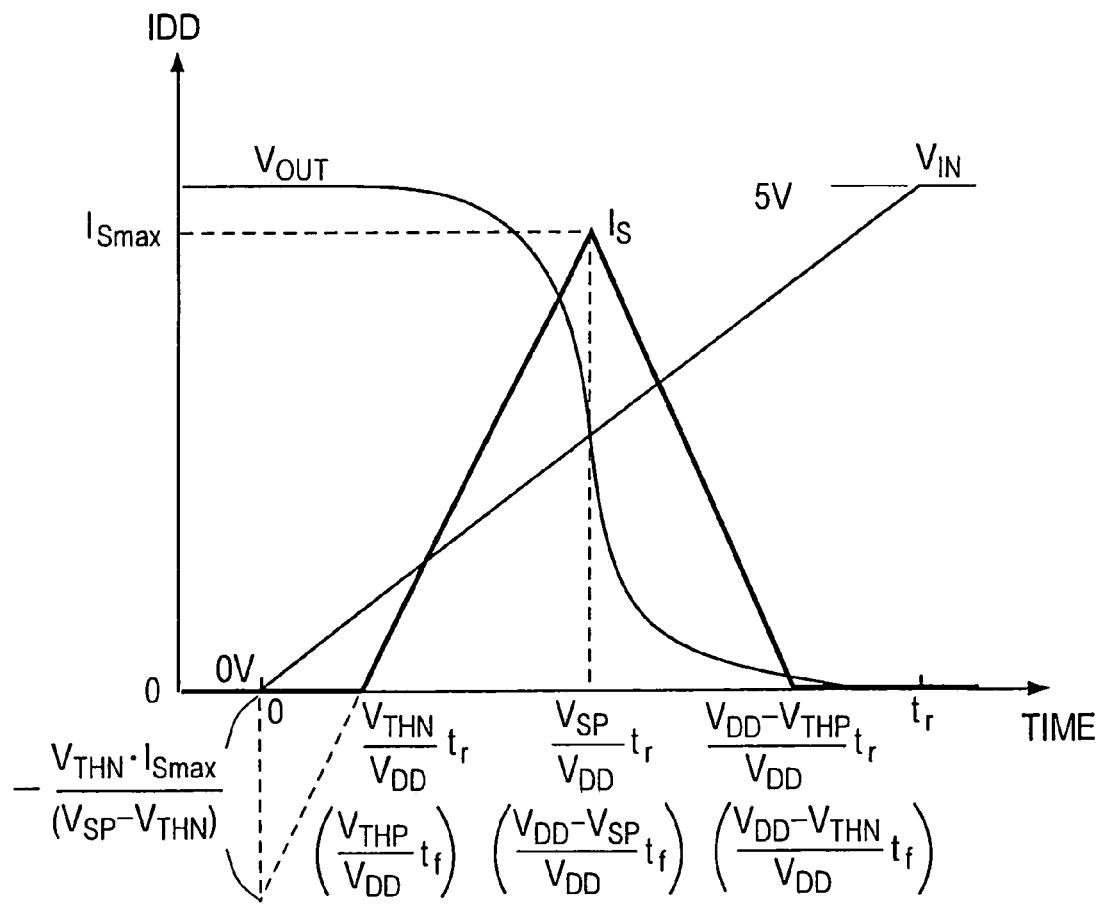
Figure 9A:
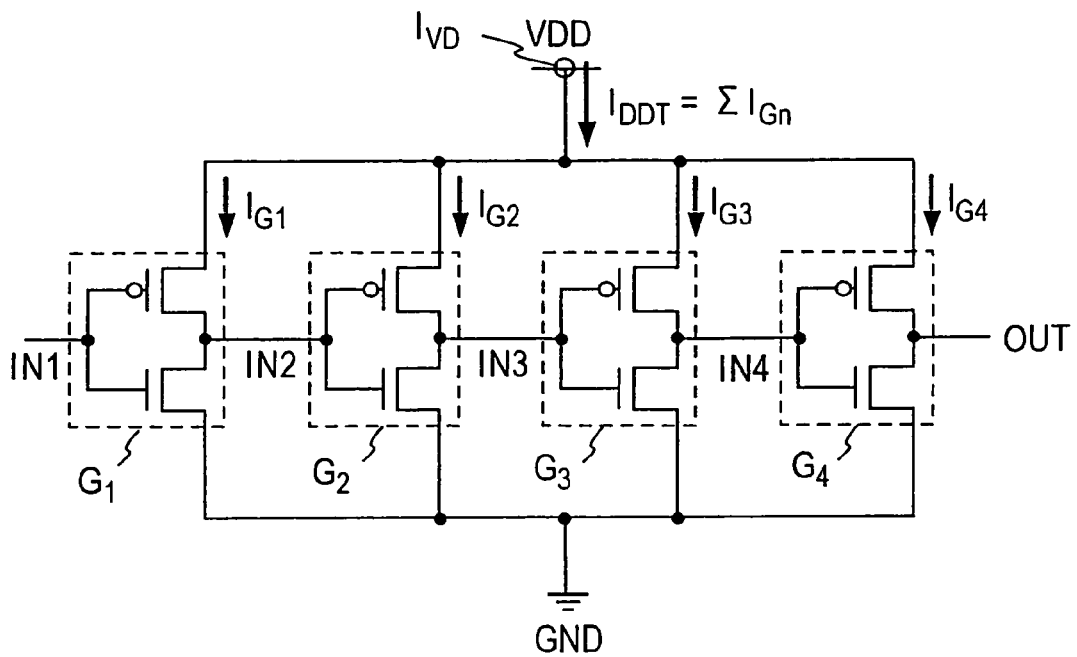
FIG. 9a is a circuit diagram of an exemplary CMOS integrated circuit, FIG. 9b graphically illustrates an input voltage to and an output voltage from the integrated circuit, plotted against time, and FIG. 9c graphically shows a corresponding transient power supply current response $I_{DDT}$ plotted against time.
Figure 9B:
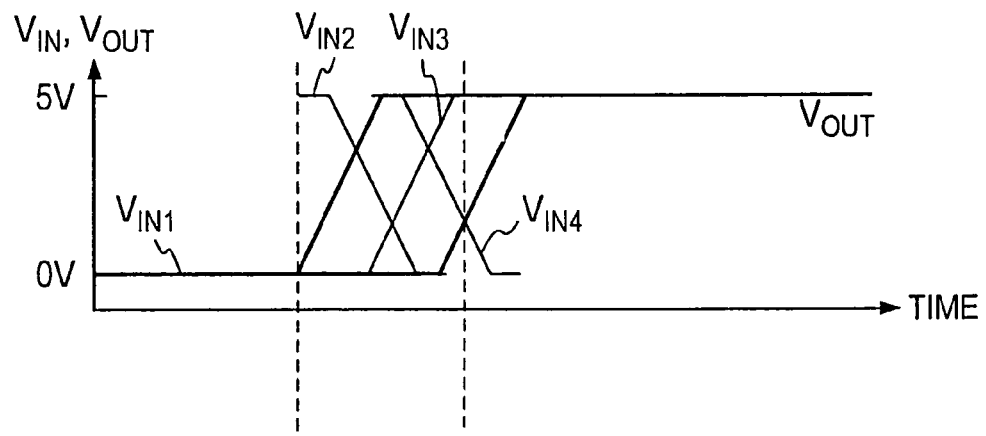
Figure 9C:
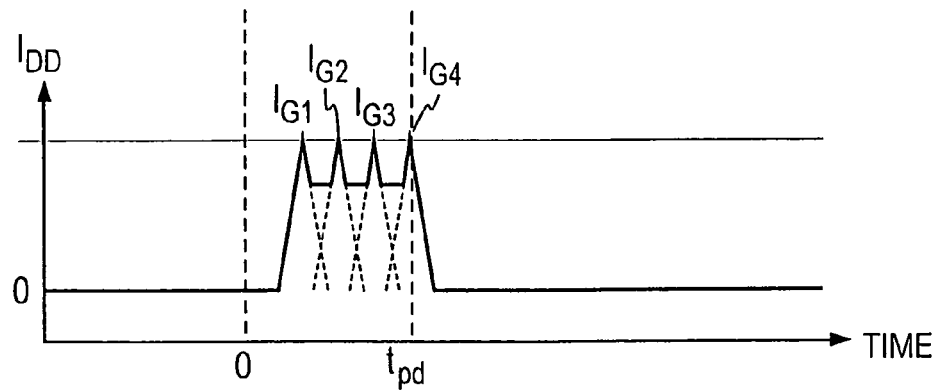
Figure 11A:
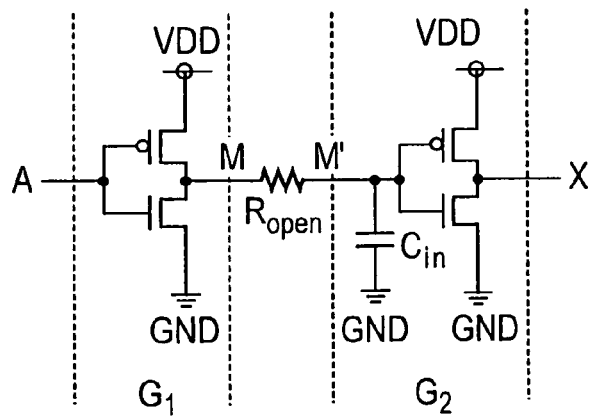
FIG. 11a is a schematic view of an exemplary CMOS integrated circuit having an open fault, and FIGS. 11b and 11c graphically show exemplary output waveforms in the absence and presence of an open fault.
Figure 11B:
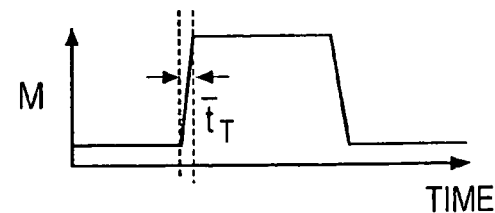
Figure 11C:
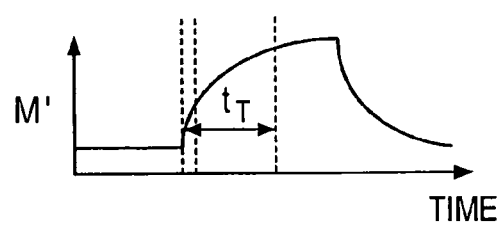
Figure 12:
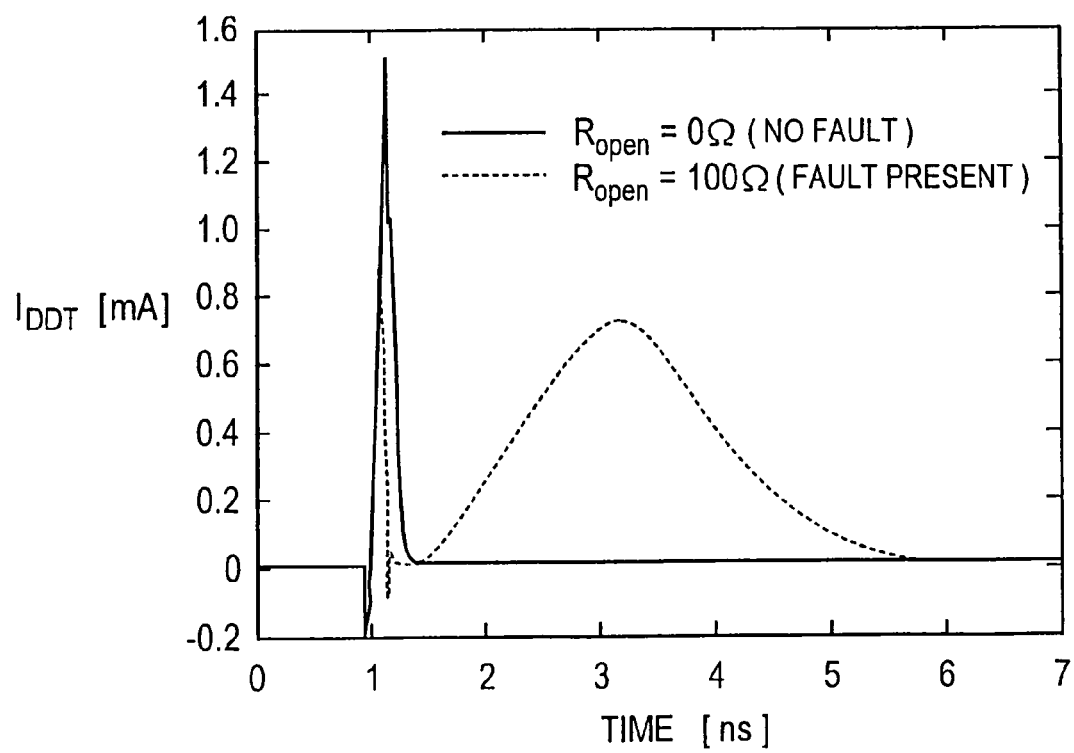
FIG. 12 graphically shows an exemplary transient power supply current response of a CMOS integrated circuit having an open fault.
Figure 13A:
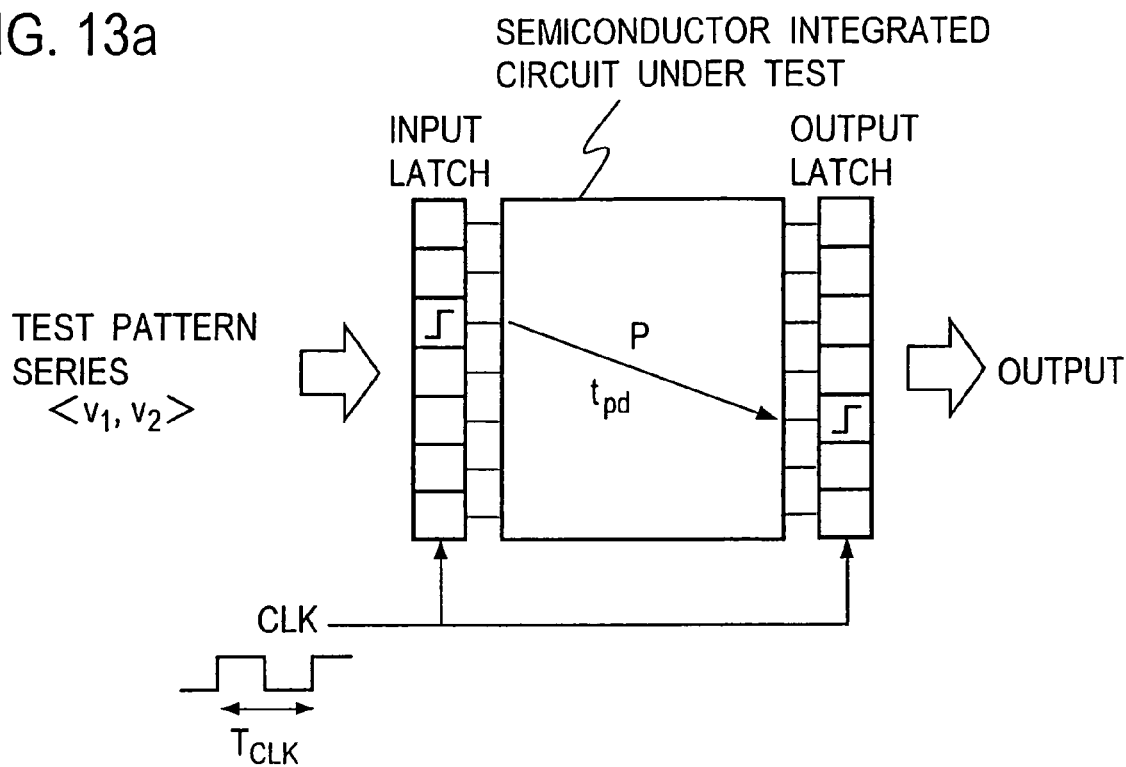
FIG. 13a is a schematic illustration of the fundamental principle of a path delay fault testing method, FIG. 13b graphically shows an input/output voltage
Figure 13B:
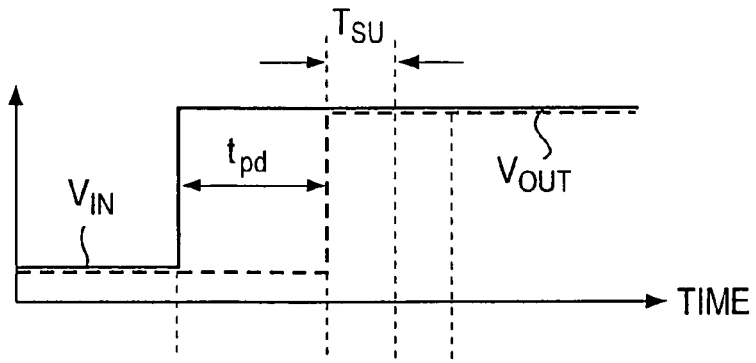
FIG. 13c illustrates a corresponding system clock.
Figure 13C:
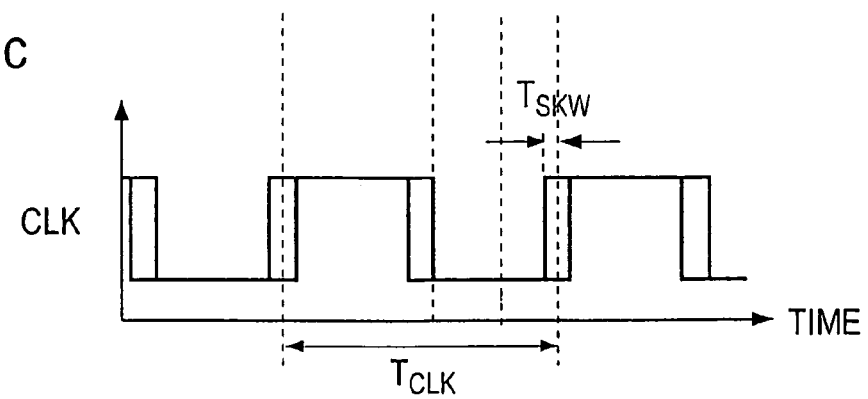
Figure 14:
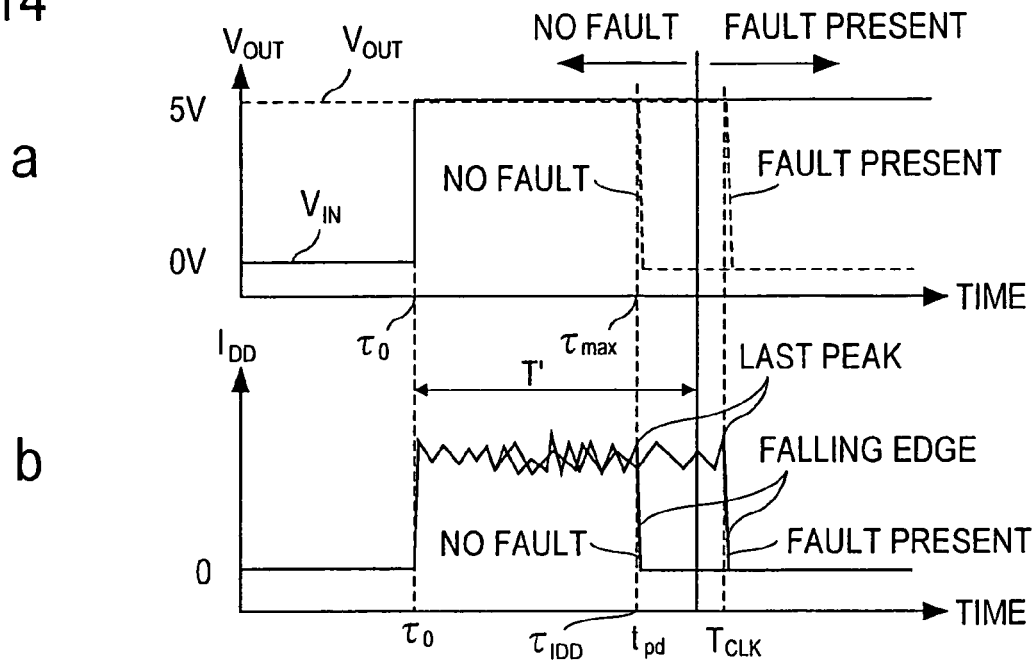
FIG. 14 illustrates the principle of the transient power supply current testing method which utilizes the pulse width of the transient power supply current, FIG. 14a graphically showing an input/output voltage plotted against time and FIG. 14b illustrating a transient power supply current plotted against time.
Figure 15:
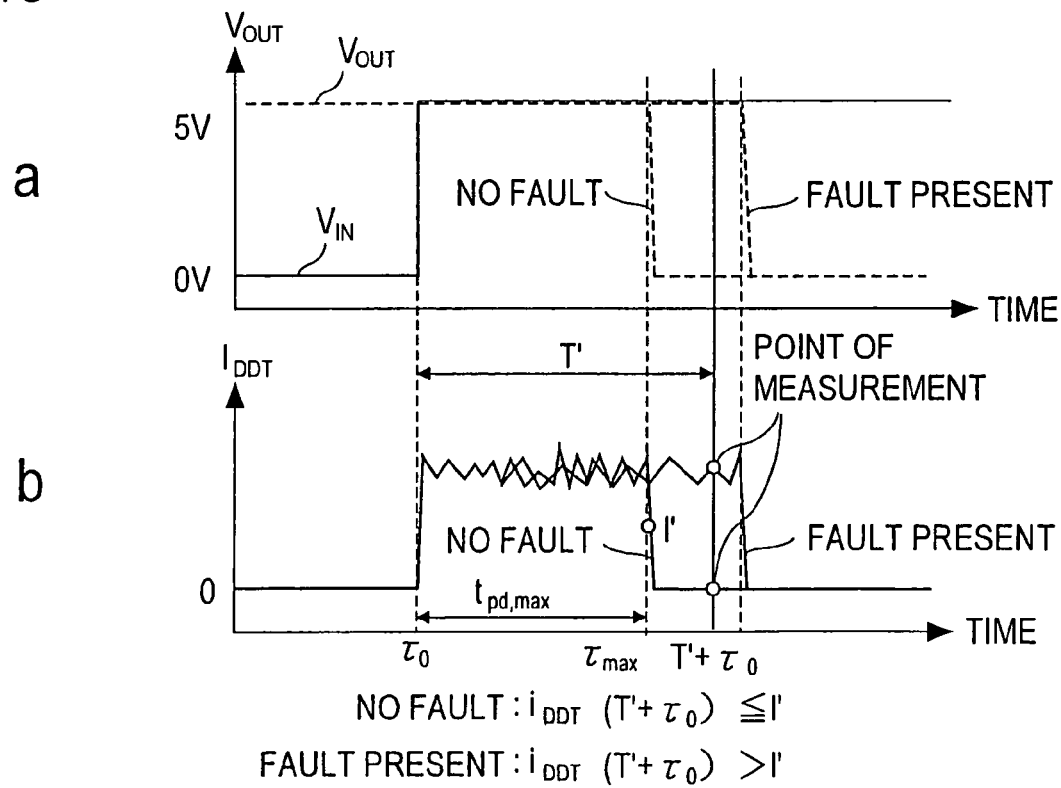
FIG. 15 is an illustration of the principle of the transient power supply current testing method which utilizes an instantaneous value of the transient power supply current, FIG. 15a graphically illustrating an input/output voltage plotted against time and FIG. 15b illustrating a transient power supply current plotted against time.
Figure 16A:
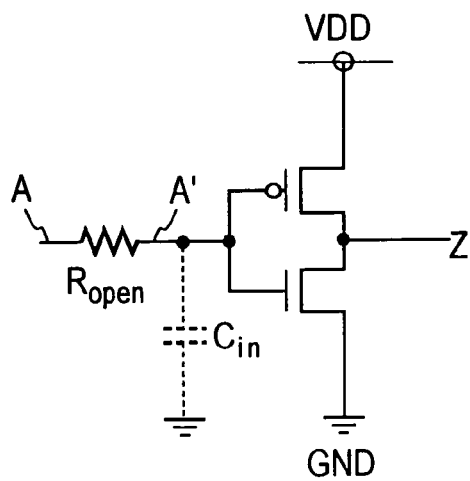
FIG. 16a is a schematic view of a model for a very small open fault which is present on an input signal line of a CMOS inverter, FIG. 16b graphically shows an exemplary output waveform when there is no fault and FIG. 16c graphically shows an exemplary output waveform when there is a fault.
Figure 16B:
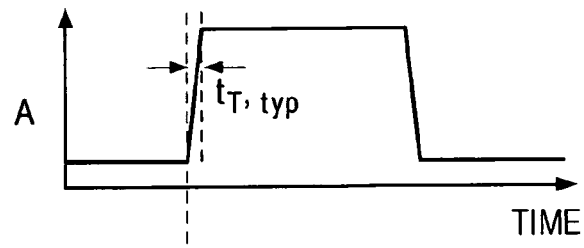
Figure 16C:
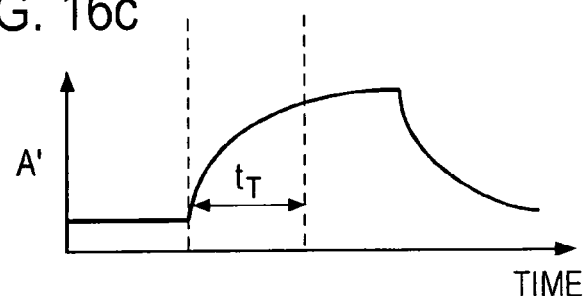
Figure 17:
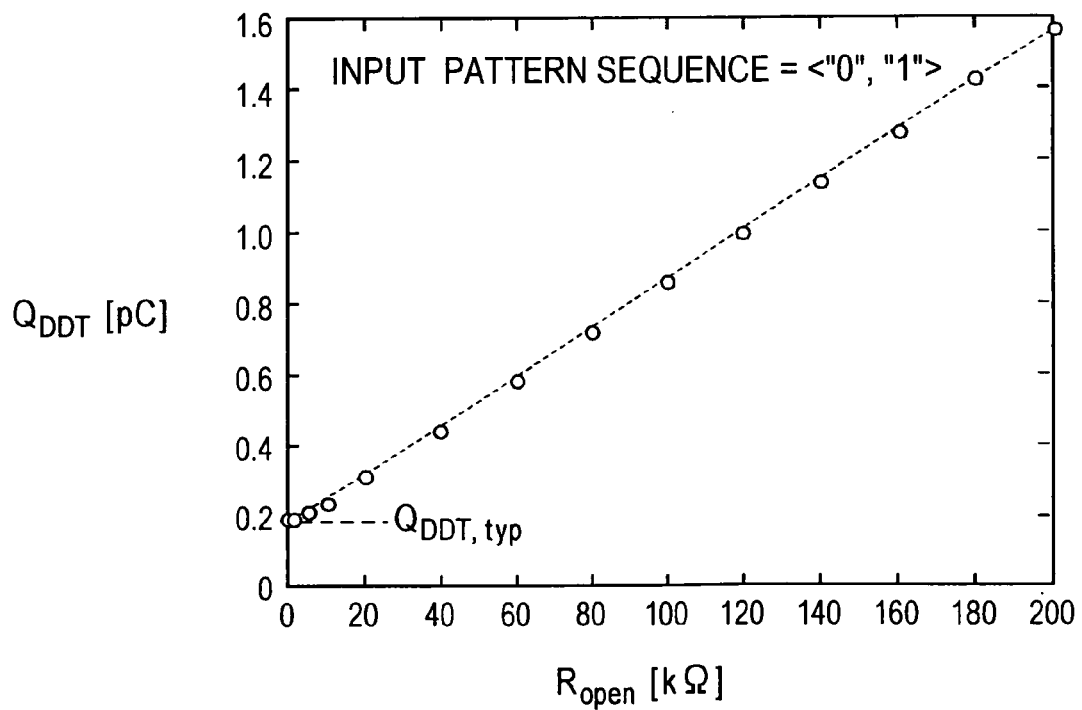
FIG. 17 graphically shows a change in the integral of the transient power supply current of the CMOS integrated circuit plotted against the resistance of a small open fault which is present in the CMOS integrated circuit.
Figure 18:
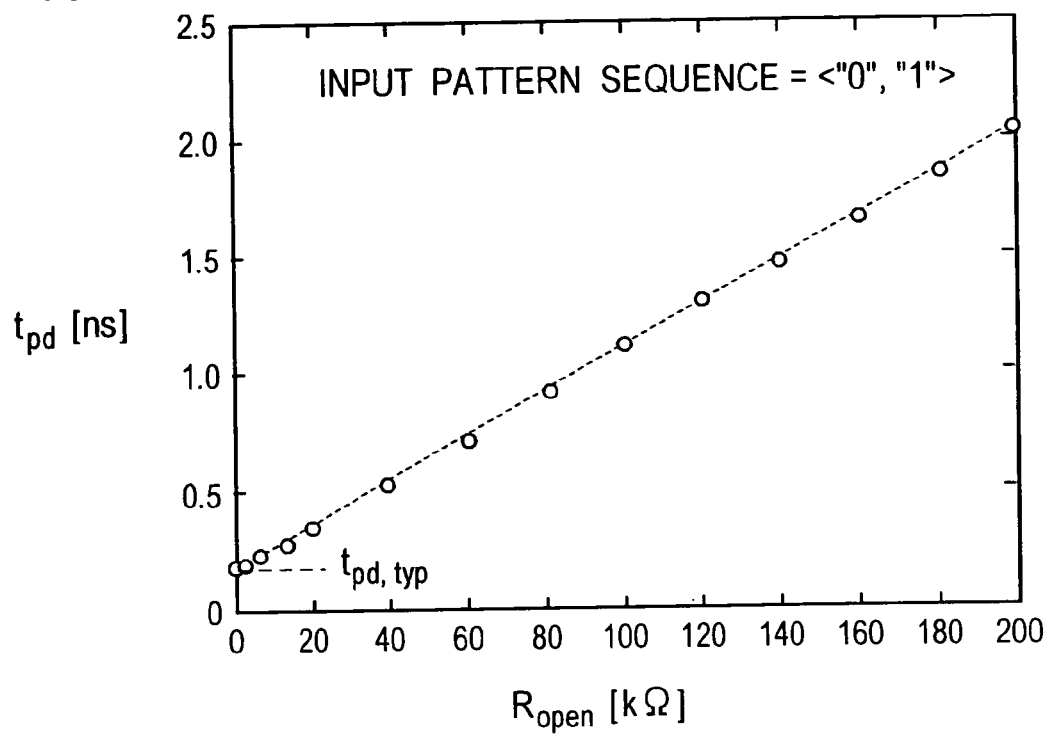
FIG. 18 graphically shows a change in the path delay time of a path under test plotted against the resistance of a very small open fault which is present on the path under test of the CMOS integrated circuit.
Figure 19:
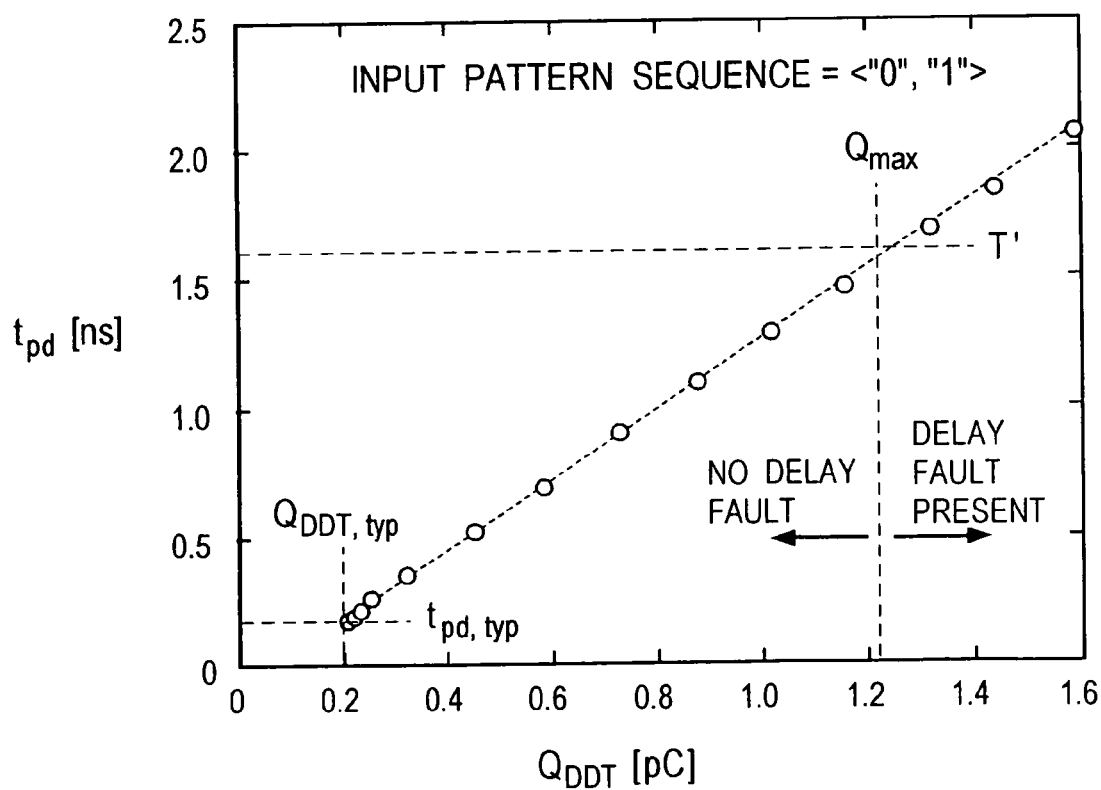
FIG. 19 graphically shows a linear relationship between the integral of the transient power supply current of the CMOS circuit and the path delay time of the path under test when the presence of a very small open fault is assumed on the path under test of the CMOS integrated circuit.
Figure 22:
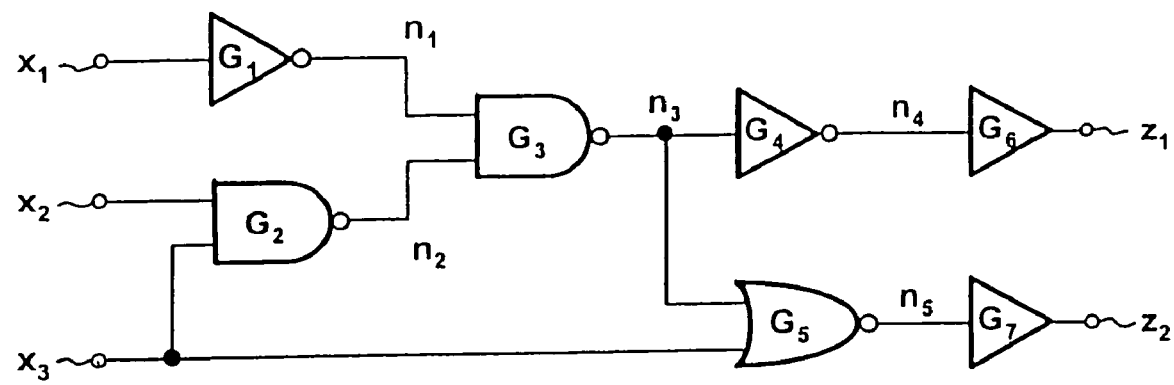
FIG. 22 is a circuit diagram of an exemplary CMOS integrated circuit under test which is used to illustrate $I_{DDT}$ fault simulation used in the test pattern generating method according to the first aspect of the present invention.
Figure 24:
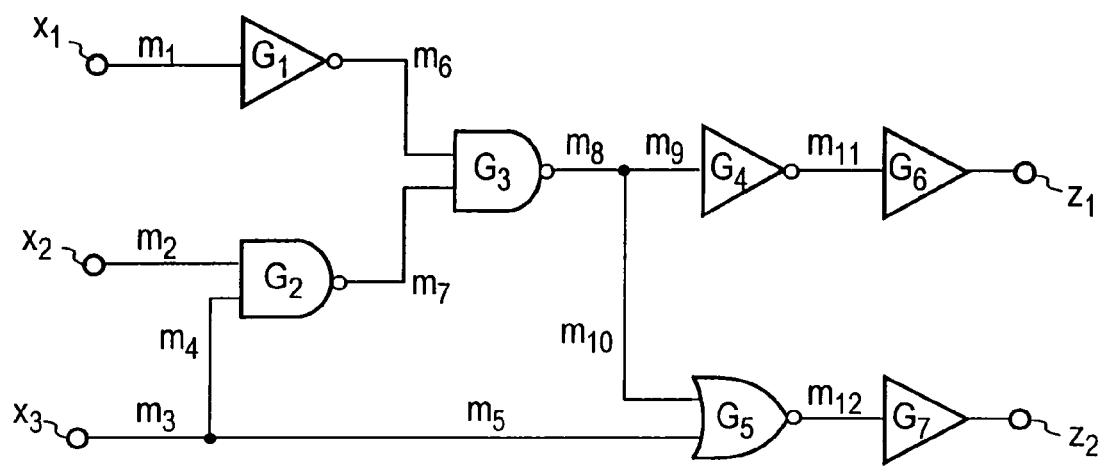
FIG. 24 is a circuit diagram of another exemplary CMOS integrated circuit under test which is used to illustrate $I_{DDT}$ fault simulation used in the test pattern generating method according to the first aspect of the present invention.
Figure 26:
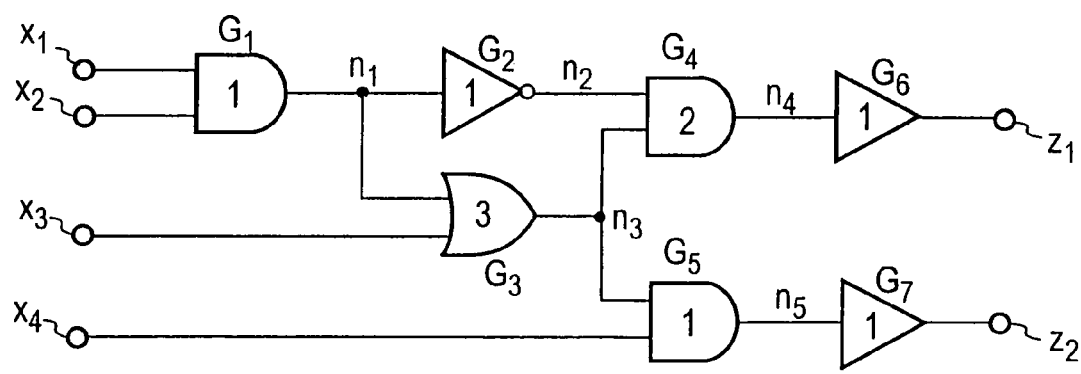
FIG. 26 is a circuit diagram of a CMOS integrated circuit under test which is used to illustrate a fault simulation method according to the second aspect of the present invention.
Figure 28A:
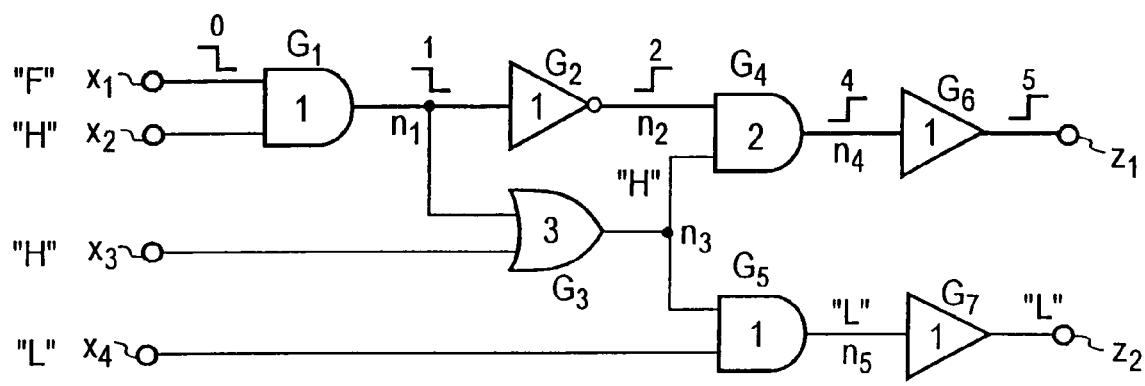
FIGS. 28a and 28b are similar circuit diagrams as shown in FIG. 26, but illustrating various signal waveforms entered in the circuit diagrams to describe the method according to the second aspect of the present invention utilizing the results of the fault simulation shown in FIG. 27.
Figure 28B:
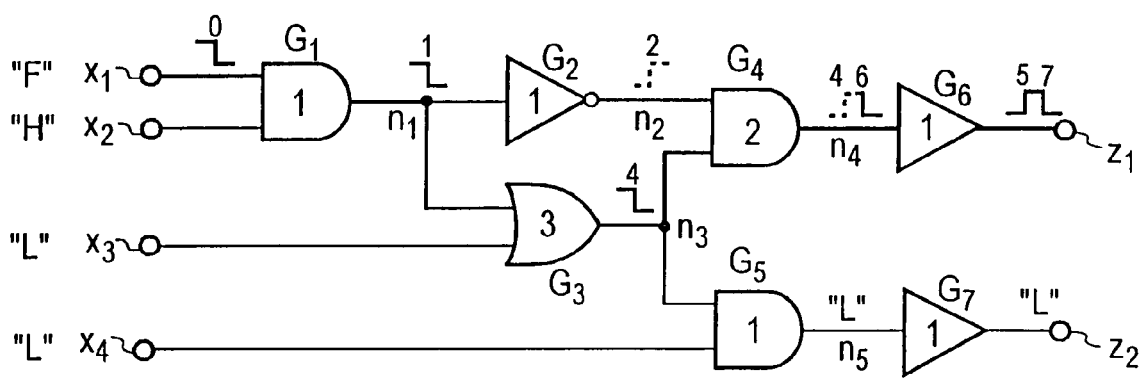

At step 2204, a confirmation is made to see whether or not an output transition signal from the logic gate which corresponds to the on-path input to the logic gate is a transition signal of the same kind as the final transition signal appearing on the output signal line of the logic gate. This confirmation is made to every logic gate which undergoes a switching operation a plurality of times. By way of example, the logic gate $G_4$ shown in FIG. 28b is an example which undergoes a switching operation a plurality of times. An output transition signal "F(6)" from the gate $G_4$ which corresponds to the input transition signal "F(4)" on the on-path input $n_3$ to the gate $G_4$ coincides with a final transition signal from the logic gate $G_4$, and accordingly, the on-path input $n_3$ satisfies the fault detection requirement according to the transient power supply current testing. At final step 2206, a confirmation is made to see whether or not any other unprocessed path delay fault exists. If an unprocessed path delay fault exists, a next possible path delay fault is presumed at step 2207 and the steps 2202, 2203, 2204, 2205 and 2206 are repeated. However, if there is no other unprocessed path delay fault, the operation is completed.

Figure 48:
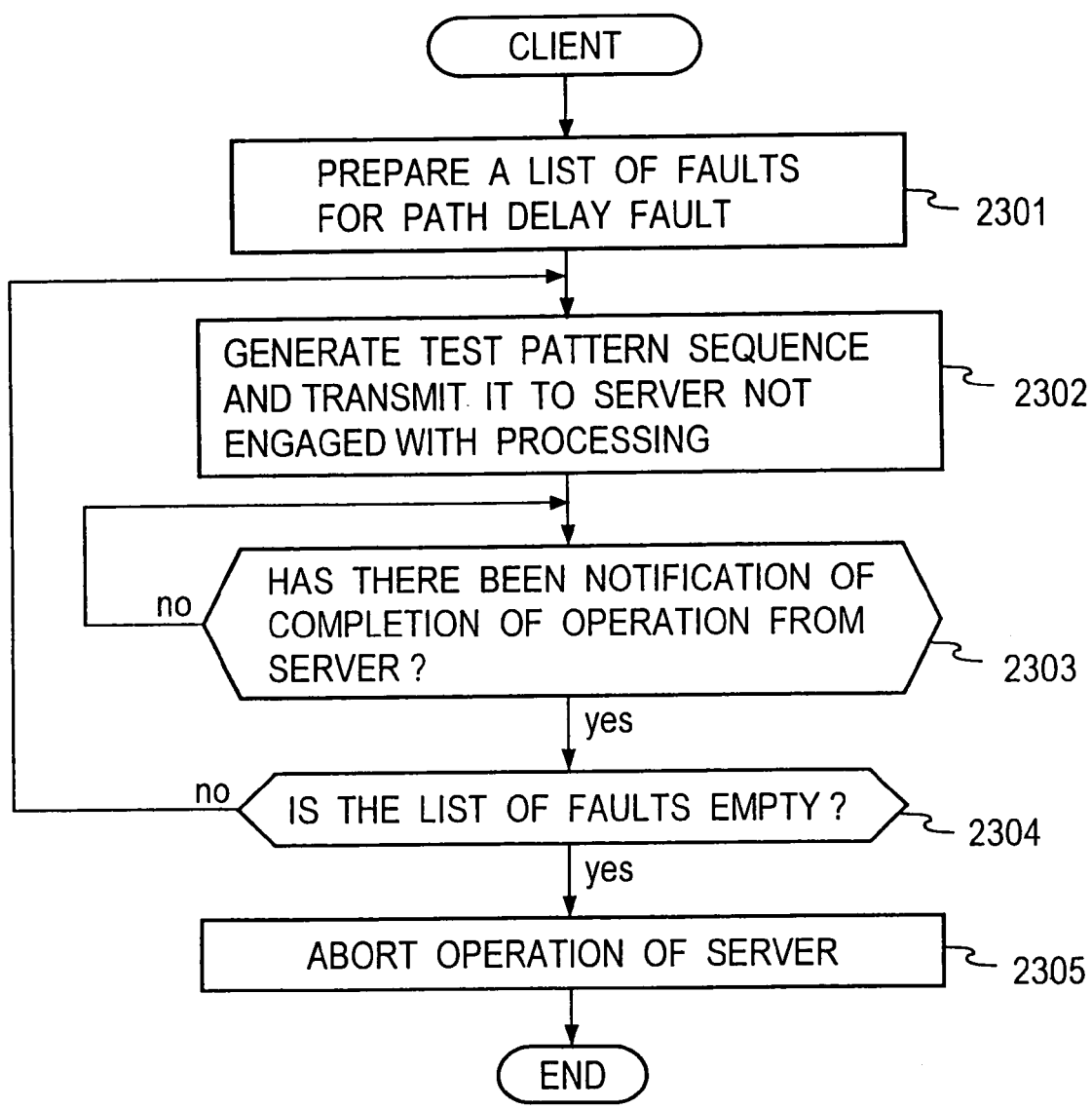
FIG. 48 is a flow chart of an exemplary processing procedure which occurs on the client side for the method according to the second aspect of the present invention.
Figure 49:
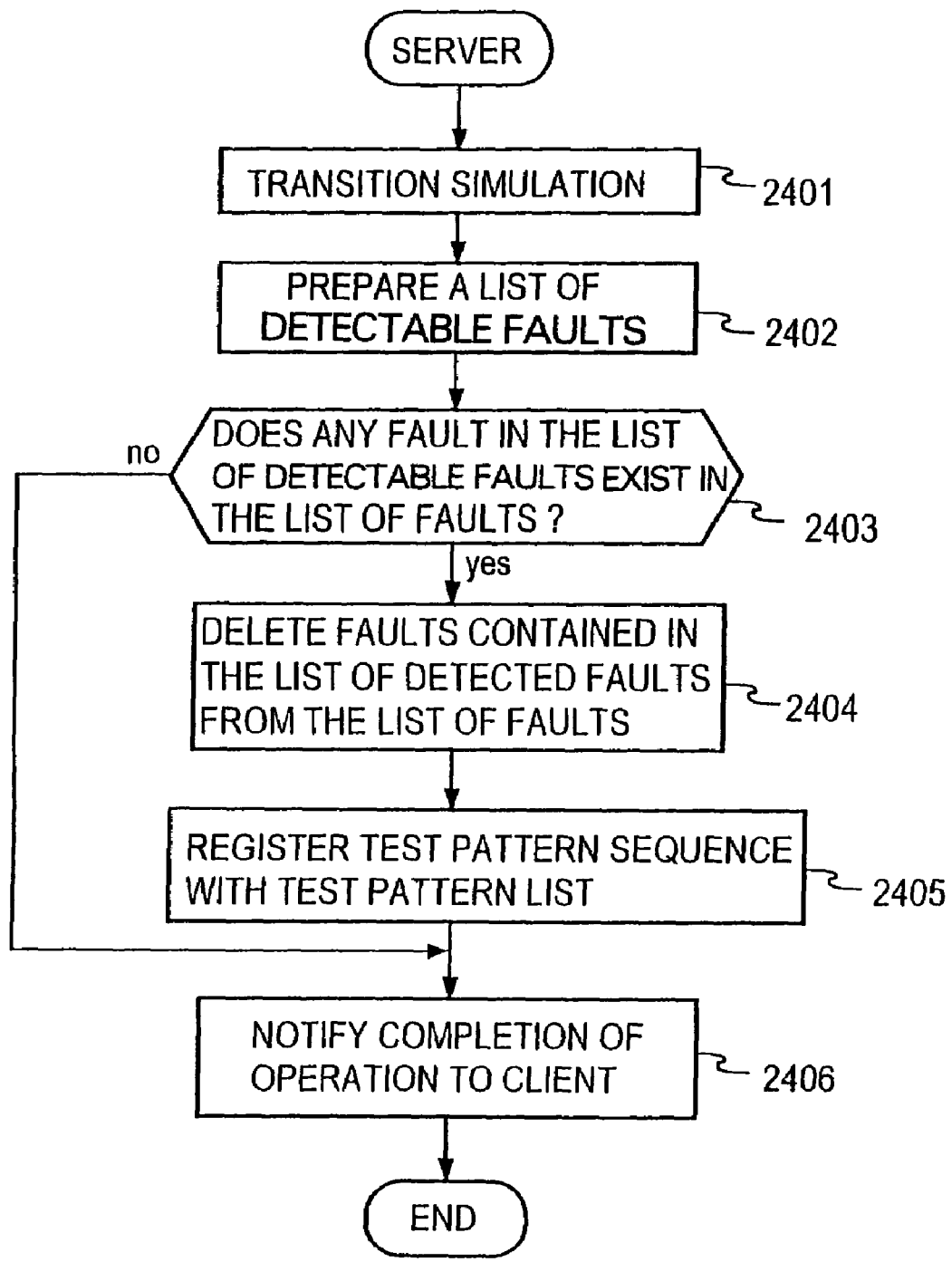
FIG. 49 is a flow chart of a processing procedure which occurs on the server side and associated with the client side processing procedure shown in FIG. 48.

FIGS. 48 and 49 show processing procedures followed by the client and the server, respectively, in another embodiment of the test pattern generating method according to the second aspect of the present invention. Referring to FIG. 48 showing the processing procedure followed by the client, it initially prepares a fault list in which every path delay fault possible with a semiconductor integrated circuit under test is registered at step 2301. At next step 2302, the client generates a test pattern sequence comprising two or more test patterns which is to be applied to the semiconductor integrated circuit, and transmits a test pattern sequence, one each for one or more servers which are not engaged with the processing operation. Subsequently, at step 2303, the client waits for a notification indicating the completion of operation from the plurality of servers. Upon receiving the notification, the operation of the client proceeds to step 2304. At step 2304, the client confirms whether or not the fault list is empty, and if the fault list is not empty, it repeats the steps 2302, 2303 and 2304. However, if the fault list is empty, it aborts the operation of every server at step 2305, thus ceasing to operate.

On the other hand, referring to FIG. 49, the server performs a transition simulation with the test pattern sequence which is transmitted from the client at step 2401, thus calculating a train of transition signal values appearing on signal lines within the semiconductor integrated circuit under test. At next step 2402, the server uses the transition signal values on various signal lines which are calculated by the transition simulation to prepare a fault list which can be detected by the transient power supply current testing which uses the test pattern sequence (a detectable fault list). At step 2403, the server confirms whether or not a fault or faults contained in the detectable fault list which is prepared at step 2402 exist in the fault list (which is prepared at step 2301 and) maintained by the client. If a fault or faults contained in the detectable fault list exist in the fault list, the operation proceeds to step 2404. However, if a fault contained in the detectable fault list does not exist in the fault list, the operation transfers to step 2406.

At step 2404, the server deletes a fault or faults contained in the detectable fault list from the fault list. At subsequent step 2405, the server registers the test pattern sequence with the test pattern sequence list which is maintained by the client. Finally, at step 2406, the server notifies the client the completion of its operation, thus ceasing to operate.

At step 2302 shown in FIG. 48 where a test pattern sequence is generated, two or more random patterns may be generated as a test pattern sequence, or one from a group of previously generated test pattern sequence may be selected. At step 2402 in FIG. 49 where a detectable fault list is prepared, such list may be prepared by using the technique of preparing a detectable fault list as illustrated in FIG. 47. At step 2304 shown in FIG. 48 where a confirmation is made to see if the fault list is empty, a decision may be rendered to complete the operation by confirming whether or not the number of faults which remain in the fault list has reduced below a given number (a threshold value). However, it is desirable that the threshold value be chosen as small as possible in order to improve the path delay fault detection rate for the semiconductor integrated circuit under test.

Figure 50:
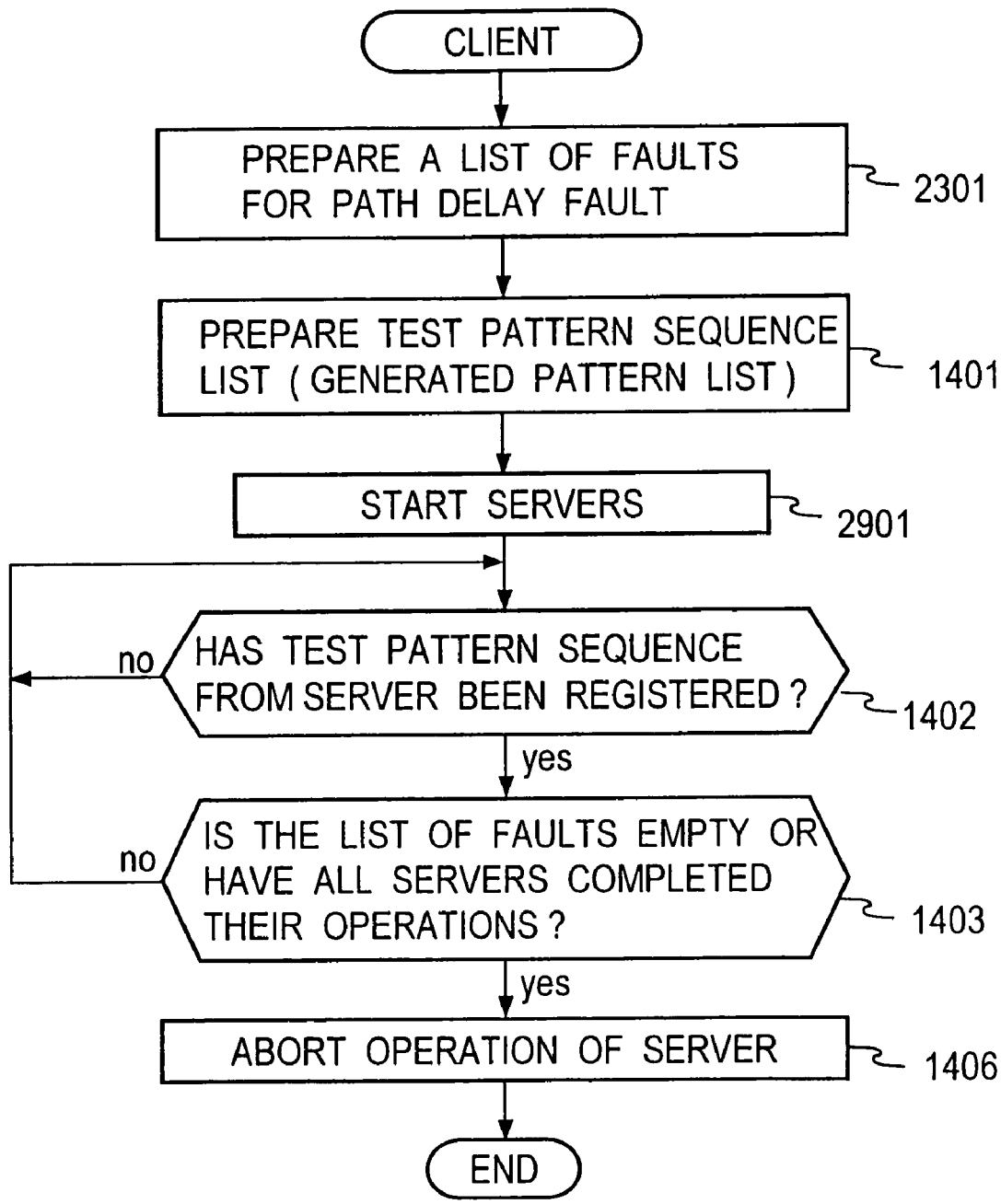
FIG. 50 is a flow chart of another processing procedure which occurs on the client side for the method according to the second aspect of the present invention.

An embodiment in which a server derives a test pattern sequence from a client for processing it when using a client and a plurality of servers which are operated according to the second aspect of the invention will now be described. A processing procedure followed by the client is shown in FIG. 50. At step 2301, a list of path delay faults for a semiconductor integrated circuit under test (a fault list) is prepared. Then follows a step 1401 where a generated pattern list or a list of test pattern sequence comprising two or more test patterns and which is applied to the semiconductor integrated circuit under test is prepared. At subsequent step 2901, the client activates a plurality of servers. At next step 1402, the client waits for test pattern sequence from the plurality of servers to be registered with a test pattern sequence list. At step 1403, the client repeats the steps 1402 and 1403 until the number of path delay faults which remain in the fault list is reduced below a given value or until all the servers cease to operate. When the fault list becomes empty or when the servers cease to operate, the client aborts the operation of each server at step 1406, thus ceasing to operate.

Figure 51:
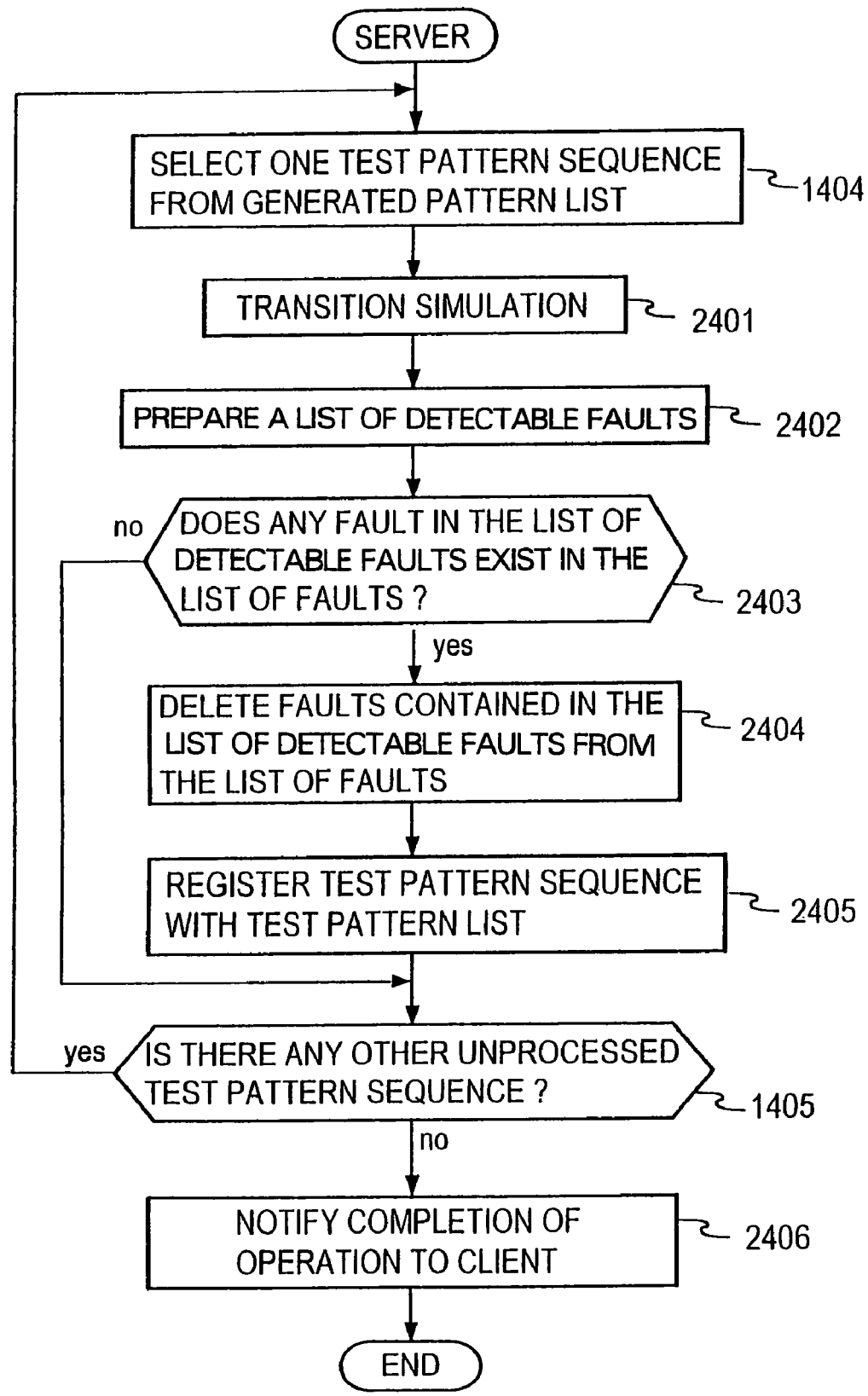
FIG. 51 is a flow chart of a processing procedure which occurs on the server and associated with the client side processing procedure shown in FIG. 50.

As shown in FIG. 51, when activated by the client, each server selects one of test pattern sequence from the generating pattern list which is maintained by the client at step 1404. Subsequently, the server executes steps 2401 to 2405 shown in FIG. 49 and prepares a fault list (a detectable fault list) which can be detected by the transient power supply current testing using the selected test pattern sequence, deletes these faults from the fault list maintained by the client, and registers the test pattern sequence with the test pattern sequence list maintained by the client. Subsequently, at step 1405, the server examines if there exists a test pattern sequence which is not yet selected in the generated pattern list of the client. If such test pattern sequence exists, the operation returns to step 1404, but if such test pattern sequence does not exist, the operation proceeds to step 2406 where it ceases to process the test patterns generated and notifies the client the completion of its operation.

Figure 52:
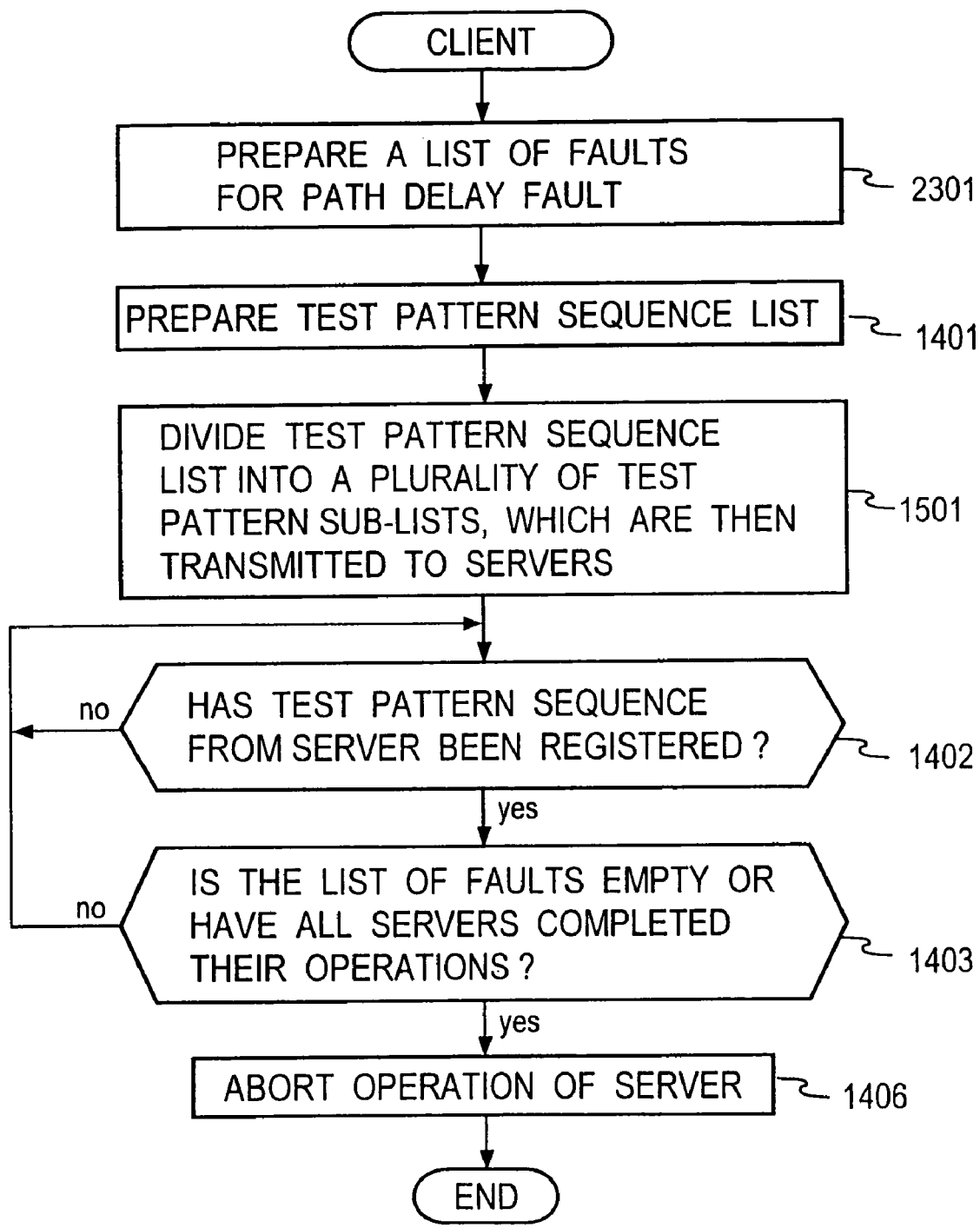
FIG. 52 is a flow chart of a further processing procedure which occurs on the client side for the method according to the second aspect of the present invention.
Figure 53:
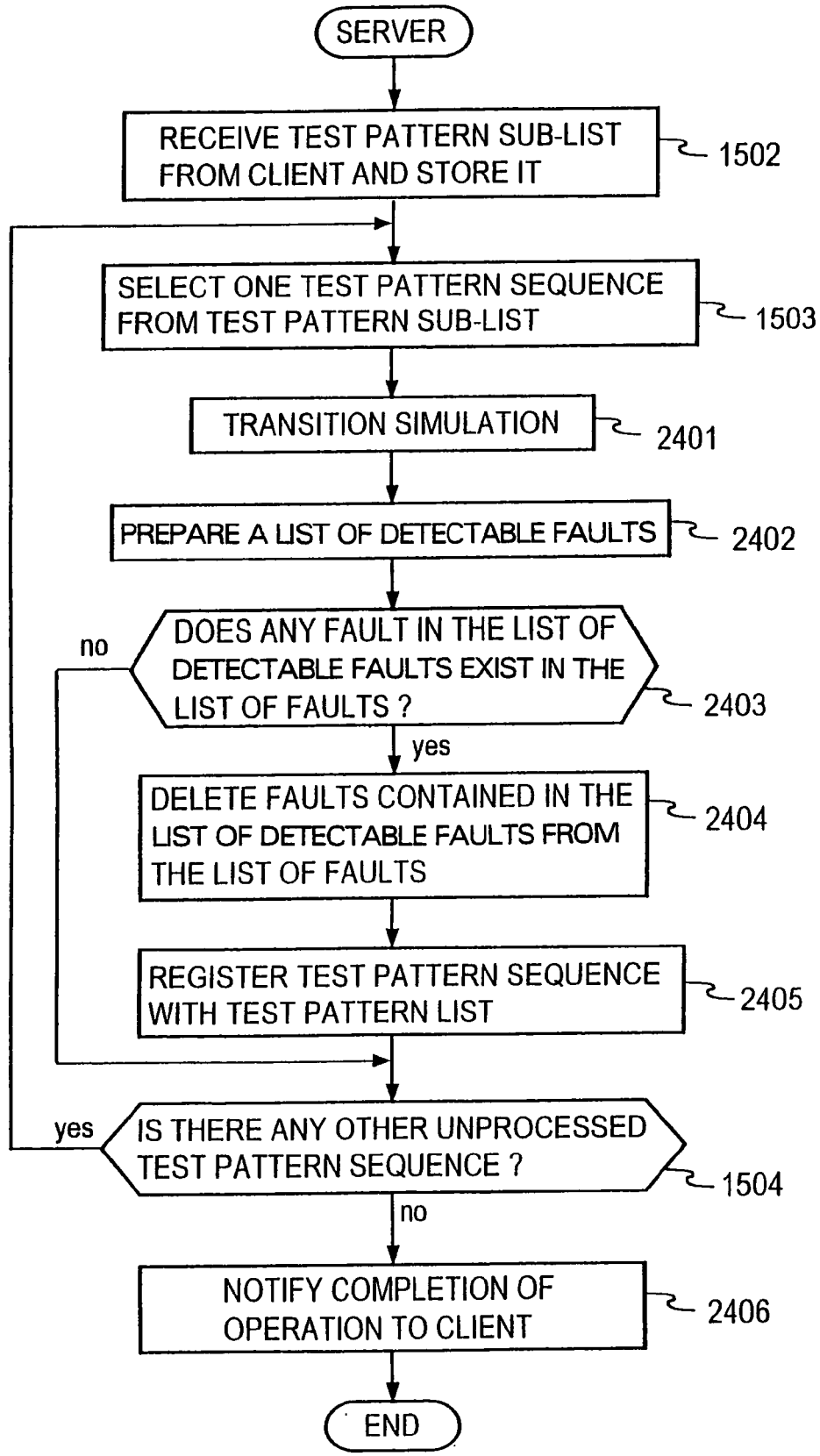
FIG. 53 is a flow chart of a processing procedure which occurs on the server side and which is associated with the client side processing procedure shown in FIG. 52.

In another embodiment in which the generation of a test pattern sequence which is used to detect a path delay fault is shared by a client and a plurality of servers, a processing procedure followed by the client is shown in FIG. 52 and a processing procedure followed by the server is shown in FIG. 53. In a similar manner as shown in FIG. 50, the client prepares a list of path delay faults and prepares a list of test pattern sequence (a generated pattern list) at steps 2301 and 1401. In this embodiment, the list of test pattern sequence (or the generated pattern list) is divided into a plurality of pattern sequence sub-lists at step 1501, thus transmitting the pattern sequence sub-lists to the servers in a distributed manner so that each server receives one sub-list. The subsequent operation tales place in the similar manner as shown in FIG. 50. On the other hand, referring to FIG. 53, the server receives the test pattern sequence sub-list from the client at step 1502, once stores it in its memory, and selects one test pattern sequence from the test pattern sequence sub-list at step 1503. Subsequently, the server executes steps 2401 to 2405 shown in FIG. 51, and then examines whether there exists any test pattern sequence which is not yet processed in the test pattern sequence sub-list which is stored in the memory. If an unprocessed test pattern sequence exists, the operation returns to step 1503, but if it does not exist, the server notifies the client the completion of its operation the step 2406. In FIGS. 46, 49 and 51, it is to be noted that the deletion from the fault list and the registration to the test pattern sequence list may be interchanged in order.

Figure 54:
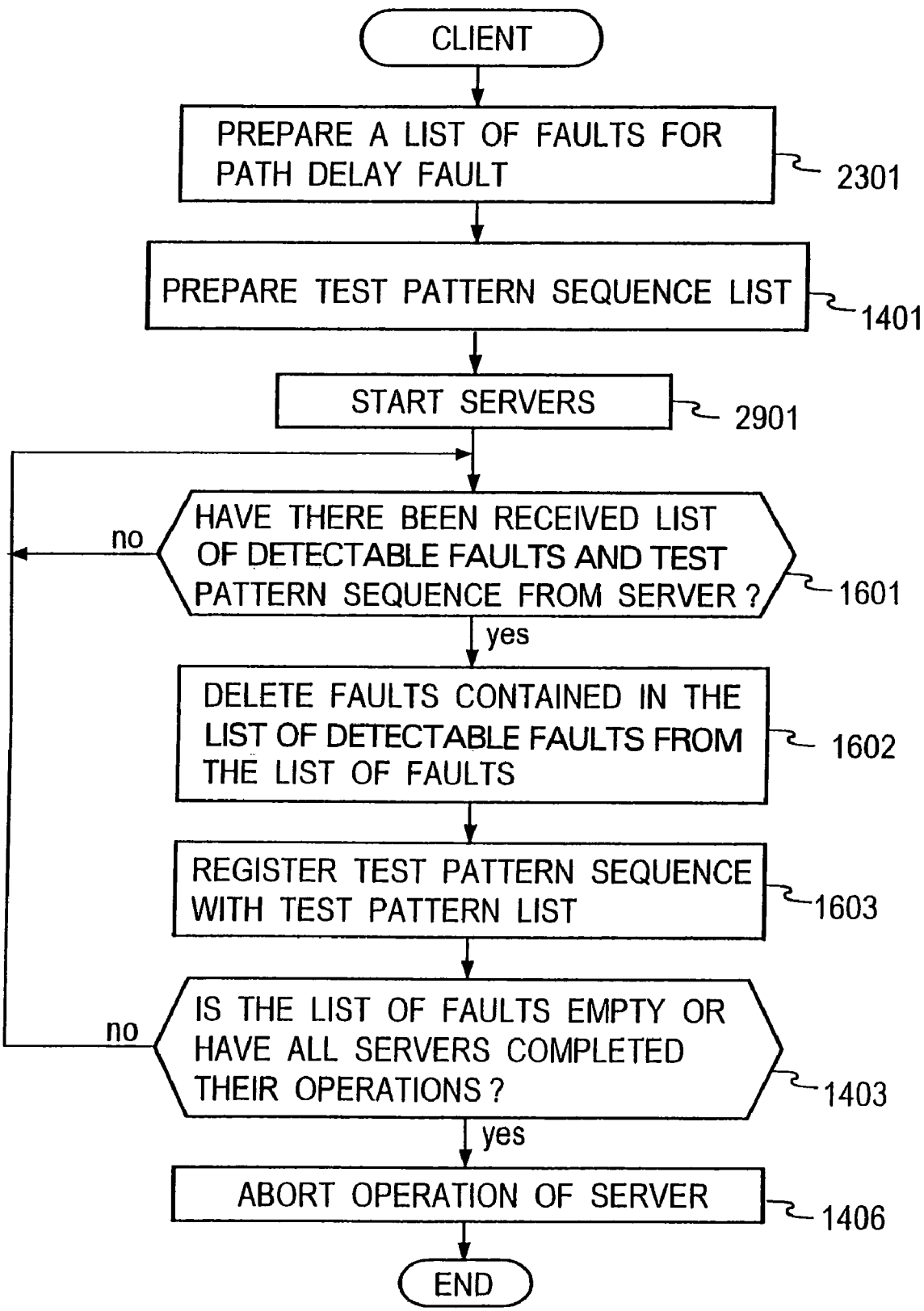
FIG. 54 is a flow chart of still another processing procedure which occurs on the client side for the method according to the second aspect of the present invention.
Figure 55:
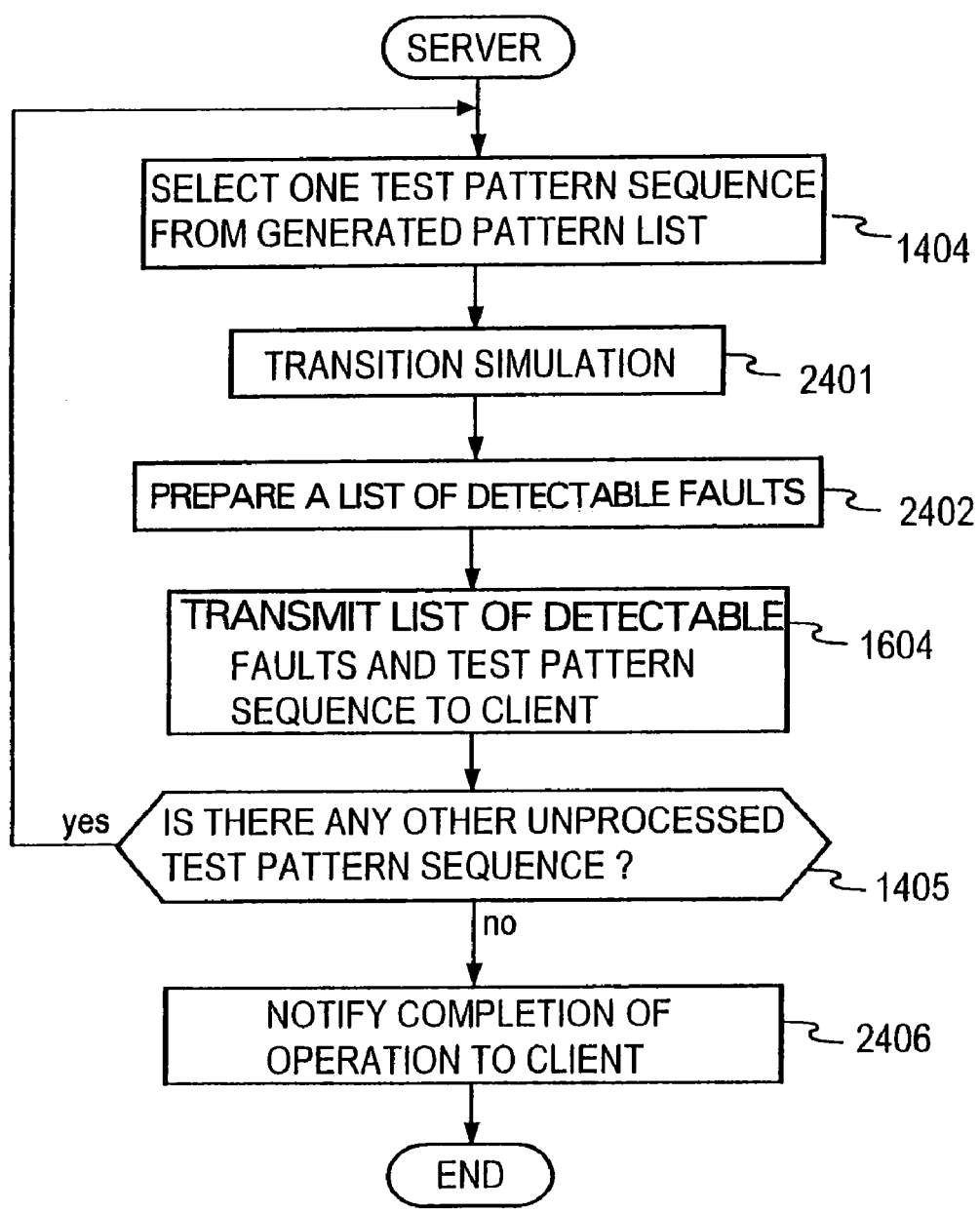
FIG. 55 is a flow chart of a processing procedure which occurs on the server side and which is associated with the client side processing procedure shown in FIG. 54.

In FIGS. 49, 51 and 53, the deletion of faults from the fault list maintained by the client and the registration of a test pattern sequence with the test pattern sequence list are performed by the server, as indicated at steps 2404 and 2405, but the detectable fault list and the test pattern sequence which is used in preparing the list may be transmitted to the client at each of these steps so that the client performs the deletion of faults and the registration with the test pattern sequence list. An example in which the embodiment of FIGS. 50 and 51 is modified in this manner is shown in FIGS. 54 and 55. As shown in FIG. 54, after activating the servers at step 2901, the client waits for the reception of the detectable fault list and test pattern sequence from the servers at step 1601. Upon reception of these, the client deletes a fault or faults contained in the received detectable fault list from the fault list at step 1602, and registers the received test pattern sequence with a test pattern sequence list at step 1603 and then proceeds to step 1403.

As shown in FIG. 55, upon preparing the detectable fault list at step 2402, the operation of the server proceeds to step 1604 where the prepared detectable fault list and a test pattern sequence which is used in this preparation are transmitted to the client, subsequently proceeding to step 1405.

While the use of the client in the deletion and registration is not illustrated in the embodiment shown in FIGS. 48 and 49, upon preparing the detectable fault list at step 2402 in FIG. 49, the server immediately transfers to step 2406 and transmits the detectable fault list and the test pattern sequence which is used in the preparation to the client together with the notification indicating the completion of its operation. In response thereto, the client, upon receiving the notification of the completion of operation at step 2303 shown in FIG. 48, performs the deletion of faults in accordance with the detectable fault list which is received as well as the registration of the received test pattern sequence before transferring to step 2304.

When modifying the embodiment shown in FIGS. 52 and 53 so that the client performs the deletion and registration, such modification may take place in a similar manner as a modification from FIGS. 50 and 51 to FIGS. 54 to 55.

In FIGS. 49, 51 and 53, the server deletes faults contained in the detectable fault list from the list of fault maintained by the client while the client registers the test pattern sequence with a test pattern sequence list maintained by it, but the server may transmit the detectable fault list and a test pattern sequence to the client, which may then perform the deletion and the registration.

Figure 56:
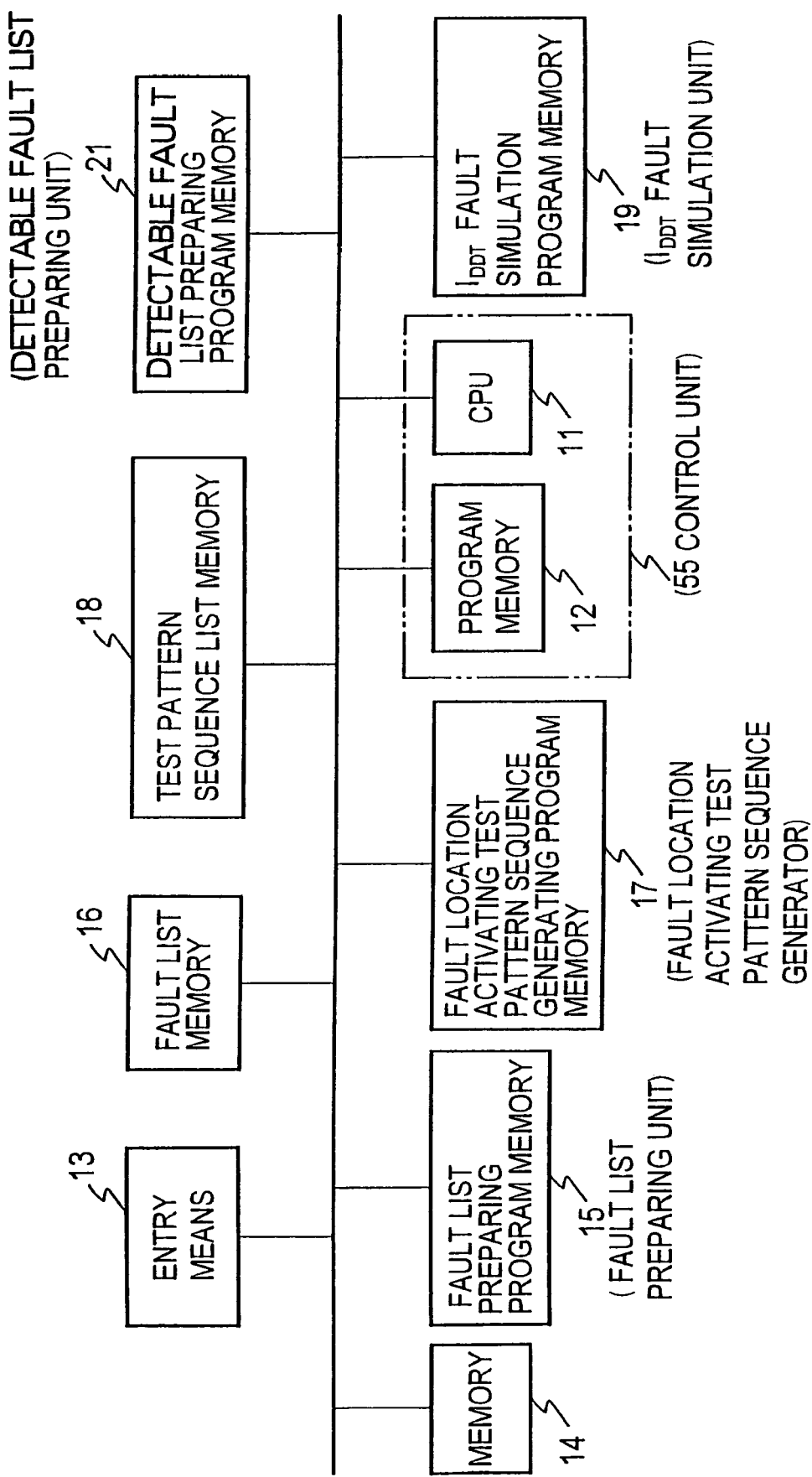
FIG. 56 is a block diagram showing an exemplary functional arrangement of an apparatus which implements the method according to the first aspect of the present invention.

The test pattern generation mentioned above may be performed by a computer, for example. By way of example, an apparatus which executes the method according to the first aspect of the present invention is shown in FIG. 56. As shown, CPU 11 executes a program stored in a memory 12 to control the overall operation. Initially, entry means 13 downloads circuit information of a circuit under test, for example, which is momentarily stored in a memory 14. A program for preparing a fault list which is stored in a memory 15 is then executed to derive a fault list, which is stored in a further memory 16. One of the faults is then selected from the fault list stored in the memory 16 in the manner mentioned above. A program which determines, by the implication operation, a test pattern sequence intended to activate a location corresponding to the selected fault and to cause a signal therefrom to be propagated to a next logic gate which follows the fault location, either by generating an initialization test pattern v1 and a propagation test pattern v2 or by applying signal values according to the five value logic system is stored in a memory 17, and is then read out therefrom to be executed, and a resulting test pattern sequence is registered with a test pattern sequence list which is stored in a memory 18. Thereafter, a subsequent selected fault is chosen from the fault list stored in the memory 16.

For the embodiment shown in FIGS. 36 and 37, $I_{DDT}$ fault simulation with a test pattern sequence which is registered or to be registered with the list of test pattern sequence stored in the memory 18 is performed by executing a program stored in a memory 19, and a program for preparing a detectable fault list which is stored in a memory 21 is executed to prepare a fault list which can be detected with this test pattern sequence. This list is momentarily stored in RAM within the CPU 11, and a function of deleting such a fault or faults from the fault list stored in the memory 16 is added.

As indicated in parentheses in FIG. 56, a test pattern generating apparatus may comprise a fault list preparing unit 15, a faulty location activating test pattern sequence generator 17, $I_{DDT}$ fault simulation program memory 19, a detectable fault list preparing unit 21, a control unit 55, a fault list memory 16 and a test pattern sequence list memory 18. The control unit 55 exercises a control over other units to perform a series of processing operations associated with generating test patterns.

Figure 57:
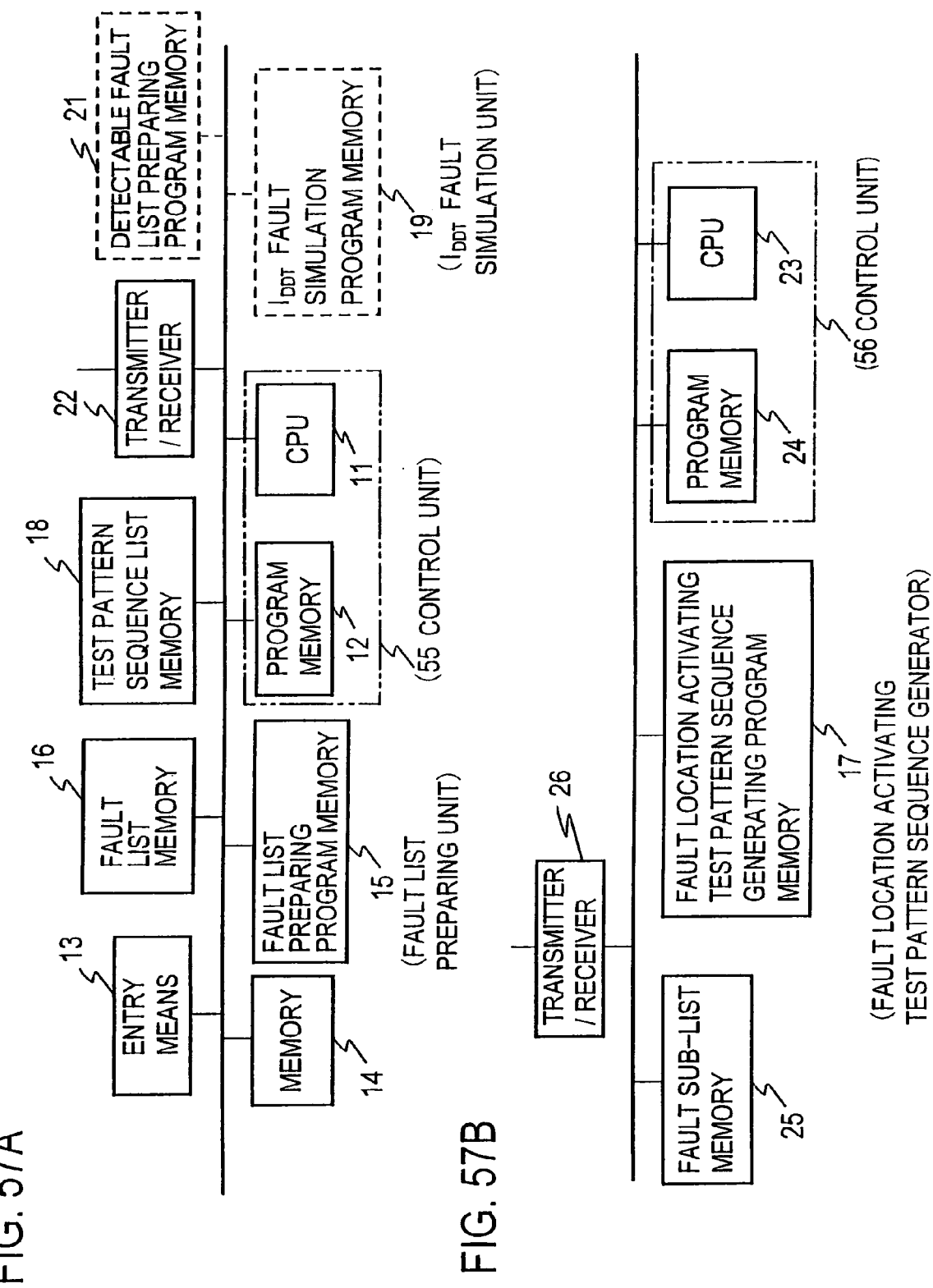
FIG. 57A is a block diagram showing an exemplary functional arrangement of a client system which implements the method according to the first aspect of the present invention.
FIG. 57B is a block diagram showing an exemplary functional arrangement of a server system which implements the method according to the first aspect of the present invention.

For the embodiments shown in FIGS. 32 and 33 and in FIGS. 34 and 35, the function of the client system may comprise CPU 11, the program memory 12, the entry means 13, the memory 14, the fault list preparing program memory 15, and the test pattern sequence list memory 18, all of which are shown in FIG. 56, and also comprises a transmitter/receiver 22 for communication with a server system or systems, as indicated in FIG. 57A. However, it is to be noted that a program stored in the memory 12 is different from that shown in FIG. 56, but is designed to perform the processing operations shown in FIG. 32 or FIG. 34. As shown in FIG. 57B, a corresponding server system comprises CPU 23 which executes a program stored in a memory 24 to serve activating the overall function of the server system. The server system comprises a transmitter/receiver 26 which communicates with the client system to receive a fault sub-list, which is then stored in a fault sub-list memory 25 to be processed subsequently. It also comprises the memory 17, shown in FIG. 56, which stores a fault location activating test pattern sequence generating program.

For the embodiments shown in FIGS. 38 and 39 and FIGS. 40 and 41, $I_{DDT}$ fault simulation program memory 19 and the memory 21 which stores a detectable fault list preparing program shown in FIG. 56 is added to the client system, as indicated in broken lines in FIG. 57A. It is also to be noted that the program stored in the memory 12 is designed to permit an exchange of information with the server system and to enable the processing operation shown in FIG. 38 or 40. In a corresponding server system, the fault sub-list memory 25 shown in FIG. 57B is omitted, and the program stored in the memory 24 is designed to enable the processing operation shown in FIG. 39 or 41. For the embodiment shown in FIGS. 42 and 43, the memories 19 and 21 shown in FIG. 57A are omitted from the client system, and the program stored in the memory 12 is designed to permit an exchange of information with a server system and to enable the processing operation shown in FIG. 42. In the corresponding server system, the fault sub-list memory 25 shown in FIG. 57B is omitted, and the program stored in the memory 24 is designed to enable the processing operation shown in FIG. 43. For the embodiment shown in FIGS. 44 and 45, an intended function can be achieved by a computer with an implementation as shown in FIG. 57A and 57B respectively.

The client system may comprise the fault list preparing unit 15, $I_{DDT}$ fault simulation program memory 19, the detectable fault list preparing unit 21, the control unit 55, the fault list memory 16, the test pattern sequence list memory 18 and the transmitter/receiver 22, as indicated in parentheses in FIG. 57A, allowing the control unit 55 to exercise a control over other units. The server system may comprise the fault location activating test pattern sequence generator 17, the control unit 56, the transmitter/receiver 26 and the fault sub-list memory 25, as indicated in parentheses in FIG. 57B, allowing the control system 56 to exercise a control over other units.

Figure 58:
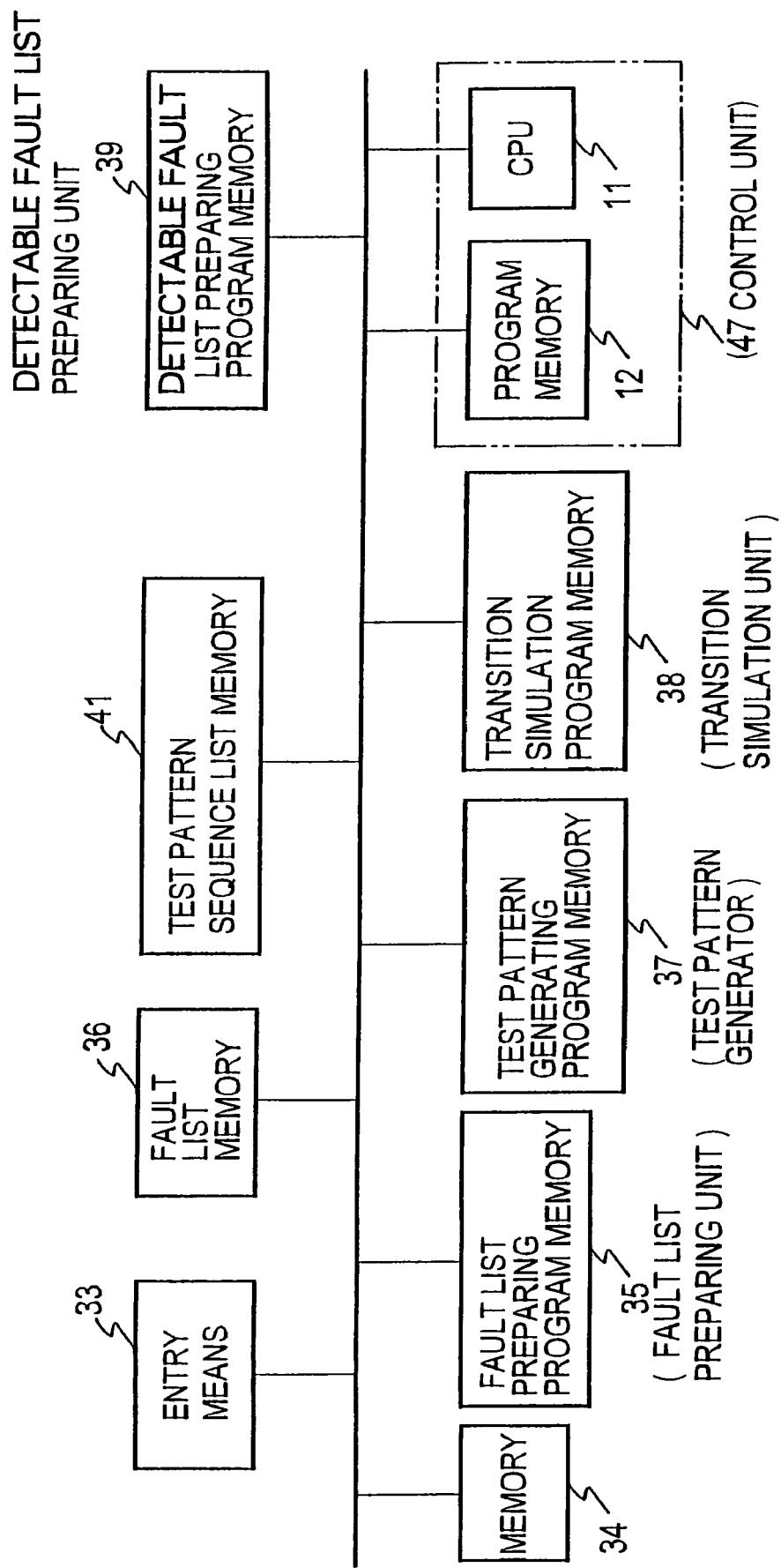
FIG. 58 is a block diagram showing an exemplary functional arrangement of an apparatus which implements the method according to the second aspect of the present invention.

A test pattern generating apparatus for the embodiment shown in FIG. 46 may be constructed as shown in FIG. 58 so that CPU 31 executes a program stored in a memory 32 to control the overall functioning so that circuit information of a circuit under test is downloaded through entry means 33 to be stored in a memory 34 momentarily and so that a program for preparing a fault list which is stored in a memory 35 is executed upon circuit information which is stored in the memory 34 to determine all path delay faults, thus preparing a fault list which is then stored in a memory 36. A test pattern generating program stored in a memory 37 is then executed to generate a test pattern sequence (it being understood that this may take place through hardware). A transition simulation for the test pattern sequence applied to the circuit under test takes place by executing a program stored in a memory 38, and then a program stored in a memory 39 is executed to prepare a detectable fault list, which is then momentarily stored in RAM within CPU 31 or in the memory 34. Faults which are contained in the detectable fault list (paths) are deleted from the fault list memory 36, and the test pattern sequence used is stored in a test pattern sequence list memory 41. A similar process is then repeated until the number of path delay faults which remains within the fault list memory 36 is reduced to or less than a given number (including 0).

The test pattern generating apparatus may comprise the fault list preparing unit 35, the test pattern generator 37, the transition simulation unit 38, the detectable fault list preparing unit 39, the control unit 47, the fault list memory 36 and the test pattern sequence list memory 41, as indicated in parentheses in FIG. 58, allowing the control unit 47 to exercise a control over other units.

Figure 59A:
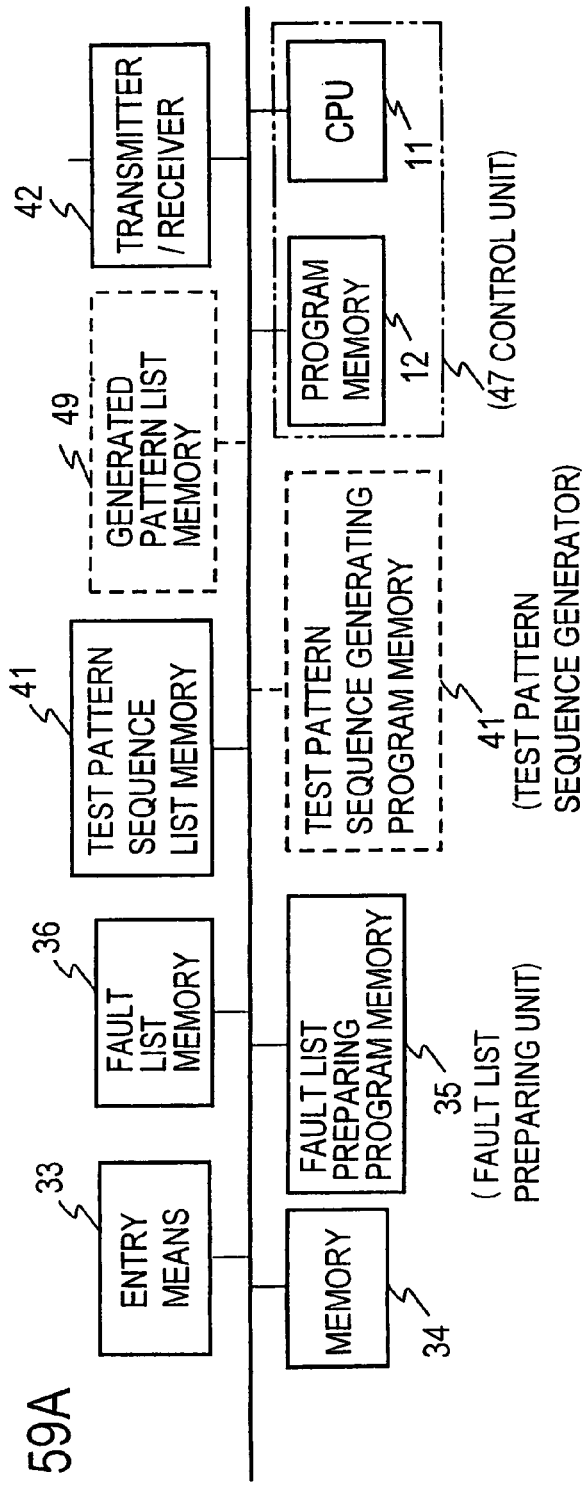
FIG. 59A is a block diagram showing a functional arrangement of a client system which implements the method according to the second aspect of the present invention.

For the embodiments shown in FIGS. 48 and 49, in FIGS. 50 and 51, in FIGS. 52 and 53 and in FIGS. 54 and 55, the client system is implemented in a manner shown in FIG. 59A where the memory 38 storing the fault simulation program and the memory 39 storing the detectable fault list preparing program, both shown in FIG. 58, are omitted while a transmitter/receiver 42 for enabling a communication with a server is added. It is to be understood that a program stored in the memory 32 is designed to enable each processing operation shown in FIG. 48, 50, 52 or 54, respectively. In the example shown in FIG. 50, there is provided a memory 49 for a list of test pattern sequence generated by the test pattern sequence generator 41 or a generated pattern list, as illustrated in FIG. 59A.

Figure 59B:
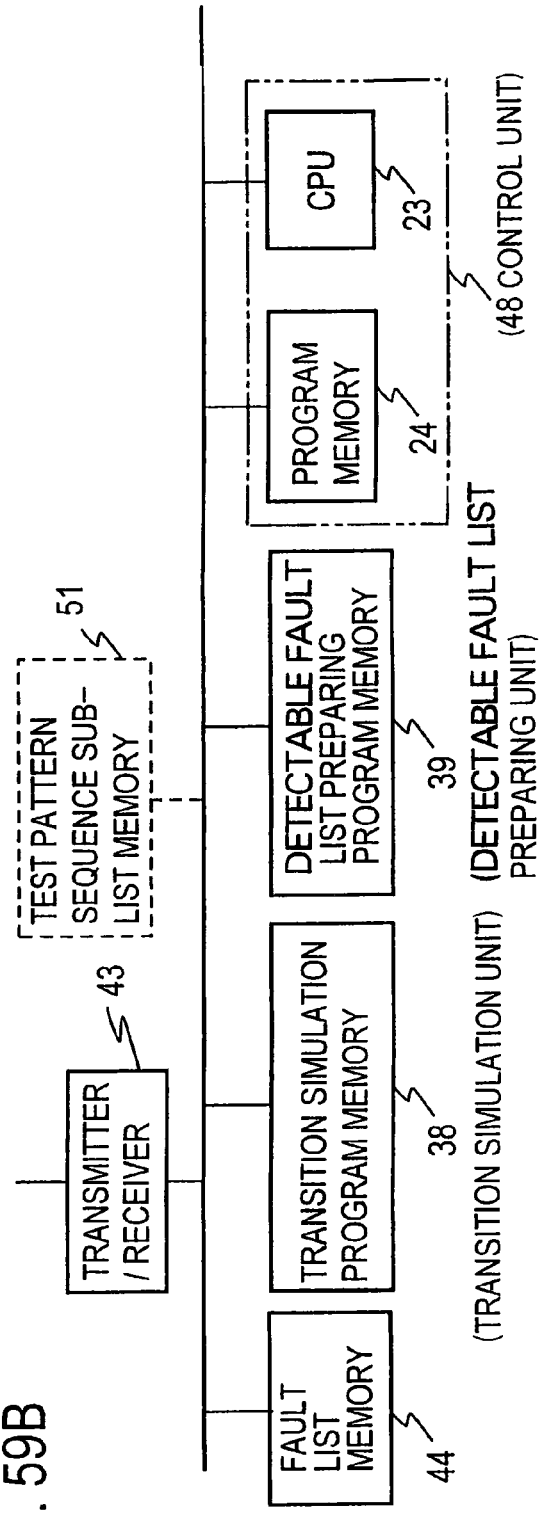
FIG. 59B is a block diagram showing a functional arrangement of a server system which implements the method according to the second aspect of the present invention.

On the other hand, a corresponding server system is constructed in a manner shown in FIG. 59B so that a communication with a client system is enabled through a transmitter/receiver 43, and in order to enable a detectable fault list to be prepared, the fault list which is prepared by the client system is previously transferred into a memory 44. The server system includes the memory 38 which stores the transition simulation program and the memory 39 which stores the program for preparing the detectable fault list, both shown in FIG. 58. In the example shown in FIG. 49, CPU 45 executes a program stored in a memory 46 to perform the processing operation shown in FIG. 49 each time a test pattern sequence is transmitted from the client system. In the example shown in FIG. 51, a test pattern sequence is derived from the generated pattern list stored in the memory 49 of the client system to perform the processing operation shown in FIG. 51. In the example shown in FIG. 53, the server system includes a test pattern sequence sub-list memory 51 for storing a test pattern sequence sub-list which is received from the client system to perform the processing operation shown in FIG. 53. In the similar manner, in the example shown in FIG. 55, the processing operation shown in FIG. 55 is performed.

As indicated in parentheses in FIG. 59A, the client system comprises the fault list preparing unit 35, the test pattern sequence generator 41, the control unit 47, the fault list memory 36, the test pattern sequence list memory 41 and the transmitter/receiver 42, allowing the control unit 47 to exercise a control over other units. In the similar manner, the server system may comprise the transition simulation unit 38, the detectable fault list preparing unit 39, the control unit 48, the transmitter/receiver 43 and the fault list memory 44, as shown in FIG. 59B, allowing the control unit 48 to exercise a control over other units.

With the test pattern generating method or apparatus according to the first aspect of the present invention, by utilizing a transient power supply current testing technique which affords a high level of observability and capable of efficiently testing a gate delay fault or an open fault, test patterns which test a gate delay fault or an open fault can be easily generated to provide a drastic improvement in the efficiency of generating test patterns.

With the test pattern generating method or apparatus according to the first aspect of the present invention, there is no need that the influence of a gate delay fault or an open fault to be propagated to an output signal line, and this allows a probability of causing a conflict with logic values on signal lines during the implication operation which is used in generating test patterns to be reduced, thus allowing the number of backtracks (or retries) in setting up input signals when generating the initialization test pattern and the propagation test pattern to be reduced and thus allowing a time interval required for generating test patterns to be drastically reduced.

In certain embodiments of the test pattern generating method and apparatus according to the first aspect of the present invention, a detectable fault list can be prepared by the transient power supply current fault simulation ($I_{DDT}$ fault simulation) which operates more rapidly than the test pattern processing, and the number of faults for which the test patterns must be generated can be reduced, thus allowing the time interval required for generating test patterns to be further reduced.

With the test pattern generating method and/or apparatus according to the second aspect of the present invention, the use of the transient power supply current testing technique which affords a high level of observability and allows a gate delay fault and an open fault to be efficiently tested allows test patterns which are required to test a path delay fault to be easily generated, thus allowing a drastic improvement in the efficiency of generating test patterns.

Also in certain embodiments of the test pattern generating method andlor apparatus according to the second aspect of the present invention, the detectable fault list can be prepared by using the fault simulation which operates more rapidly than the operation of generating test patterns, and faults contained in this list can be deleted from the fault list, for which test patterns must be generated, thus allowing a reduction in the time interval required for generating test patterns.

What is claimed is:

1. A system for obtaining selected test pattern sequences to be used in transient power supply current testing to detect path delay faults in a semiconductor integrated circuit, the system comprising
    a fault list memory for storing a stored fault list of path delay faults in the semiconductor integrated circuit under test;
    a test pattern sequence list memory for storing the selected test pattern sequences;
    a test pattern sequence generator for generating test pattern sequences to be applied to the semiconductor integrated circuit, each test pattern sequence including two or more test patterns;
    a transition signal values calculating unit for performing a simulation of transitions that occur in the semiconductor integrated circuit when one of the test pattern sequences is applied to the semiconductor integrated circuit, thereby obtaining a train of transition signal values that occur on signal lines within the semiconductor integrated circuit;
    a detectable fault list preparing unit for preparing a detectable fault list by determining whether any of the path delay faults in the stored fault list is a detectable fault that is capable of being detected by transient power supply current testing, wherein the testing uses transition signal values obtained from the simulation of transitions when one of the generated test pattern sequences is applied to the semiconductor integrated circuit; and
    one or more control units
        for determining whether any of the detectable faults exist in the stored fault list,
        for deleting from the stored fault list the detectable faults that exist in the stored fault list,
        for storing in the test pattern sequence list memory those test pattern sequences that are used to detect the detectable faults existing in the stored fault list, thereby obtaining the selected test pattern sequences, and
        for repeatedly activating the test pattern sequence generator, the transition signal values calculating unit and the detectable fault list preparing unit until the number of path delay faults remaining in the stored fault list becomes less than or equal to a given value.

2. The system according to claim 1, further comprising a client system and a plurality of server systems; wherein the client system comprises:
    a transmitter/receiver for communication with the plurality of server systems,
    the fault list memory,
    the test pattern sequence list memory,
    the test pattern sequence generator, and
    a first controller for causing the client system to transmit a test pattern sequence to a respective server system upon receiving a notification from the respective server system indicating completion of its operation;
each server system comprises:
    a transmitter/receiver for communication with the client system,
    the transition signal values calculating unit,
    the detectable fault list preparing unit, and
    a second controller
        for activating the transition signal values calculating unit in response to the test pattern sequence received from the client system,
        for activating the detectable fault list preparing unit;
        for determining whether any of the detectable faults exist in the stored fault list;
        for deleting from the stored fault list the detectable faults that exist in the stored fault list;
        for storing the selected test pattern sequences in the test pattern sequence list memory of the client system; and
        for sending the notification to the client system upon completion of operation of the server system; and
the one or more control units comprise the first controller and the second controller.

3. The system according to claim 1, further comprising a client system and a plurality of server systems; wherein the client system comprises:
a transmitter/receiver for communication with the plurality of server systems,
    the fault list memory,
    the test pattern sequence list memory,
    the test pattern sequence generator, and
    a first controller for controlling operation of the client system;
each server system comprises:
    a transmitter/receiver for communication with the client system,
    the transition signal values calculating unit,
    the detectable fault list preparing unit, and
    a second controller
        for causing the server system to acquire test pattern sequences from the client system,
        for activating the transition signal values calculating unit in response to the test pattern sequence acquired from the client system, and
        for activating the detectable fault list preparing unit;
        for determining whether any of the detectable faults exist in the stored fault list;
        for deleting from the stored fault list the detectable faults that exist in the stored fault list;
        for storing the selected test pattern sequences in the test pattern sequence list memory of the client system; and
the one or more control units comprise the first and the second controller.

4. The system according to claim 1, further comprising a client system and a plurality of server systems; wherein the client system comprises:

a transmitter/receiver for communication with the plurality of server systems,
the fault list memory,
the test pattern sequence list memory,
the test pattern sequence generator for preparing a list of all possible test pattern sequences to be applied to the semiconductor integrated circuit, and
a first controller
for dividing the list of all possible test pattern sequences into a plurality of sub-lists of the test pattern sequences, and
for causing the client system to transmit respective sub-lists to respective server systems;
each server system comprises:
a transmitter/receiver for communication with the client system,
the transition signal values calculating unit,
the detectable fault list preparing unit,
a test pattern sequence sub-list memory for storing received sub-lists, and
a second controller
for deriving the test pattern sequences from the test pattern sequence sub-list memory;
for activating the transition signal values calculating unit in response to the derived test pattern sequences, and
for activating the detectable fault list preparing unit;
for determining whether any of the detectable faults exist in the stored fault list;
for deleting from the stored fault list the detectable faults that exist in the stored fault list; and
for storing the selected test pattern sequences in the test pattern sequence list memory of the client system; and
the one or more control units comprise the first and the second controller.

5. The system according to claim 1, further comprising a client system and a plurality of server systems, wherein
the client system comprises:
a transmitter/receiver for communication with the plurality of server systems,
the fault list memory,
the test pattern sequence list memory,
the test pattern sequence generator, and
a first controller
for causing the client system to transmit a test pattern sequence to a respective server system
upon receiving notification of completion of operation by the respective server system;
for determining whether any of the detectable faults exist in the stored fault list;
for deleting from the stored fault list the detectable faults that exist in the stored fault list; and
for storing the selected test pattern sequences in the test pattern sequence list memory;
each server system comprises:
a transmitter/receiver for communication with the client system,
the transition signal values calculating unit,
the detectable fault list preparing unit, and
a second controller
for activating the transition signal values calculating unit in response to a received test pattern sequence;
for causing the server system to transmit the test pattern sequences that are used to detect the detectable faults and the detectable fault list to the client system;
for sending the notification to the client system upon completion of its operation; and
the one or more control units comprise the first and the second controller.

6. The system according to claim 1, further comprising a client system and a plurality of server systems; wherein
the client system comprises:
a transmitter/receiver for communication with the plurality of server systems,
the fault list memory,
the test pattern sequence list memory,
the test pattern sequence generator, and
a first controller
for determining whether any of the detectable faults exist in the stored fault list;
for deleting from the stored fault list the detectable faults that exist in the stored fault list; and
for storing the selected test pattern sequences in the test pattern sequence list memory of the client system;
each server system comprises:
a transmitter/receiver for communication with the client system,
the transition signal values calculating unit,
the detectable fault list preparing unit, and
a second controller
for causing the server system to acquire the test pattern sequences from the client system,
for activating the transition signal values calculating unit in response to the test pattern sequence acquired from the client system, and
for activating the detectable fault list preparing unit; and
for causing the server system to transmit the detectable fault list and the test pattern sequences that are used to detect the detectable faults to the client system; and
the one or more control units comprise the first and the second controller.

7. The system according to claim 1, further comprising a client system and a plurality of server systems; wherein
the client system comprises:
a transmitter/receiver for communication with the plurality of server systems,
the fault list memory,
the test pattern sequence list memory,
the test pattern sequence generator for preparing a list of all possible test pattern sequences to be applied to the semiconductor integrated circuit, and
a first controller
for dividing the list of all the possible test pattern sequences into a plurality sub-lists of the test pattern sequences,
for causing the client system to transmit respective sub-lists to respective server systems;
for determining whether any of the detectable faults exist in the stored fault list;
for deleting from the stored fault list the detectable faults that exist in the stored fault list; and
for storing the selected test pattern sequences in the test pattern sequence list memory of the client system;
each server system comprises:
a transmitter/receiver for communication with the client system,
the transition signal values calculating unit,
the detectable fault list preparing unit,
a test pattern sequence sub-list memory for storing received sub-lists, and a second controller
- for deriving the test pattern sequences from the test pattern sequence sub-list memory
- for activating the transition signal values calculating unit in response to the derived test pattern sequences, and
- for activating the detectable fault list preparing unit; and
- for causing the server system to transmit to the client system the detectable fault list and the test pattern sequences that are used to detect the detectable faults; and the one or more control units comprise the first and the second controller.

* * * * *